United States Patent
Nagai

(10) Patent No.: US 8,628,981 B2
(45) Date of Patent: Jan. 14, 2014

(54) METHOD OF MANUFACTURING A FERROELECTRIC-CAPACITOR MEMORY DEVICE INCLUDING RECOVERY ANNEALING

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 553 days.

(21) Appl. No.: 12/538,216

(22) Filed: Aug. 10, 2009

(65) Prior Publication Data
US 2009/0298201 A1 Dec. 3, 2009

Related U.S. Application Data

(63) Continuation of application No. PCT/JP2007/055667, filed on Mar. 20, 2007.

(51) Int. Cl.
*H01L 21/00* (2006.01)

(52) U.S. Cl.
USPC ............ 438/3; 438/443; 438/689; 438/735; 257/295; 257/298; 257/306; 257/532

(58) Field of Classification Search
USPC ......... 257/295, 532, E21.241, 298, 306, 758, 257/E27.081; 438/443, 489
See application file for complete search history.

(56) References Cited

U.S. PATENT DOCUMENTS

| | | |
|---|---|---|
| 6,611,014 B1 | 8/2003 | Kanaya et al. |
| 6,982,453 B2 | 1/2006 | Kanaya et al. |
| 2003/0030084 A1 * | 2/2003 | Moise et al. ................. 257/295 |
| 2003/0166326 A1 | 9/2003 | Kikuchi et al. |
| 2004/0084701 A1 | 5/2004 | Kanaya et al. |
| 2004/0113189 A1 * | 6/2004 | Takamatsu et al. ........... 257/295 |
| 2005/0205906 A1 * | 9/2005 | Udayakumar et al. ........ 257/295 |
| 2006/0278954 A1 * | 12/2006 | Izumi ............................ 257/532 |

FOREIGN PATENT DOCUMENTS

| | | |
|---|---|---|
| JP | 2001-036026 A | 2/2001 |
| JP | 2001-358309 A | 12/2001 |
| JP | 2003-110095 A | 4/2003 |
| JP | 2003-257942 A | 9/2003 |
| JP | 2004-281935 A | 10/2004 |
| JP | 2007-019109 A | 1/2007 |

OTHER PUBLICATIONS

Notification of Transmittal of Transmittal of Translation of the International Preliminary Report on Patentability (Form PCT/IB/338) of International Application No. PCT/JP2007/055667 mailed Oct. 1, 2009 with Forms PCT/IB/373 and PCT/ISA/237.
International Search Report of PCT/JP2007/055667, Mailing Date of Jun. 12, 2007.

* cited by examiner

*Primary Examiner* — Mark A Laurenzi
(74) *Attorney, Agent, or Firm* — Fujitsu Patent Center

(57) ABSTRACT

In a manufacturing method of a semiconductor device, a first insulating film covering a ferroelectric capacitor is formed, and a first opening that has a relatively large diameter and reaches an electrode of the ferroelectric capacitor is formed in the first insulating film, and then recovery annealing of the ferroelectric capacitor is performed, and thereby, a path for oxygen can be secured in performing the recovery annealing, and the sufficient recovery annealing can be performed without causing problems during a manufacturing process.

20 Claims, 42 Drawing Sheets

METHOD OF MANUFACTURING A FERROELECTRIC-CAPACITOR MEMORY DEVICE INCLUDING RECOVERY ANNEALING

CROSS REFERENCE TO RELATED APPLICATIONS

This application is a Continuation of International Application No. PCT/JP2007/055667, with an international filing date of Mar. 20, 2007, which designating the United States of America, the entire contents of which are incorporated herein by reference.

TECHNICAL FIELD

The present invention relates to a manufacturing method of a semiconductor device suitable for a ferroelectric memory.

BACKGROUND ART

In recent years, development of a ferroelectric memory (FeRAM) retaining information in a ferroelectric capacitor by making use of a polarization inversion of a ferroelectric substance has been in progress. The ferroelectric memory is a nonvolatile memory in which retained information does not disappear even when power is turned off, and a high integration, a high-speed driving, a high durability, and a low power consumption can be realized.

As a material of a ferroelectric film constituting the ferroelectric capacitor, a ferroelectric oxide having a perovskite crystal structure such as PZT (Pb (Zr, Ti) $O_3$), SBT ($SrBi_2Ta_2O_9$) whose amount of remanent polarization is large has been mainly used. The amount of remanent polarization of PZT is approximately 10 $\mu C/cm^2$ to 30 $\mu C/cm^2$. However, characteristics of the ferroelectric film are likely to be deteriorated by moisture penetrating from outside through an interlayer insulating film, such as a silicon oxide film, having high affinity with water. That is, in performing a high temperature process such as forming the interlayer insulating film or metal wirings, the moisture is decomposed to hydrogen and oxygen, and this hydrogen penetrates into the ferroelectric film to react with oxygen constituting the ferroelectric film, resulting that oxygen deficiency in the ferroelectric film is caused. As a result, crystallinity of the ferroelectric film is lowered.

Further, after the ferroelectric capacitor is formed, an interlayer insulating film covering the ferroelectric capacitor is formed. In forming the interlayer insulating film, a plasma CVD method using TEOS, a high density plasma method or the like is applied. Thus, in forming the interlayer insulating film, the ferroelectric capacitor is exposed to plasma, resulting that a characteristic thereof is deteriorated. There exists an art in which a protective film such as an aluminum oxide film covers a ferroelectric capacitor, and then an interlayer insulating film is formed, but, it is also difficult to hold the characteristic sufficiently by this art.

Further, after the interlayer insulating film is formed, an opening reaching an electrode of the ferroelectric capacitor is formed, and a wiring connecting to the electrode is formed. In forming the opening, etching in which plasma is used is performed. Thus, in forming the opening as well, the ferroelectric capacitor is exposed to plasma, resulting that a characteristic thereof is deteriorated.

Accordingly, in manufacturing the ferroelectric memory provided with the ferroelectric capacitor, steps where deterioration of the characteristic of the ferroelectric capacitor formed already is unavoidable are included. Thus, conventionally, oxygen is supplied to the ferroelectric capacitor, and thereby annealing (recovery annealing) that recovers the characteristic has been performed. It is important to diffuse oxygen into the ferroelectric film sufficiently in this recovery annealing.

Here, a conventional manufacturing method of a planar-type ferroelectric memory will be explained. FIG. 8A to FIG. 8L are cross-sectional views showing the conventional manufacturing method of the planar-type ferroelectric memory in order of steps.

First, as illustrated in FIG. 8A, an element isolation insulating film 102 is formed on a surface of a semiconductor substrate 101 composed of silicon or the like. Next, an ion implantation of B (boron) is performed in the surface of an element region demarcated by the element isolation insulating film 102 thereby forming a P-well 103. Next, gate insulating films 104 and gate electrodes 105 are formed on the P-well 103. Thereafter, an ion implantation of P (phosphorus) is performed in the surface of the P-well 103 thereby forming shallow impurity diffusion layers 106. Subsequently, sidewall insulating films 107 are formed on lateral sides of the gate electrodes 105. Next, an ion implantation of As (arsenic) is performed in the surface of the P-well 103 thereby forming deep impurity diffusion layers 108. Thus, transistors Tr are formed. Note that the single transistor Tr includes the two impurity diffusion layers 108, and one of them is shared with another transistor Tr. The impurity diffusion layer 108 that is shared constitutes a drain, and the impurity diffusion layer 108 that is not shared constitutes a source.

Next, as illustrated in FIG. 8B, a silicon oxynitride film 111 covering the transistors Tr is formed, and an NSG film 112 is formed thereon by using TEOS. Next, the surface of the NSG film 112 is flattened.

Thereafter, as illustrated in FIG. 8C, an NSG film 116 is formed on the NSG film 112 by using TEOS, and then a dehydration treatment thereof is performed. Next, an aluminum oxide film 117 is formed on the NSG film 116, and then a heat treatment (RTA) is performed.

Next, as illustrated in FIG. 8D, a platinum film 118, a PZT film 119, and an iridium oxide film 120 are formed sequentially on the aluminum oxide film 117. A heat treatment (RTA) is performed between forming the PZT film 119 and forming the iridium oxide film 120. Further, the iridium oxide film 120 has a two-layer structure, and a heat treatment (RTA) is also performed after the lower layer is formed.

Thereafter, as illustrated in FIG. 8E, the iridium oxide film 120 is patterned, and then recovery annealing is performed. Subsequently, the PZT film 119 is patterned, and then recovery annealing is performed. Next, an aluminum oxide film 121 is formed on the entire surface, and then recovery annealing is performed.

Subsequently, as illustrated in FIG. 8F, the aluminum oxide film 121 and the platinum film 118 are patterned. Thus, ferroelectric capacitors C are formed. Thereafter, recovery annealing is performed. Further, an aluminum oxide film 122 is formed on the entire surface, and then recovery annealing is performed. Subsequently, an NSG film 123 is formed on the aluminum oxide film 122 by using TEOS, and then the surface thereof is flattened.

Next, plasma annealing is performed in a nitrogen atmosphere, so that the surface of the NSG film 123 is nitrided. Next, as illustrated in FIG. 8G, a resist pattern 191 having openings at predetermined positions is formed on the NSG film 123. Then, etching of the NSG film 123 and so on is performed by using the resist pattern 191 as a mask thereby forming contact holes 113s reaching the sources and a contact hole 113d reaching the drain.

Subsequently, as illustrated in FIG. 8H, the resist pattern 191 is removed. Next, a barrier metal film (not-illustrated) is formed on the entire surface, and a tungsten film (not-illustrated) is formed thereon. Then, the tungsten film and the barrier metal film are polished until the NSG film 123 is exposed. As a result, contact plugs 114s are formed in the contact holes 113s, and a contact plug 114d is formed in the contact hole 113d. Next, plasma annealing is performed in a nitrogen atmosphere, so that the surface of the NSG film 123 is nitrided. Thereafter, a silicon oxynitride film 115 is formed on the NSG film 123.

Next, as illustrated in FIG. 8I, a resist pattern 192 having openings at predetermined positions is formed on the silicon oxynitride film 115. Then, etching of the silicon oxynitride film 115 and so on is performed by using the resist pattern 192 as a mask thereby forming contact holes 127t reaching top electrodes (the iridium oxide film 120) and contact holes 127b reaching bottom electrodes (the platinum film 118).

Thereafter, as illustrated in FIG. 8J, the resist pattern 192 is removed, and then recovery annealing is performed.

Subsequently, as illustrated in FIG. 8K, the silicon oxynitride film 115 is removed by performing etching back.

Next, as illustrated in FIG. 8L, wirings 130 in contact with the contact plugs 114s and 114d, the top electrodes (the iridium oxide film 120), and the bottom electrodes (the platinum film 118) are formed. Thereafter, a heat treatment is performed in a nitrogen atmosphere. Subsequently, an aluminum oxide film 131 is formed on the entire surface. Thereafter, upper layer wirings and so on are formed.

Next, a conventional manufacturing method of a stack-type ferroelectric memory will be explained. FIG. 9A to FIG. 9L are cross-sectional views showing the conventional manufacturing method of the stack-type ferroelectric memory in order of steps.

First, similarly to the case of manufacturing the planar-type ferroelectric memory, as illustrated in FIG. 9A, the processes to flattening the NSG film 112 are performed. Next, a dehydration treatment of the NSG film 112 is performed.

Next, as illustrated in FIG. 9B, a resist pattern 196 having openings at predetermined positions is formed on the NSG film 112. Then, etching of the NSG film 112 and so on is performed by using the resist pattern 196 as a mask thereby forming contact holes 151s reaching the sources and a contact hole 151d reaching the drain.

Subsequently, as illustrated in FIG. 9C, the resist pattern 196 is removed. Next, a barrier metal film (not-illustrated) is formed on the entire surface, and a tungsten film (not-illustrated) is formed thereon. Then, the tungsten film and the barrier metal film are polished until the NSG film 112 is exposed. As a result, contact plugs 152s are formed in the contact holes 151s, and a contact plug 152d is formed in the contact hole 151d. Next, plasma annealing is performed in a nitrogen atmosphere, so that the surface of the NSG film 112 is nitrided.

Next, as illustrated in FIG. 9D, a silicon oxynitride film 153 and an NSG film 154 are formed on the NSG film 112 sequentially.

Next, as illustrated in FIG. 9E, a resist pattern 195 having openings at predetermined positions is formed on the NSG film 154. Then, etching of the NSG film 154 and so on is performed by using the resist pattern 195 as a mask thereby forming contact holes 156s reaching the contact plugs 152s.

Thereafter, as illustrated in FIG. 9F, the resist pattern 195 is removed.

Subsequently, a barrier metal film (not-illustrated) is formed on the entire surface, and a tungsten film (not-illustrated) is formed thereon.

Then, the tungsten film and the barrier metal film are polished until the NSG film 154 is exposed. As a result, as illustrated in FIG. 9G, contact plugs 157s are formed in the contact holes 156s. Next, plasma annealing is performed in a nitrogen atmosphere, so that the surface of the NSG film 154 is nitrided.

Next, as illustrated in FIG. 9H, a bottom electrode film 158, a PZT film 159, and a top electrode film 160 are formed on the NSG film 154 sequentially. In forming the bottom electrode film 158, a titanium film, a titanium aluminum nitride film, and an iridium film are formed sequentially. Further, in forming the top electrode film 160, after an iridium oxide film is formed, a heat treatment (RTA) is performed, and then another iridium oxide film is formed. Thereafter, another heat treatment (RTA) is performed.

Thereafter, as illustrated in FIG. 9I, a platinum film 161, a titanium nitride film 162, and an NSG film 163 are formed on the top electrode film 160 sequentially.

Subsequently, as illustrated in FIG. 9J, a resist pattern 197 covering regions where ferroelectric capacitors are desired to be formed is formed on the NSG film 163.

Next, as illustrated in FIG. 9K, patterning of the NSG film 163 is performed by using the resist pattern 197 as a mask.

Next, as illustrated in FIG. 9L, patterning of the titanium nitride film 162 is performed by using the resist pattern 197 and the NSG film 163 as a mask. The resist pattern 197 disappears while performing this patterning.

Thereafter, as illustrated in FIG. 9M, the platinum film 161, the top electrode film 160, the PZT film 159, and the bottom electrode film 158 are patterned collectively by using the NSG film 163 and the titanium nitride film 162 as a mask. Thus, ferroelectric capacitors C are formed.

Subsequently, as illustrated in FIG. 9N, the NSG film 163 and the titanium nitride film 162 used as a hard mask are removed, and then recovery annealing is performed.

Next, as illustrated in FIG. 9O, an aluminum oxide film 164 is formed on the entire surface. The aluminum oxide film 164 has a two-layer structure, and after the lower layer is formed, a heat treatment (RTA) is performed.

Next, as illustrated in FIG. 9P, a silicon oxide film 165 is formed on the entire surface by a high density plasma CVD method, and then the surface thereof is flattened. Thereafter, a resist pattern 198 having an opening at a predetermined position is formed on the silicon oxide film 165. Then, etching of the silicon oxide film 165 and so on is performed by using the resist pattern 198 as a mask thereby forming a contact hole 166d reaching the contact plug 152d.

Subsequently, as illustrated in FIG. 9Q, the resist pattern 198 is removed. Next, a barrier metal film (not-illustrated) is formed on the entire surface, and a tungsten film (not-illustrated) is formed thereon. Then, the tungsten film and the barrier metal film are polished until the silicon oxide film 165 is exposed. As a result, a contact plug 167d is formed in the contact hole 166d.

Next, as illustrated in FIG. 9R, a silicon oxynitride film 168 is formed on the silicon oxide film 165.

Thereafter, as illustrated in FIG. 9S, a resist pattern 199 having openings at predetermined positions is formed on the silicon oxynitride film 168. Then, etching of the silicon oxynitride film 168 and so on is performed by using the resist pattern 199 as a mask thereby forming contact holes 169t reaching the platinum film 161.

Subsequently, as illustrated in FIG. 9T, the resist pattern 199 is removed, and then recovery annealing is performed. Thereafter, the silicon oxynitride film 168 is removed by performing etching back.

Next, as illustrated in FIG. 9U, a barrier metal film (not-illustrated) is formed on the entire surface, and a tungsten film (not-illustrated) is formed thereon. Then, the tungsten film and the barrier metal film are polished until the silicon oxide film 165 is exposed. As a result, contact plugs 170t are formed in the contact holes 169t.

Next, as illustrated in FIG. 9V, wirings 171 in contact with the contact plugs 167s and 170t are formed. Thereafter, a heat treatment is performed in a nitrogen atmosphere. Subsequently, an aluminum oxide film 172 is formed on the entire surface. Thereafter, upper layer wirings and so on are formed.

However, in these conventional methods, there is a case that recovery annealing of the ferroelectric capacitor cannot be performed sufficiently. This is because the contact hole reaching the top electrode is small and oxygen supply is not sufficient. If the contact hole is made to be large, it is possible to increase the supply amount of oxygen, but in this case, the distance between the adjacent contact holes narrows. Therefore, problems such as a short circuit are likely to be caused when positional displacement occurs in the wirings formed thereon. Further, as illustrated in FIG. 8L, when positional displacement occurs in the method where the wirings 130 are also formed in the contact holes 127t and 127b, there arises a case that the iridium oxide film 120 and the platinum film 118 are etched. In this manner, if the contact hole is simply made to be large, a positional displacement margin in forming the wirings becomes small.

Note that Patent Documents 1 and 2 disclose that a contact hole is made to be large, but a problem in which the positional displacement margin as described above is decreased is left.

Patent Document 1: Japanese Patent No. 3331334
Patent Document 2: Japanese Laid-open Patent Publication No. 2001-358309

SUMMARY OF THE INVENTION

An object of the present invention is to provide a manufacturing method of a semiconductor device capable of performing recovery annealing sufficiently without causing problems during a manufacturing process.

In the manufacturing method of a semiconductor device according to the present invention, a ferroelectric capacitor is formed above a semiconductor substrate, and a first insulating film covering the ferroelectric capacitor is formed. A first opening reaching an electrode of the ferroelectric capacitor is formed in the first insulating film. Recovery annealing of the ferroelectric capacitor is performed. A conductive plug is formed in the first opening. A second insulating film covering the first insulating film and the conductive plug is formed. A second opening smaller than the first opening is formed in the second insulating film. The second opening reaches the conductive plug. A wiring connected to the conductive plug electrically via the second opening is formed on the second insulating film.

DETAILED DESCRIPTION OF THE PREFERRED EMBODIMENTS

Hereinafter, embodiments of the present invention will be explained concretely with reference to the attached drawings. In these embodiments, a ferroelectric memory provided with a ferroelectric memory cell portion, a logic circuit portion, a peripheral circuit portion, and a pad portion is manufactured. However, in the following explanation, the ferroelectric memory cell portion will be mainly explained.

-First Embodiment-

Figure 1A:
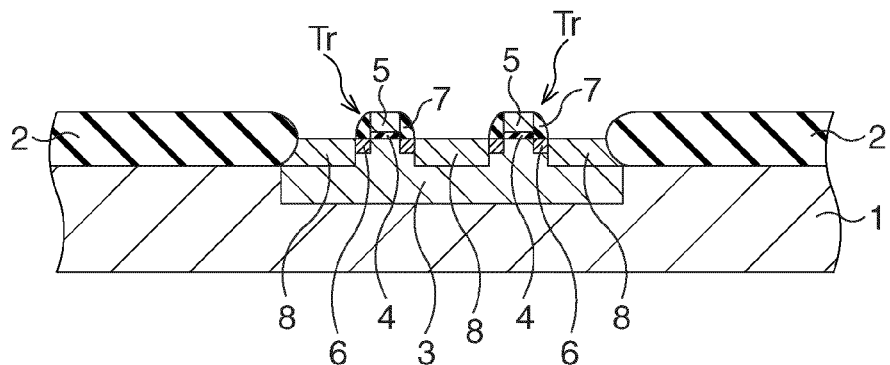
FIG. 1A to FIG. 1O are cross-sectional views showing a manufacturing method of a ferroelectric memory according to a first embodiment of the present invention in order of steps.

First, a first embodiment of the present invention will be explained. FIG. 1A to FIG. 1O are cross-sectional views showing a manufacturing method of a ferroelectric memory (a semiconductor device) according to the first embodiment of the present invention in order of steps.

In the first embodiment, as illustrated in FIG. 1A, an element isolation insulating film 2 is first formed on the surface of a semiconductor substrate 1 composed of silicon or the like. The element isolation insulating film 2 is formed by, for example, a LOCOS (local oxidation of silicon) method or an STI (shallow trench isolation) method. Next, an ion implantation of P-type impurity (for example, boron) is performed in ae surface of an element region demarcated by the element isolation insulating film 2 thereby forming a P-well 3. Next, gate insulating films 4 and gate electrodes 5 are formed on the P-well 3. Thereafter, an ion implantation of N-type impurity (for example, phosphorus) is performed in the surface of the P-well 3 thereby forming shallow impurity diffusion layers 6. Subsequently, sidewall insulating films 7 are formed on lateral sides of the gate electrodes 5. Next, an ion implantation of N-type impurity (for example, arsenic) is performed in the surface of the P-well 3 thereby forming deep impurity diffusion layers 8. Thus, transistors Tr are formed. The channel length of the transistor Tr is not limited in particular, but it is, for example, 360 μm. Further, the gate insulating film 4 is a silicon oxide film whose thickness is, for example, 6 nm to 7 nm, and the gate electrode 5 may be constituted by, for example, an amorphous silicon layer whose thickness is approximately 50 nm and a tungsten silicide layer whose thickness is approximately 150 nm formed thereon. Note that the single transistor Tr includes the two impurity diffusion layers 8, and one of them is shared with another transistor Tr. The impurity diffusion layer 8 that is shared constitutes a drain, and the impurity diffusion layer 8 that is not shared constitutes a source.

Figure 1B:
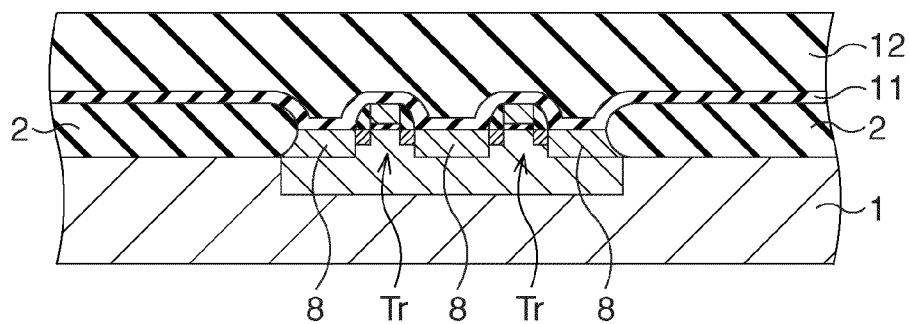

Next, as illustrated in FIG. 1B, a silicon oxynitride film 11 covering the transistors Tr is formed by a plasma CVD method or the like, and an NSG (nondoped silicate glass) film 12 is formed thereon by a plasma CVD method using TEOS or the like. The thickness of the silicon oxynitride film 11 is set to be approximately 200 nm, and the thickness of the NSG film 12 is set to be approximately 600 nm. Next, the surface of the NSG film 12 is polished for approximately 200 nm to be flattened.

Figure 1C:
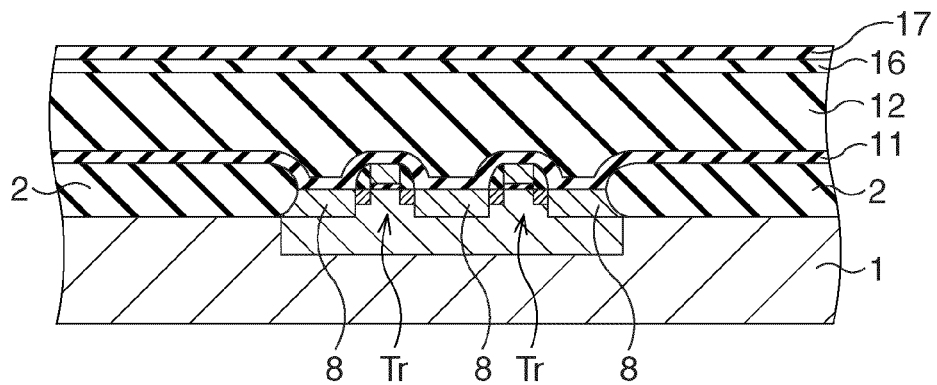

Thereafter, as illustrated in FIG. 1C, an NSG film 16 whose thickness is approximately 100 nm is formed on the NSG film 12 by a plasma CVD method using TEOS or the like, and then a dehydration treatment thereof is performed. The dehydration treatment may be set such that, for example, the temperature of the semiconductor substrate 1 is 650° C., the treatment time is for 30 minutes, and the supply amount of nitrogen gas is 2 liters per minute. Next, an aluminum oxide film 17 whose thickness is approximately 20 nm is formed on the NSG film 16 by a PVD method or the like, and a heat treatment is performed. In the heat treatment, an RTA in which, for example, the temperature of the semiconductor substrate 1 is 650° C., the treatment time is for 60 seconds, and the supply amount of oxygen gas is 2 liters per minute is performed.

Figure 1D:
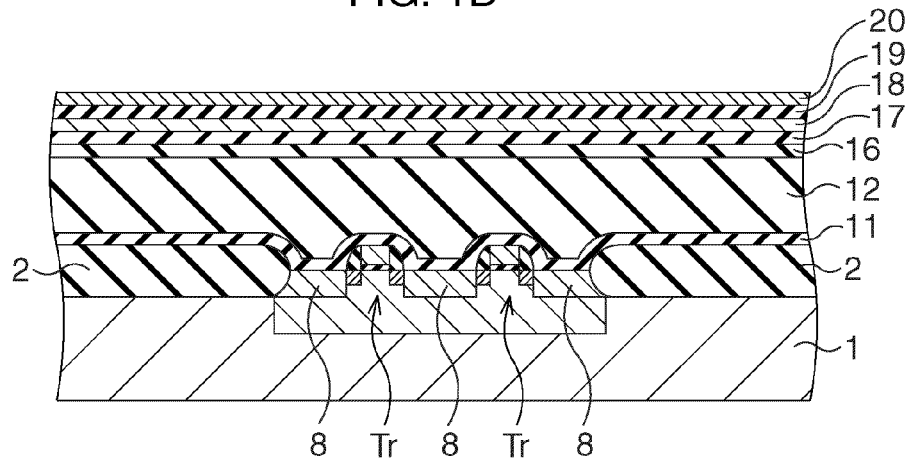

Next, as illustrated in FIG. 1D, a platinum film 18, a PZT film 19, and an iridium oxide film 20 are formed sequentially on the aluminum oxide film 17 by a PVD method or the like. For example, the thickness of the platinum film 18 is set to be 155 nm, the thickness of the PZT film 19 is set to be approximately 150 nm to 200 nm, and the thickness of the iridium oxide film 20 is set to be 250 nm. A heat treatment is performed between forming the PZT film 19 and forming the iridium oxide film 20. In this heat treatment, an RTA in which the temperature of the semiconductor substrate 1 is 563° C., the treatment time is for 90 seconds, the supply amount of oxygen gas is 0.055 liters per minute, and the supply amount of argon gas is 1.95 liters per minute is performed. Further, the iridium oxide film 20 has a two-layer structure, and a heat treatment is also performed after the lower layer (thickness: 50 nm) is formed. In this heat treatment, an RTA in which the temperature of the semiconductor substrate 1 is 708° C., the treatment time is for 20 seconds, the supply amount of oxygen gas is 0.02 liters per minute, and the supply amount of argon gas is 2.00 liters per minute is performed.

Figure 1E:
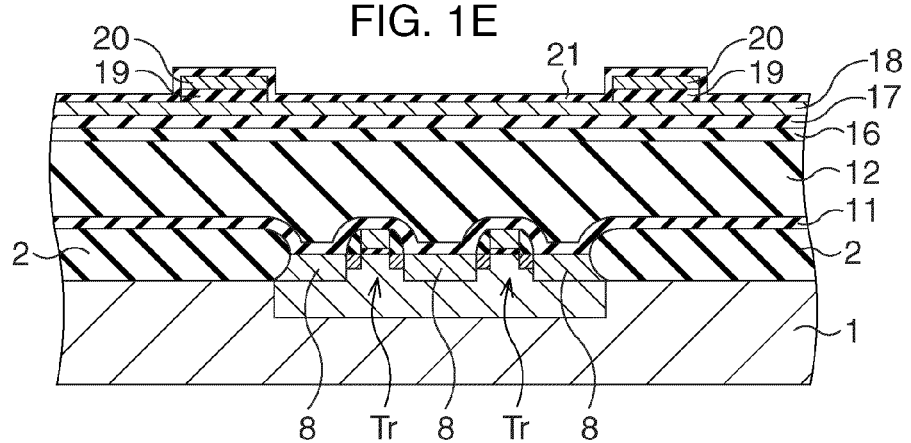

Thereafter, as illustrated in FIG. 1E, the iridium oxide film 20 is patterned, and then recovery annealing is performed. This recovery annealing may be set such that, for example, a vertical furnace is used, the temperature of the semiconductor substrate 1 is 650° C., the treatment time is for 60 minutes, and the supply amount of oxygen gas is 20 liters per minute. Subsequently, the PZT film 19 is patterned, and then recovery annealing is performed. This recovery annealing may be set such that, for example, a vertical furnace is used, the temperature of the semiconductor substrate 1 is 350° C., the treatment time is for 60 minutes, and the supply amount of oxygen gas is 20 liters per minute. Next, an aluminum oxide film 21 whose thickness is approximately 50 nm is formed on the entire surface by a PVD method or the like, and then recovery annealing is performed. This recovery annealing may be set such that, for example, a vertical furnace is used, the temperature of the semiconductor substrate 1 is 550° C., the treatment time is for 60 minutes, and the supply amount of oxygen gas is 20 liters per minute.

Figure 1F:
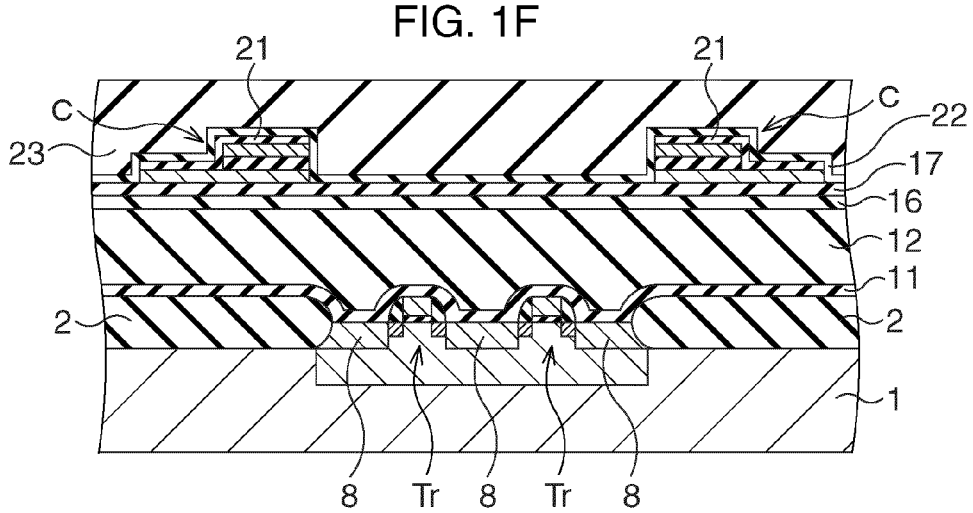

Next, as illustrated in FIG. 1F, the aluminum oxide film 21 and the platinum film 18 are patterned. Thus, ferroelectric capacitors C are formed. Thereafter, recovery annealing is performed. This recovery annealing may be set such that, for example, a vertical furnace is used, the temperature of the semiconductor substrate 1 is 650° C., the treatment time is for 60 minutes, and the supply amount of oxygen gas is 20 liters per minute. Further, an aluminum oxide film 22 whose thickness is approximately 20 nm is formed on the entire surface by a PVD method or the like, and then recovery annealing is performed. This recovery annealing may be set such that, for example, a vertical furnace is used, the temperature of the semiconductor substrate 1 is 550° C., the treatment time is for 60 minutes, and the supply amount of oxygen gas is 20 liters per minute. Subsequently, an NSG film 23 whose thickness is approximately 1500 nm is formed on the aluminum oxide film 22 by a plasma CVD method using TEOS or the like, and then the surface thereof is flattened. In the present embodiment, a first insulating film includes the aluminum oxide films 21 and 22, and the NSG film 23.

Figure 1G:
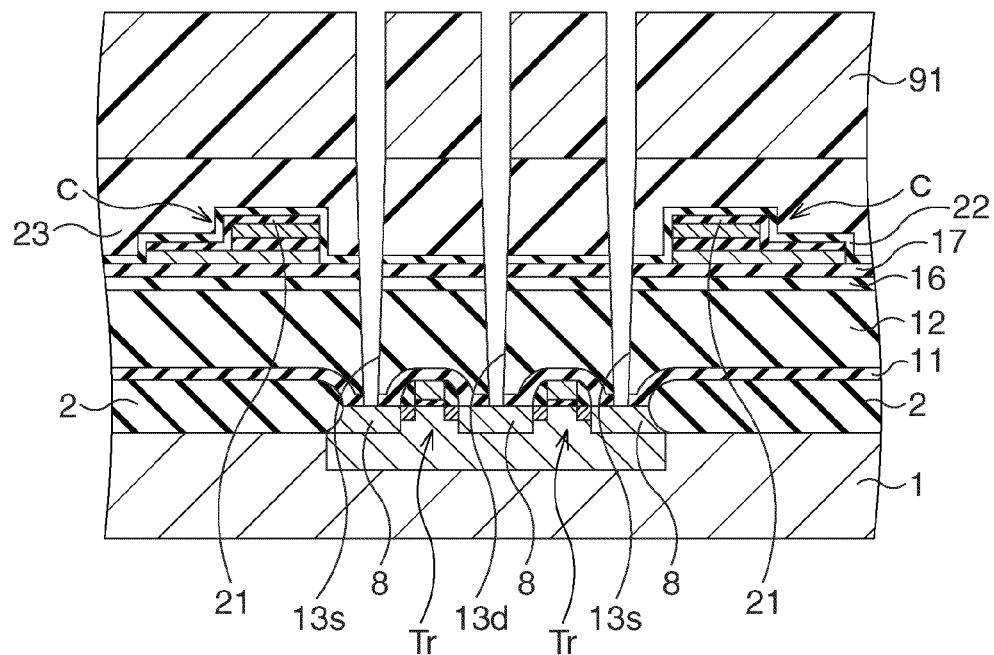

Next, plasma annealing is performed in a nitrogen atmosphere by using a CVD device or the like, so that the surface of the NSG film 23 is nitrided. This plasma annealing may be set such that, for example, a CVD device or the like is used, the temperature of the semiconductor substrate 1 is 350° C., the treatment time is for 2 minutes, and $N_2O$ plasma is generated. Next, as illustrated in FIG. 1G, a resist pattern 91 having openings at predetermined positions is formed on the NSG film 23. Then, etching of the NSG film 23 and so on is performed by using th e resist pattern 91 as a mask thereby forming contact holes 13s reaching the sources and a contact hole 13d reaching the drain.

Figure 1H:
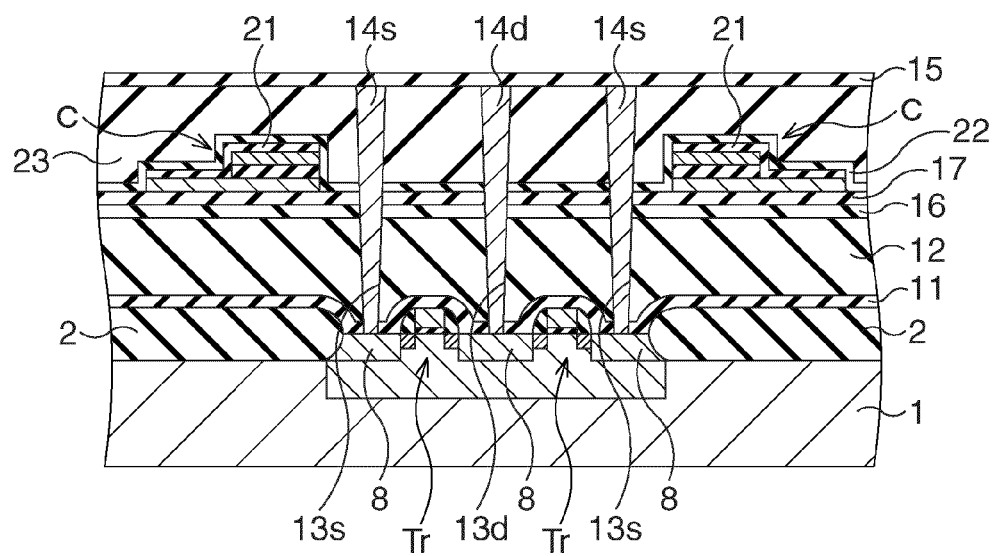

Subsequently, as illustrated in FIG. 1H, the resist pattern 91 is removed. Next, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the NSG film 23 is exposed. As a result, contact plugs 14s are formed in the contact holes 13s, and a contact plug 14d is formed in the contact hole 13d. Next, plasma annealing is performed in a nitrogen atmosphere, so that the surface of the NSG film 23 is nitrided. This plasma annealing may be set such that, for example, a CVD device or the like is used, the temperature of the semiconductor substrate 1 is 350° C., the treatment time is for 2 minutes, and $N_2O$ plasma is generated. Thereafter, a silicon oxynitride film 15 whose thickness is approximately 100 nm is formed by a plasma CVD method or the like. Note that it is preferable that the thickness of the silicon oxynitride film 15 is approximately 50 nm to 200 nm. If the silicon oxynitride film 15 is too thick, there is a case that subsequent processes will be difficult to be performed, or if it is too thin, there is a case that the effect of preventing moisture from being permeated becomes insufficient. In place of the silicon oxynitride film 15, another film containing nitrogen may be formed.

Figure 1I:
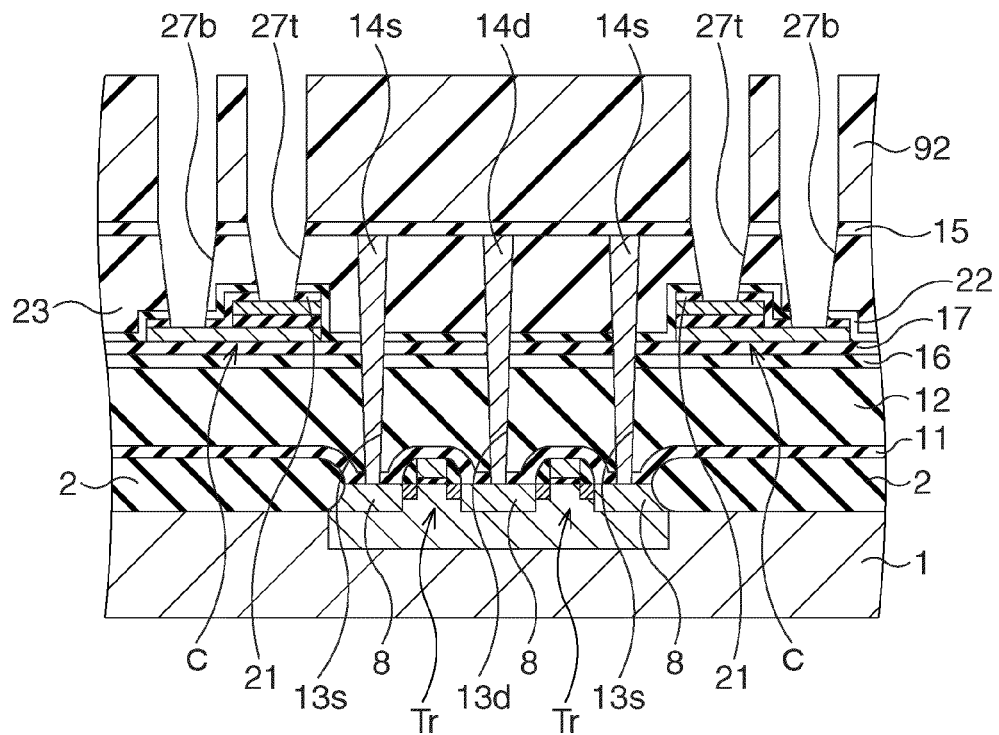
Figure 2A:
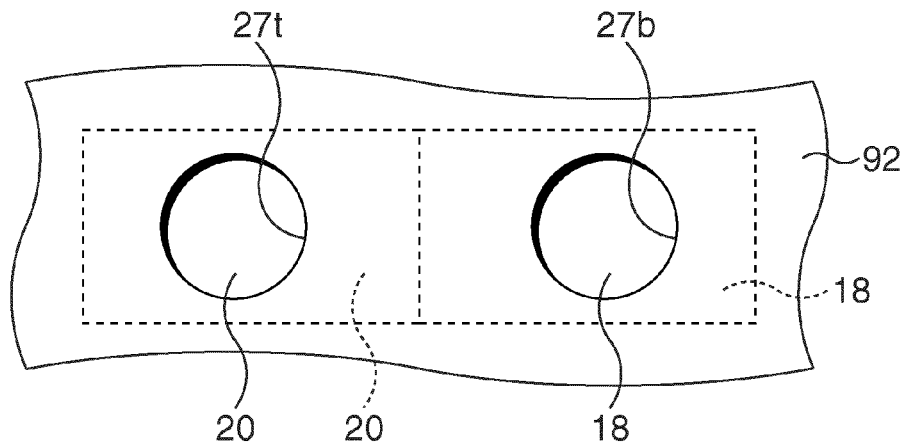
FIG. 2A to FIG. 2F are plan views showing the manufacturing method of the ferroelectric memory according to the first embodiment of the present invention in order of steps.

Next, as illustrated in FIG. 1I, a resist pattern 92 having openings at predetermined positions is formed on the silicon oxynitride film 15. Then, etching of the silicon oxynitride film 15 and so on is performed by using the resist pattern 92 as a mask thereby forming contact holes 27t reaching top electrodes (the iridium oxide film 20) and contact holes 27b reaching bottom electrodes (the platinum film 18), as illustrated in FIG. 2A. Note that the diameters of the contact holes 27t and 27b are set to be, for example, approximately 1000 nm, which are relatively large. Further, it is preferable that the areas at uppermost portions of the contact holes 27t and 27b are equal to or more than 0.9 times as large as the area of an uppermost surface of the top electrode (the iridium oxide film 20). This is for securing a path for oxygen large in performing recovery annealing. In the present embodiment, the contact holes 27t and 27b may correspond to a first opening.

Figure 1J:
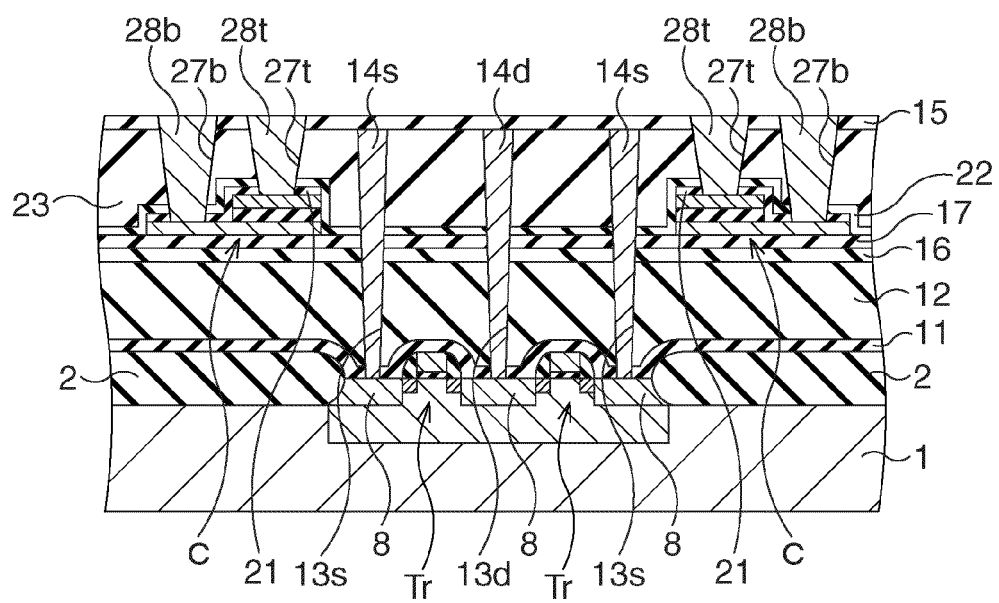
Figure 2B:
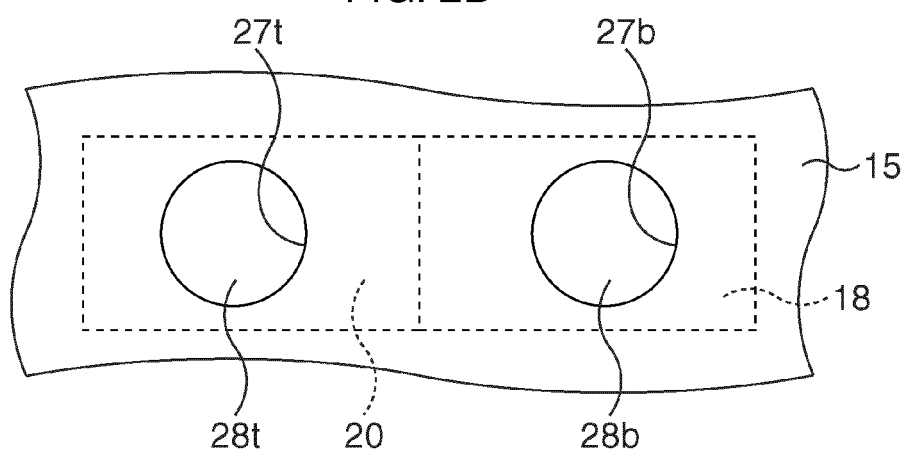

Thereafter, as illustrated in FIG. 1J, the resist pattern 92 is removed, and then recovery annealing is performed. This recovery annealing may be set such that, for example, a vertical furnace is used, the temperature of the semiconductor substrate 1 is 500° C., the treatment time is for 60 minutes, and the supply amount of oxygen gas is 20 liters per minute. Subsequently, a titanium nitride film (not-illustrated) whose thickness is approximately 50 nm is formed on the entire surface by, for example, a PVD method as the barrier metal film, and a tungsten film (not-illustrated) whose thickness is approximately 900 nm is formed thereon by, for example, a CVD method. Then, the tungsten film and the barrier metal film are polished by, for example, a CMP method until the silicon oxynitride film 15 is exposed. As a result, as illustrated in FIG. 2B, contact plugs 28t are formed in the contact holes 27t, and contact plugs 28b are formed in the contact holes 27b. In the present embodiment, a conductive plug includes the contact plugs 28t and 28b.

Figure 1K:
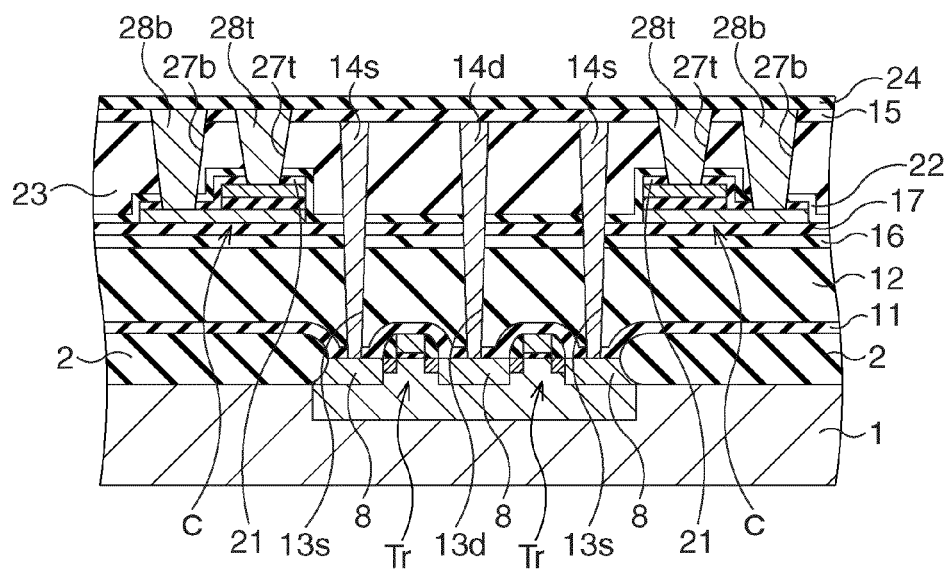
Figure 2C:
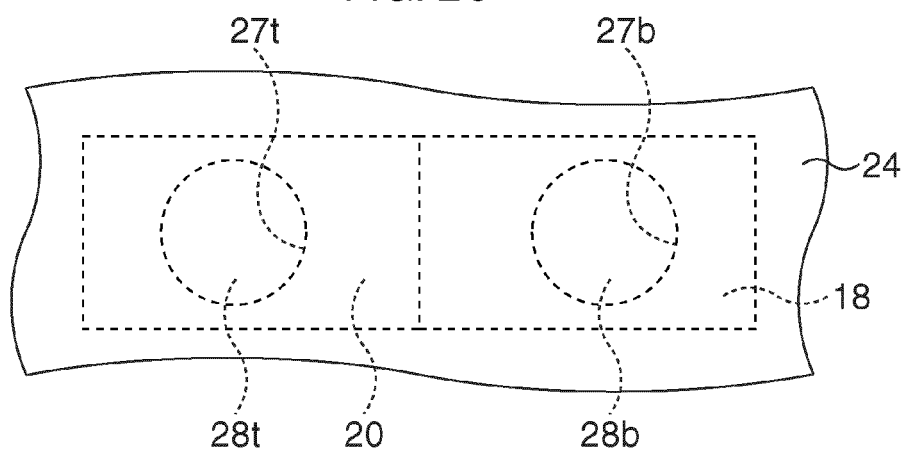

Next, as illustrated in FIG. 1K and FIG. 2C, an NSG film 24 whose thickness is approximately 100 nm is formed on the entire surface by a plasma CVD method using TEOS or the like. Thereafter, plasma annealing is performed in a nitrogen atmosphere, so that the surface of the NSG film 24 is nitrided. This plasma annealing may be set such that, for example, a CVD device or the like is used, the temperature of the semiconductor substrate 1 is 350° C., the treatment time is for 2 minutes, and $N_2O$ plasma is generated. In the present embodiment, a second insulating film includes the NSG film 24. Further, the NSG film 24 later functions as an etching stopper film to wirings.

Figure 1L:
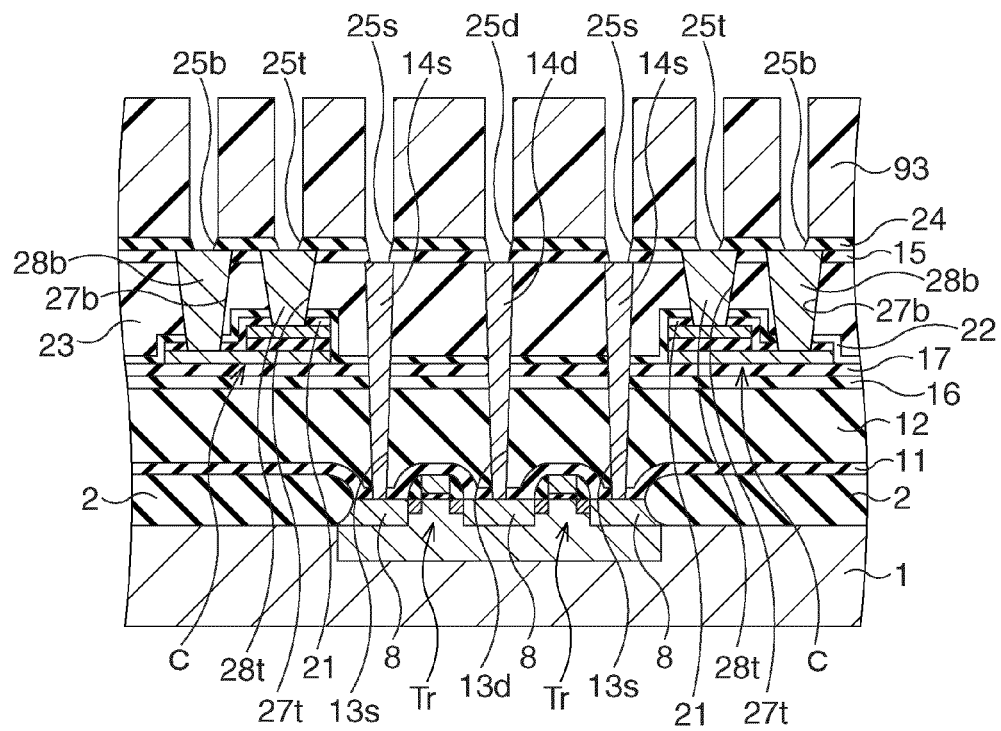
Figure 2D:
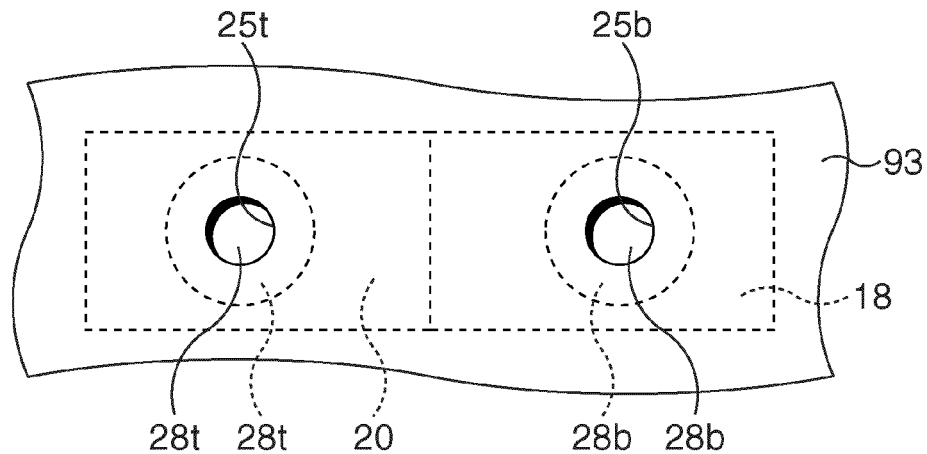

Next, as illustrated in FIG. 1L and FIG. 2D, a resist pattern 93 having openings at predetermined positions is formed. Then, etching of the NSG film 24 and so on is performed by using the resist pattern 93 as a mask thereby forming contact holes 25s reaching the contact plugs 14s, a contact hole 25d reaching the contact plug 14d, contact holes 25t reaching the contact plugs 28t, and contact holes 25b reaching the contact plugs 28b. The diameters of the contact holes 25t and 25b are set to be smaller than those of the contact holes 27t and 27b. In the present embodiment, the contact holes 25t and 25b may correspond to a second opening.

Figure 1M:
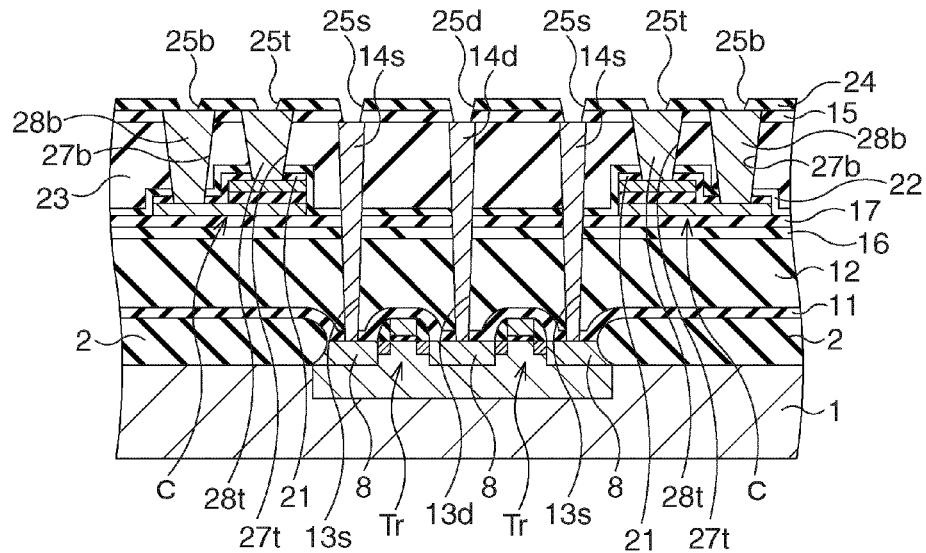
Figure 2E:
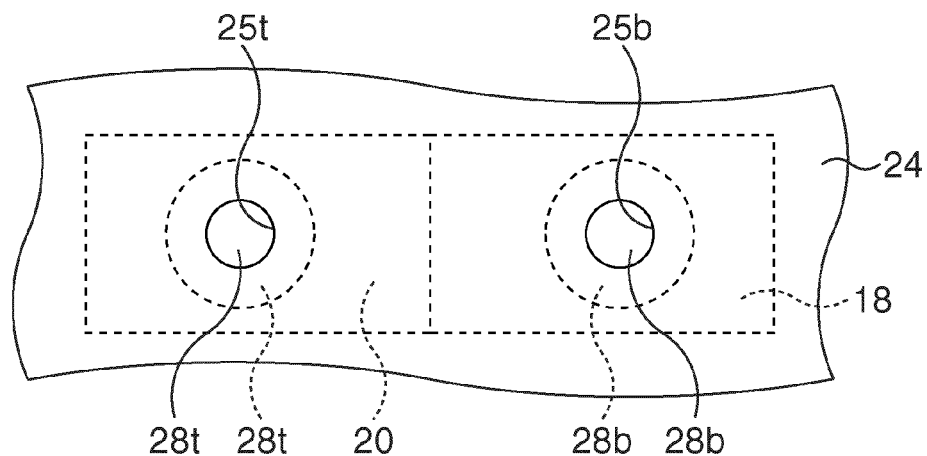

Thereafter, as illustrated in FIG. 1M and FIG. 2E, the resist pattern 93 is removed.

Figure 1N:
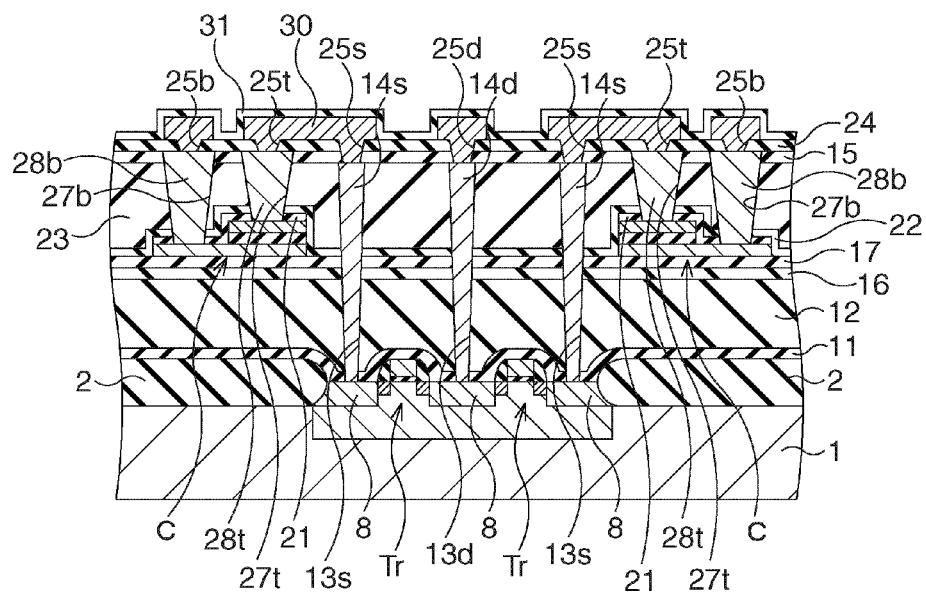
Figure 2F:
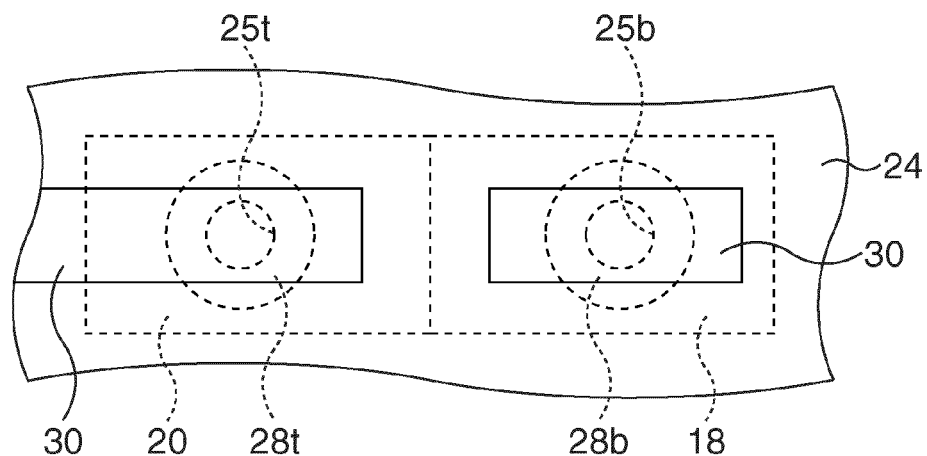

Subsequently, as illustrated in FIG. 1N and FIG. 2F, wirings 30 in contact with the contact plugs 14s, 14d, 28t, and 28b are formed via the contact holes 25s, 25d, 25t, and 25b. The wiring 30 connects, for example, the contact plug 14s and the contact plug 28t electrically. Note that in forming the wirings 30, firstly, a titanium nitride film whose thickness is approximately 150 nm, an AlCu alloy film whose thickness is approximately 550 nm, a titanium film whose thickness is approximately 5 nm, and a titanium nitride film whose thickness is approximately 150 nm are sequentially formed by a PVD method or the like. Next, patterning of these films is performed. In performing this patterning, the NSG film 24 functions as the etching stopper film.

After the wirings 30 are formed, a heat treatment in which a vertical furnace is used, the temperature of the semiconductor substrate 1 is 350° C., the treatment time is for 30 minutes, and the supply amount of nitrogen gas is 20 liters per minute is performed. Next, as illustrated in FIG. 1N, an aluminum oxide film 31 whose thickness is approximately 20 nm is formed on the entire surface by a PVD method or the like.

Thereafter, as illustrated in FIG. 1O, upper layer wirings and so on are formed. Although illustration in FIG. 1A to FIG. 1N is omitted, forming the transistor, the wirings, and so on is performed not only in a ferroelectric memory cell portion 81, but also in a logic circuit portion 82, a peripheral circuit portion 83, and a pad portion 84.

In the first embodiment, the contact holes 27t and 27b are set to be large therefore enabling a large amount of oxygen to be supplied to the PZT film 19 in performing recovery annealing. Further, the wirings 30 are in contact with the contact plugs 28t and 28b via the contact holes 25t and 25b whose areas at uppermost portions are smaller than those of the contact holes 27t and 27b. Therefore, problems such as a short circuit due to positional displacement of the wirings 30 and damages of the contact plugs 28t and 28b are not easily caused. Consequently, it becomes possible to perform sufficient recovery annealing without causing new problems, and improve various kinds of characteristics. For example, effects such as improvement of an inversion charge amount, improvement of a yield, and improvement of long term reliability can be obtained.

-Second Embodiment-

Figure 3A:
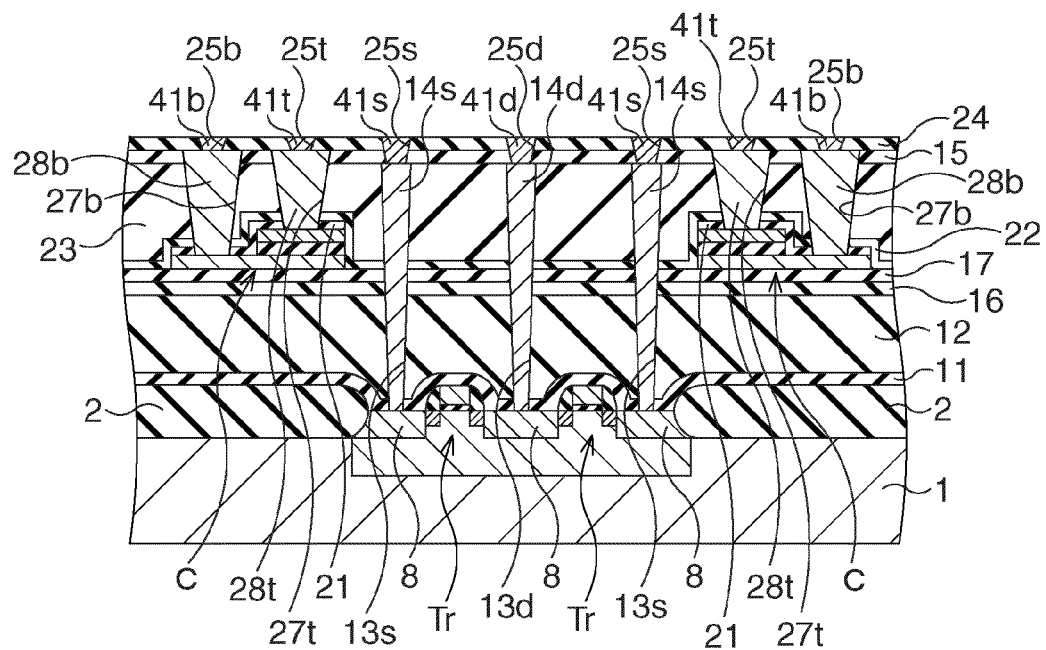
FIG. 3A and FIG. 3B are cross-sectional views showing a manufacturing method of a ferroelectric memory according to a second embodiment of the present invention in order of steps.
Figure 3B:
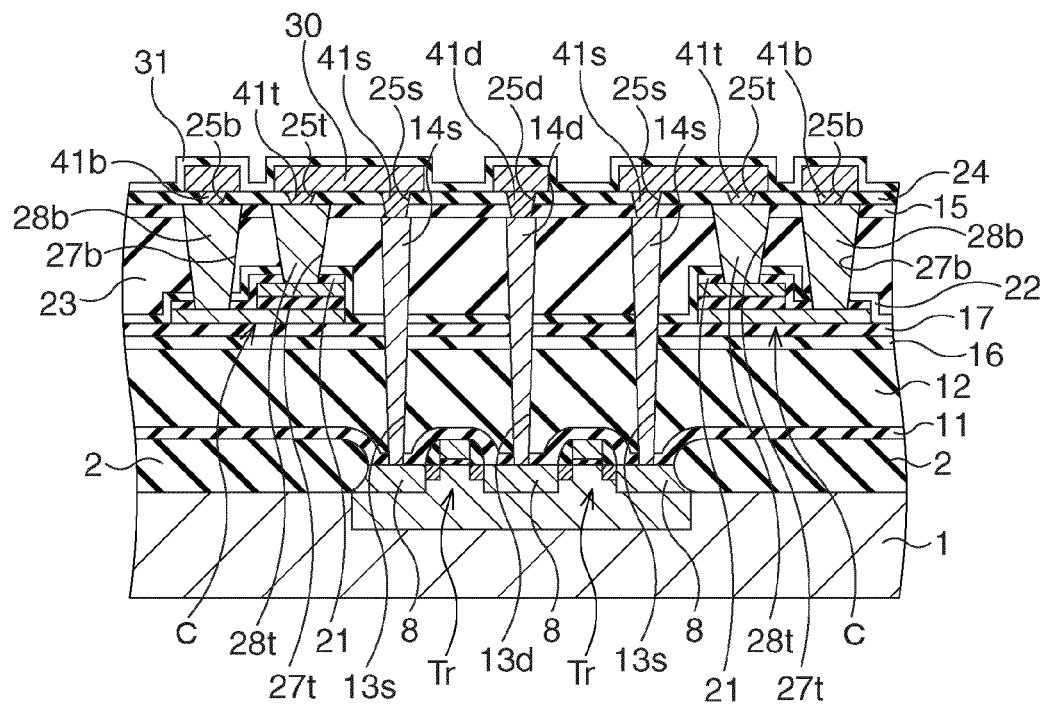

Next, a second embodiment of the present invention will be explained. FIG. 3A and FIG. 3B are cross-sectional views showing a manufacturing method of a ferroelectric memory according to the second embodiment of the present invention in order of steps.

In the second embodiment, first, similarly to the first embodiment, the processes to the removal of the resist pattern 92 are performed (refer to FIG. 1M). Next, a barrier metal film (not-illustrated) is formed on the entire surface by, for example, a PVD method, and a tungsten film (not-illustrated) is formed thereon by, for example, a CVD method. Then, the tungsten film and the barrier metal film are polished by, for example, a CMP method until the silicon oxynitride film 24 is exposed. As a result, as illustrated in FIG. 3A, contact plugs 41s, 41d, 41t, and 41b are formed in the contact holes 25s, 25d, 25t, and 25b. In the present embodiment, a second conductive plug includes the contact plugs 41t and 41b.

Subsequently, as illustrated in FIG. 3B, the wirings 30 in contact with the contact plugs 41s, 41d, 41t, and 41b are formed. The wiring 30 connects, for example, the contact plug 41s and the contact plug 41t electrically.

Thereafter, similarly to the first embodiment, the processes from the heat treatment are performed.

According to the second embodiment, the same effects as those of the first embodiment can be obtained as well.

Figure 4A:
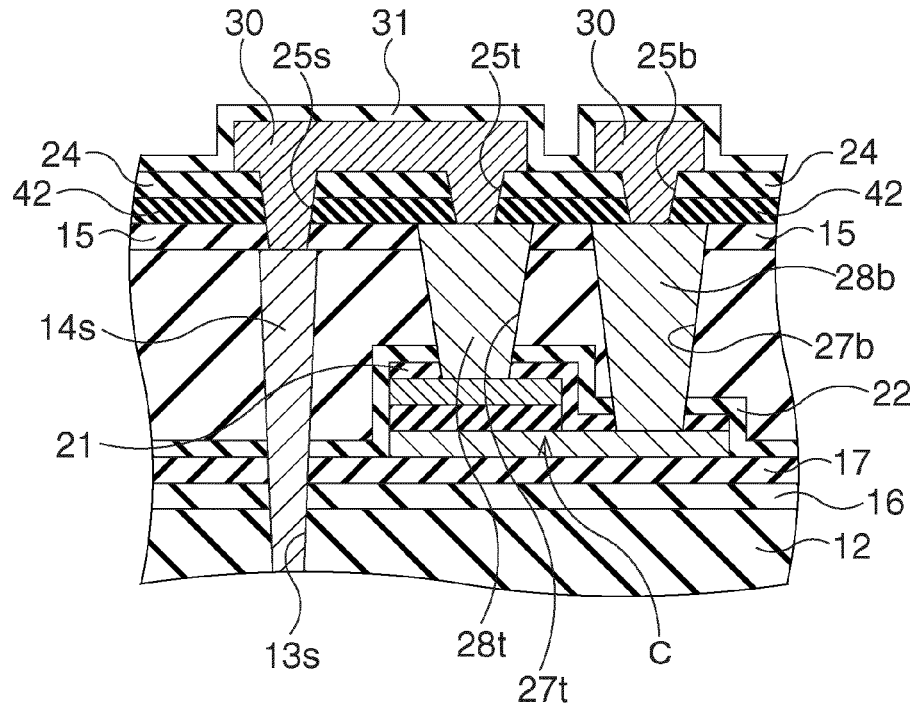
FIG. 4A is a cross-sectional view showing a modification example in the first embodiment.
Figure 4B:
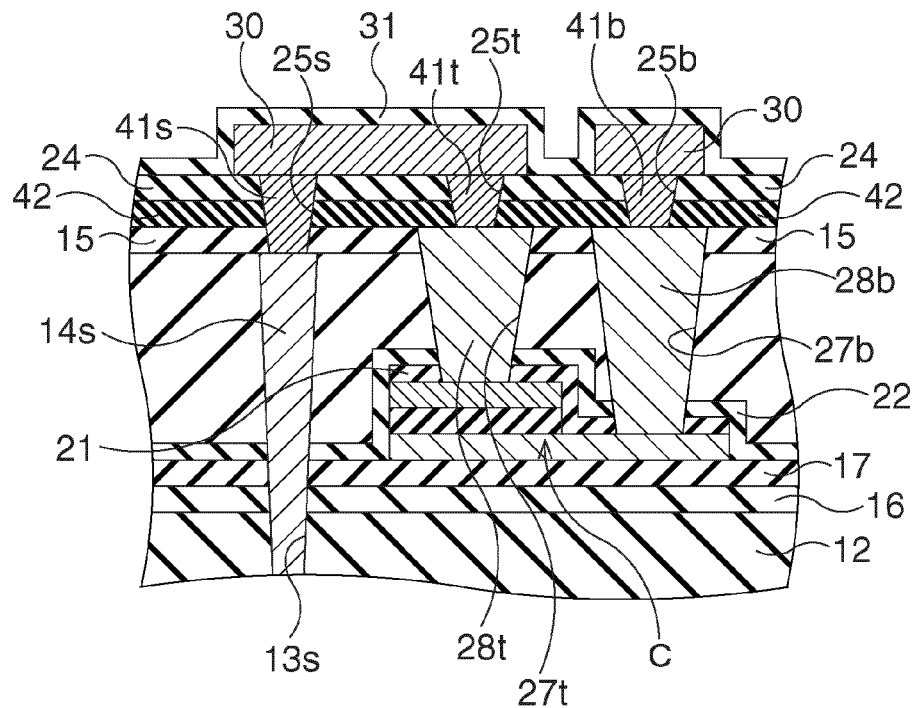
FIG. 4B is a cross-sectional view showing a modification example in the second embodiment.

Note that in the first and second embodiments, in place of the NSG film 24, another oxide film whose thickness is approximately 20 nm to 100 nm may be formed by a CVD method or the like. Further, by a plasma CVD method or the like, a film containing nitrogen such as a silicon oxynitride film or a silicon nitride film whose thickness is 20 nm to 100 nm may be formed as a barrier film preventing moisture from being permeated. Further, by a PVD method or the like, a metal oxide film whose thickness is approximately 20 nm to 50 nm may be formed as a barrier film preventing moisture and hydrogen from being permeated. As the metal oxide film, an aluminum oxide film, a titanium oxide film, a zirconium oxide film, a magnesium oxide film, a magnesium titanium oxide film, or the like is applied. Further, as illustrated in FIG. 4A and FIG. 4B, the NSG film 24 may be formed after a metal oxide film 42 is formed. Note that there is a case that subsequent processes will be difficult to be performed if these films are too thick. If these films are too thin, there is a case that they do not function as the etching stopper film sufficiently, or there is a case that the effect in which they prevent moisture and hydrogen from being permeated becomes insufficient. Further, it is preferable not to form a coating-type film. This is because a lot of water is used in the case of forming the coating-type film.

Further, it is preferable that both of the contact holes 27t and 27b are larger than the contact holes 25t and 25b, but if at least one of the contact holes 27t and 27b is larger than the contact holes 25t and 25b, the effect of the recovery annealing higher than that of the conventional recovery annealing can be obtained.

Third Embodiment

Figure 5A:
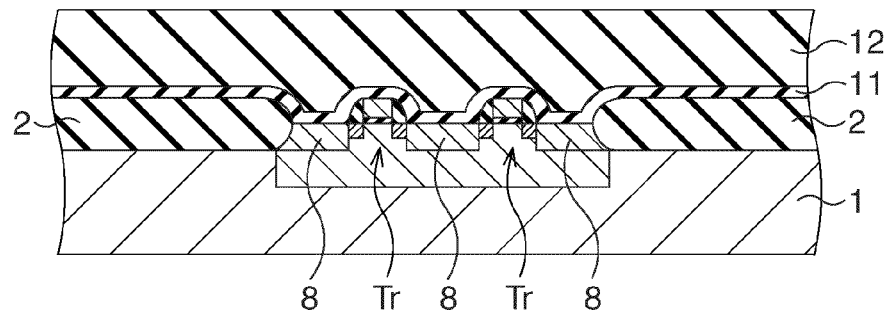
FIG. 5A to FIG. 5X are cross-sectional views showing a manufacturing method of a ferroelectric memory according to a third embodiment of the present invention in order of steps.

Next, a third embodiment of the present invention will be explained. FIG. 5A to FIG. 5X are cross-sectional views showing a manufacturing method of a ferroelectric memory according to the third embodiment of the present invention in order of steps.

In the third embodiment, first, similarly to the first embodiment, as illustrated in FIG. 5A, the processes to forming the NSG film 12 and flattening it are performed. Next, a dehydration treatment of the NSG film 12 is performed. The dehydration treatment may be set such that, for example, the temperature of the semiconductor substrate 1 is 650° C., the treatment time is for 30 minutes, and the supply amount of nitrogen gas is 2 liters per minute.

Figure 5B:
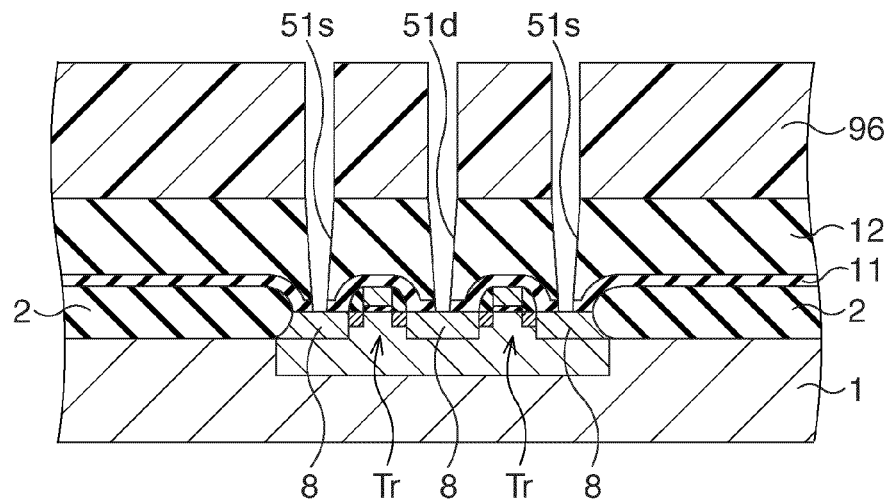

Next, as illustrated in FIG. 5B, a resist pattern 96 having openings at predetermined positions is formed on the NSG film 12. Then, etching of the NSG film 12 and so on is performed by using the resist pattern 96 as a mask thereby forming contact holes 51s reaching the sources and a contact hole 51d reaching the drain.

Figure 5C:
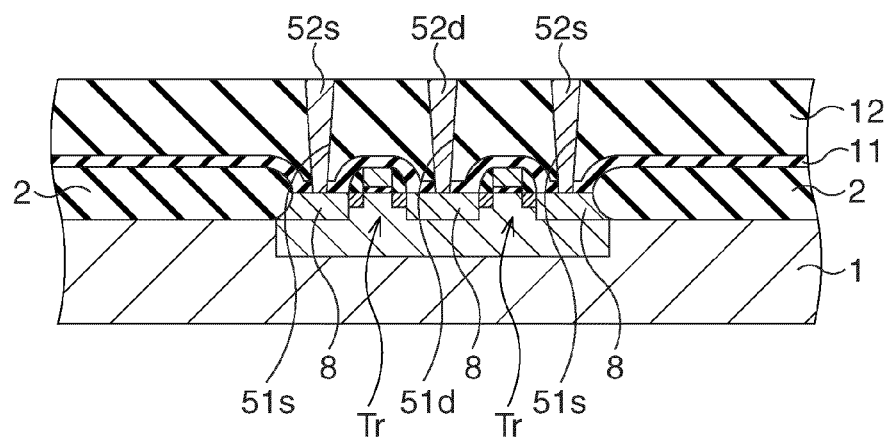

Subsequently, as illustrated in FIG. 5C, the resist pattern 96 is removed. Next, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the NSG film 12 is exposed. As a result, contact plugs 52s are formed in the contact holes 51s, and a contact plug 52d is formed in the contact hole 51d. Next, plasma annealing is performed in a nitrogen atmosphere, so that the surface of the NSG film 12 is nitrided. This plasma annealing may be set such that, for example, a CVD device or the like is used, the temperature of the semiconductor substrate 1 is 350° C., the treatment time is for 2 minutes, and $N_2O$ plasma is generated.

Figure 5D:
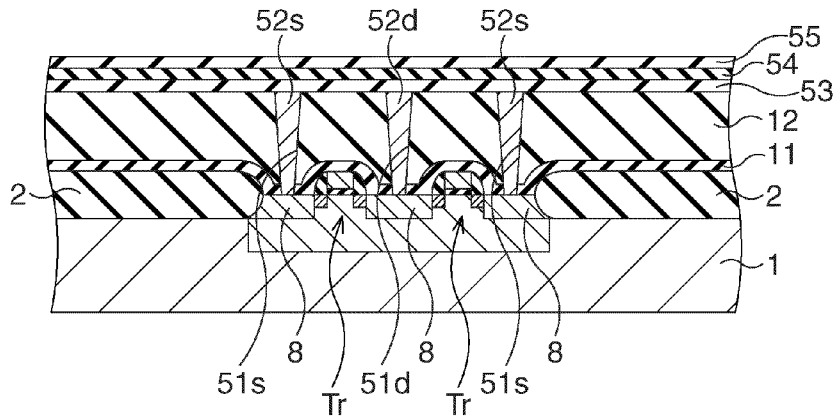

Next, as illustrated in FIG. 5D, a silicon oxynitride film 53 whose thickness is approximately 100 nm is formed on the NSG film 12 by a plasma CVD method or the like, and an NSG film 54 whose thickness is approximately 100 nm is formed thereon by a plasma CVD method using TEOS or the like. Further, an oxidation preventing film 55 is formed on the NSG film 54. As the oxidation preventing film 55, for example, by a plasma CVD method or the like, a silicon oxynitride film whose thickness is approximately 30 nm to 50 nm is formed, or by a PVD method or the like, an aluminum oxide film whose thickness is approximately 10 nm to 20 nm is formed. Note that the oxidation preventing film 55 does not have to be formed.

Figure 5E:
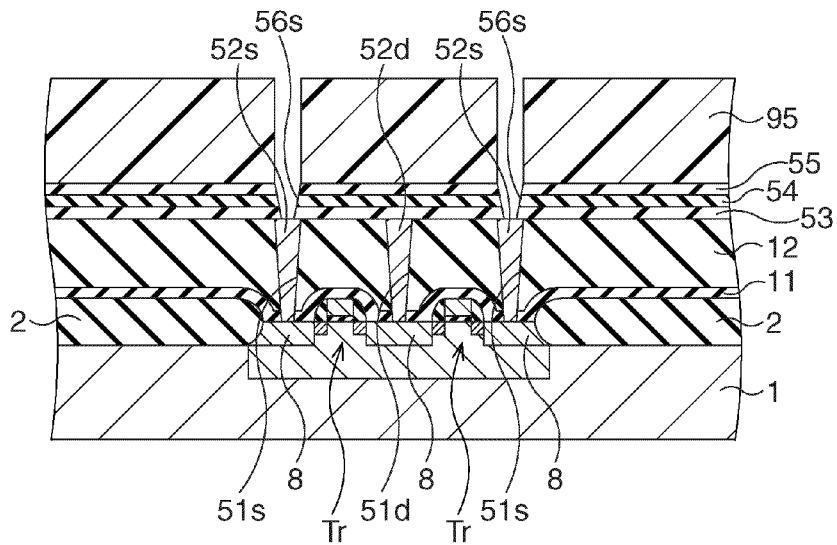

Next, as illustrated in FIG. 5E, a resist pattern 95 having openings at predetermined positions is formed on the oxidation preventing film 55. Then, etching of the oxidation preventing film 55 and so on is performed by using the resist pattern 95 as a mask thereby forming contact holes 56s reaching the contact plugs 52s.

Figure 5F:
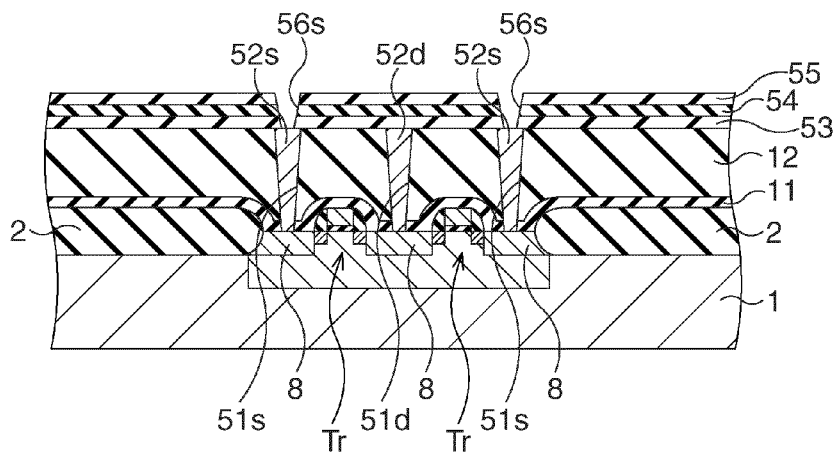

Thereafter, as illustrated in FIG. 5F, the resist pattern 95 is removed.

Figure 5G:
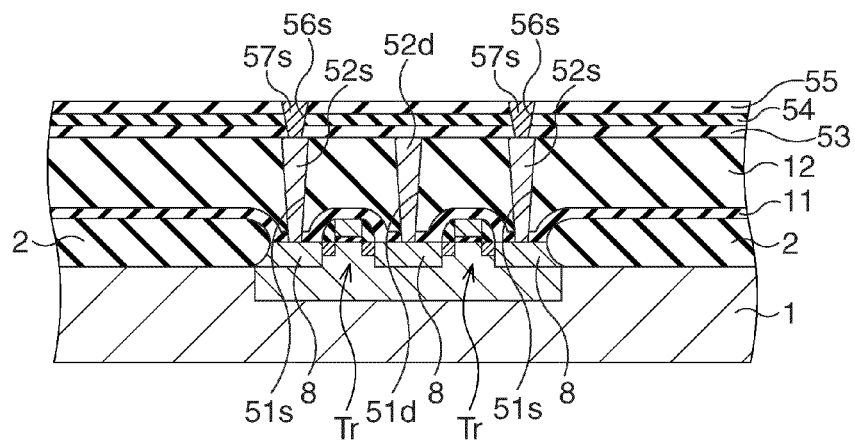

Subsequently, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the oxidation preventing film 55 is exposed. As a result, as illustrated in FIG. 5G, contact plugs 57s are formed in the contact holes 56s. In the case when the oxidation preventing film 55 is not formed, plasma annealing is then performed in a nitrogen atmosphere, so that the surface of the NSG film 54 is nitrided. This plasma annealing may be set such that, for example, the temperature of the semiconductor substrate 1 is 350° C., the treatment time is for 2 minutes, and $N_2O$ plasma is generated.

Figure 5H:
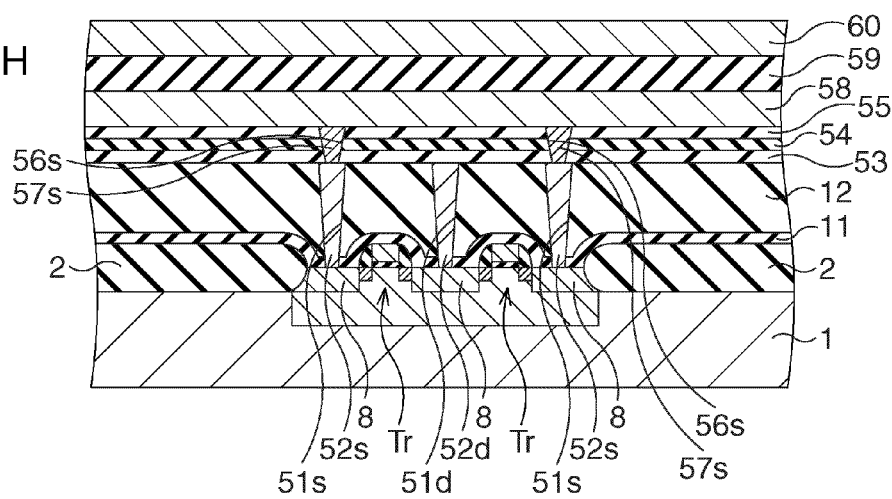

Next, as illustrated in FIG. 5H, a bottom electrode film 58, a PZT film 59, a top electrode film 60 (an iridium oxide film, for example) are formed sequentially on the oxidation preventing film 55. In forming the bottom electrode film 58, first, by a PVD method or the like, a titanium film whose thickness is approximately 20 nm is formed, and thereon by a PVD method or the like, a titanium aluminum nitride film whose thickness is approximately 100 nm is formed, and thereon, an iridium film whose thickness is approximately 100 nm is formed. Further, the thickness of the PZT film 59 is set to be approximately 120 nm. Further, the top electrode film 60 has a two-layer structure, and a heat treatment is performed after the lower layer (thickness: approximately 50 nm) is formed. In this heat treatment, an RTA in which the temperature of the semiconductor substrate 1 is 725° C., the treatment time is for 60 seconds, and the supply amount of oxygen gas is 0.025 liters per minute is performed. Further, a heat treatment is also performed after the upper layer (thickness: approximately 100 nm) is formed. In this heat treatment, an RTA in which the temperature of the semiconductor substrate 1 is 700° C., the treatment time is for 60 seconds, and the supply amount of oxygen gas is 0.025 liters per minute is performed.

Figure 5I:
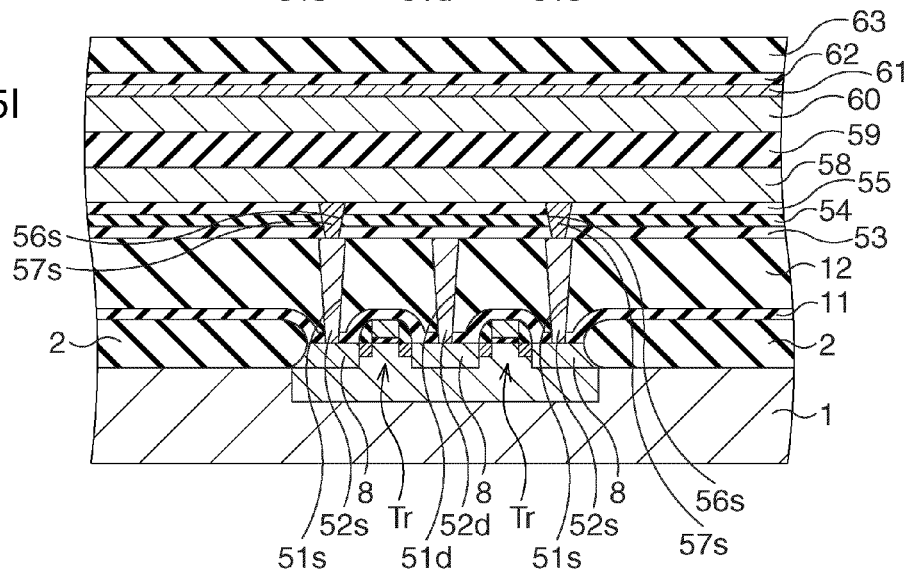

Thereafter, as illustrated in FIG. 5I, a platinum film 61 whose thickness is approximately 100 nm is formed on the top electrode film 60 by a PVD method or the like, and thereon, a titanium nitride film 62 whose thickness is approximately 200 nm is formed by a PVD method or the like, and thereon, an NSG film 63 whose thickness is approximately 700 nm is formed by a plasma CVD method using TEOS or the like. Note that in place of the platinum film 61, an iridium film may be formed. Further, the platinum film 61 may be regarded as a portion of the top electrode film.

Figure 5J:
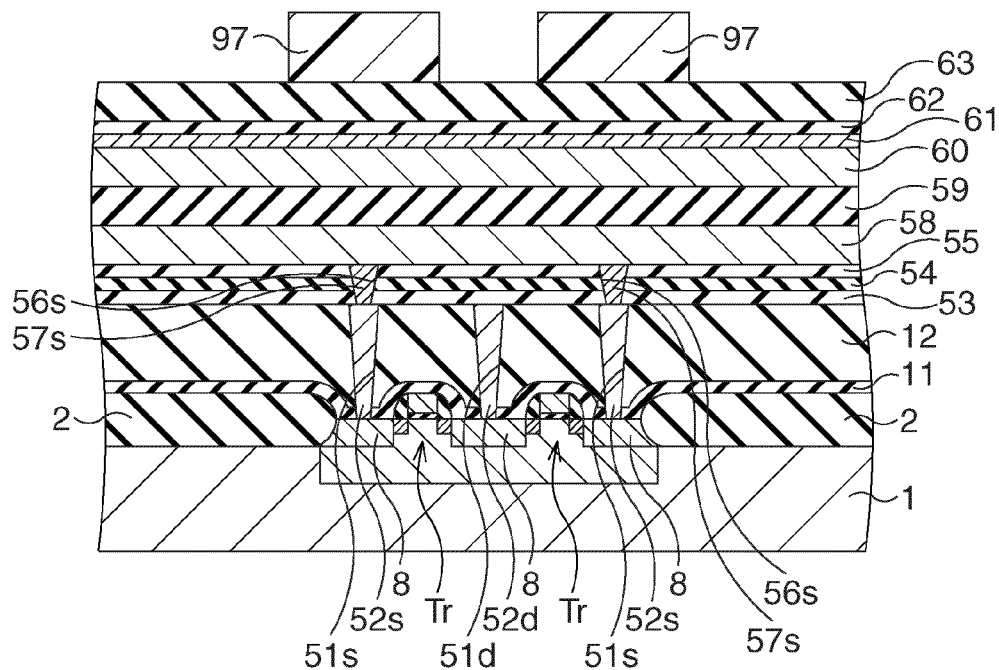

Subsequently, as illustrated in FIG. 5J, a resist pattern 97 covering regions where the ferroelectric capacitors are desired to be formed is formed on the NSG film 63.

Figure 5K:
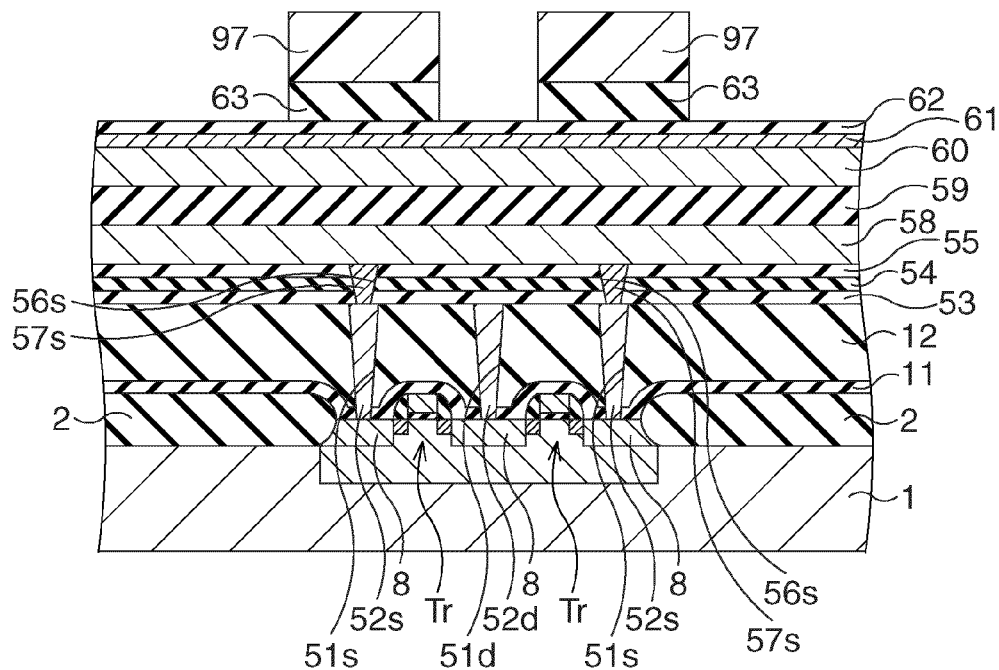

Next, as illustrated in FIG. 5K, patterning of the NSG film 63 is performed by using the resist pattern 97 as a mask.

Figure 5L:
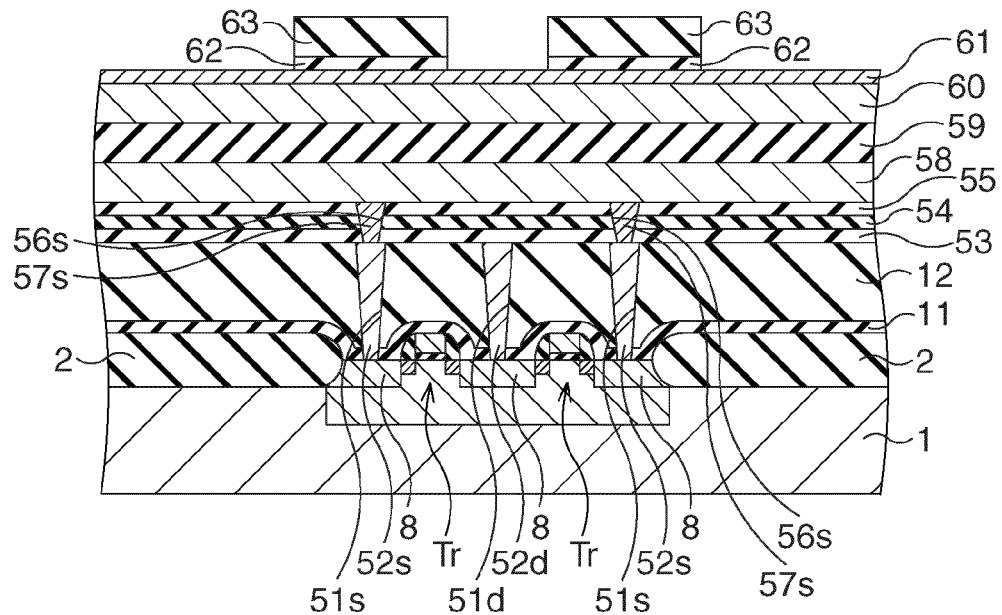

Next, as illustrated in FIG. 5L, patterning of the titanium nitride film 62 is performed by using the resist pattern 97 and the NSG film 63 as a mask. The resist pattern 97 disappears while performing this patterning.

Figure 5M:
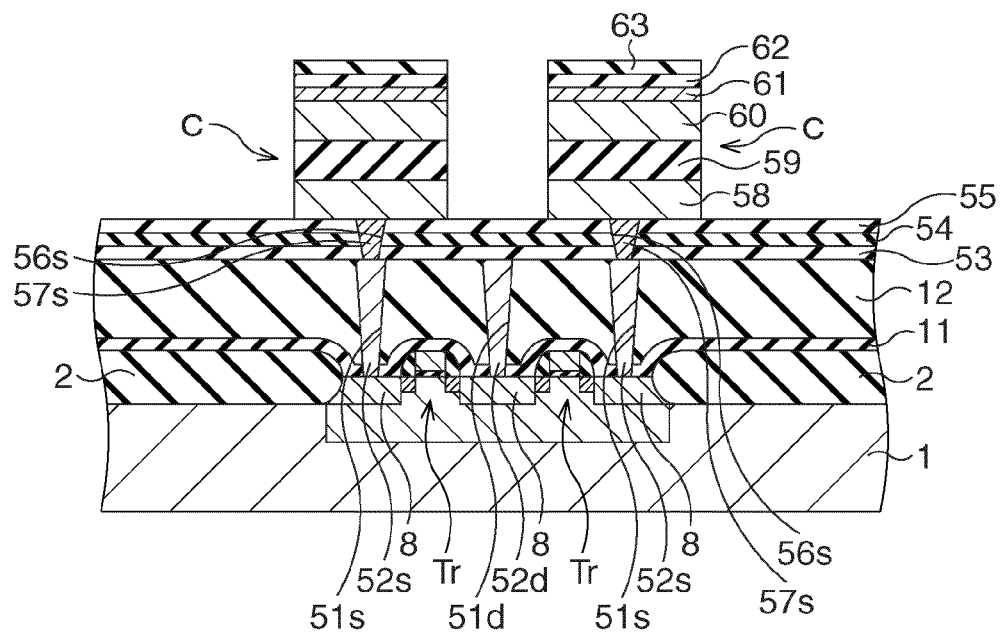

Thereafter, as illustrated in FIG. 5M, the platinum film 61, the top electrode film 60, the PZT film 59, and the bottom electrode film 58 are collectively patterned by using the NSG film 63 and the titanium nitride film 62 as a mask. Thus, the ferroelectric capacitors C are formed.

Figure 5N:
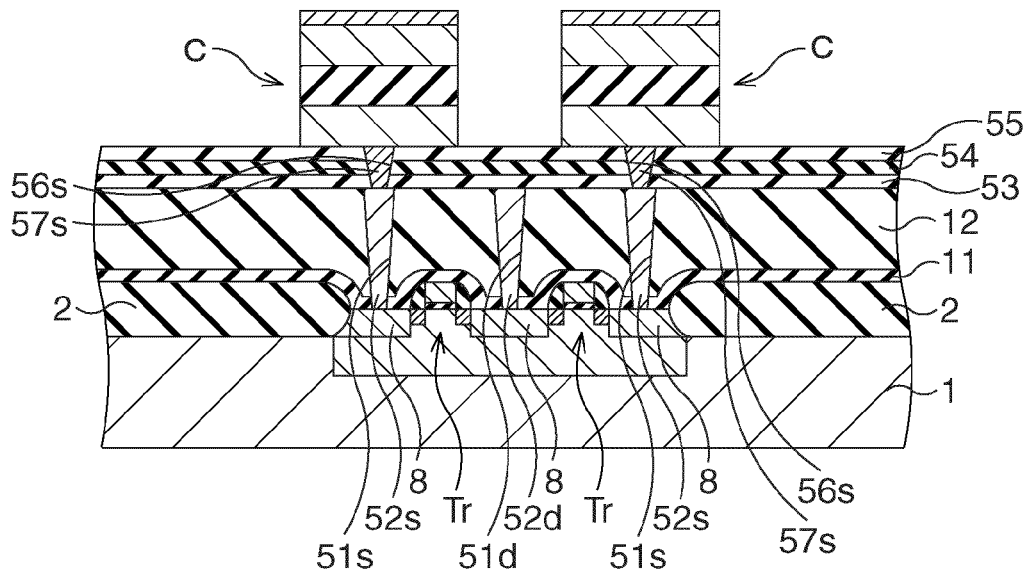

Subsequently, as illustrated in FIG. 5N, the NSG film 63 and the titanium nitride film 62, which have been used as a hard mask, are removed, and then recovery annealing is performed. For the NSG film 63 and the titanium nitride film 62, for example, dry etching and wet etching are performed. The recovery annealing may be set such that, for example, a vertical furnace is used, the temperature of the semiconductor substrate 1 is 350° C., the treatment time is for 40 minutes, and the supply amount of oxygen gas is 20 liters per minute.

Figure 5O:
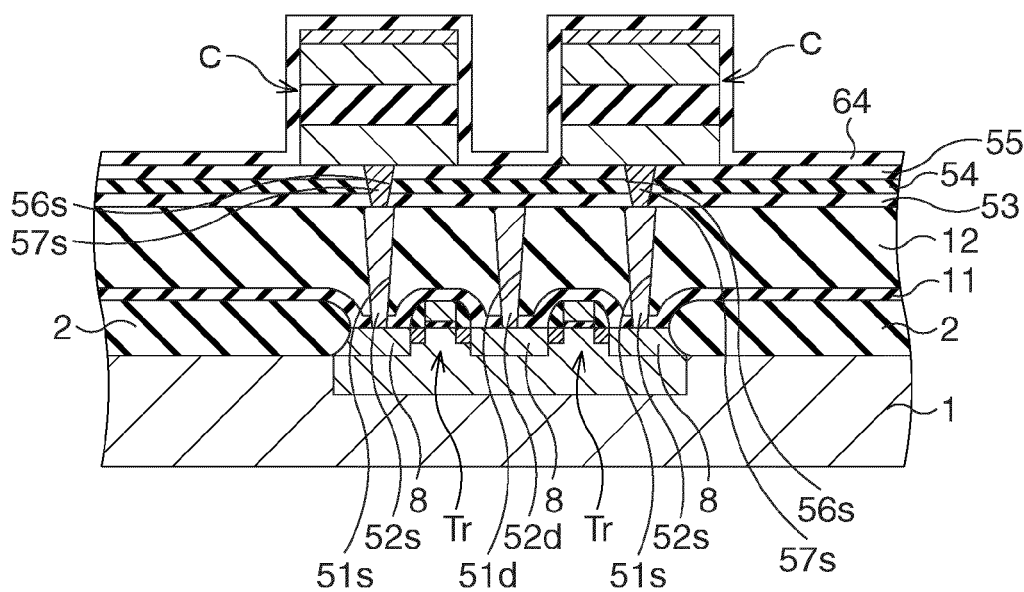

Next, as illustrated in FIG. 5O, an aluminum oxide film 64 whose thickness is approximately 50 nm is formed on the entire surface by an ALD (atomic layer deposition) method or the like. The aluminum oxide film 64 has a two-layer structure, and recovery annealing is performed after the lower layer (thickness: approximately 2 nm) is formed. In this recovery annealing, an RTA in which the temperature of the semiconductor substrate 1 is 600° C., the treatment time is for 40 minutes, and the supply amount of oxygen gas is 20 liters per minute is performed. Further, the thickness of the upper layer is set to be approximately 48 nm.

Figure 5P:
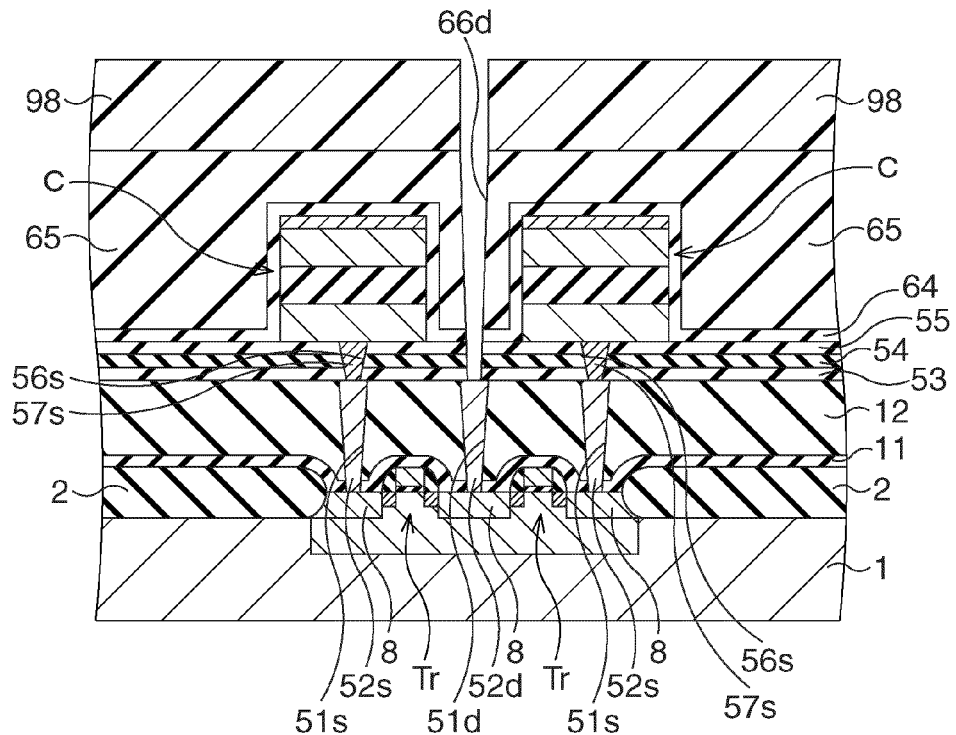

Next, as illustrated in FIG. 5P, a silicon oxide film 65 whose thickness is approximately 1500 nm is formed on the entire surface by a high density plasma CVD method or the like, and then the surface thereof is flattened. In the present embodiment, the first insulating film includes the aluminum oxide film 64 and the silicon oxide film 65. Thereafter, a resist pattern 98 having an opening at a predetermined position is formed on the silicon oxide film 65. Then, etching of the silicon oxide film 65 and so on is performed by using the resist pattern 98 as a mask thereby forming a contact hole 66d reaching the contact plug 52d.

Figure 5Q:
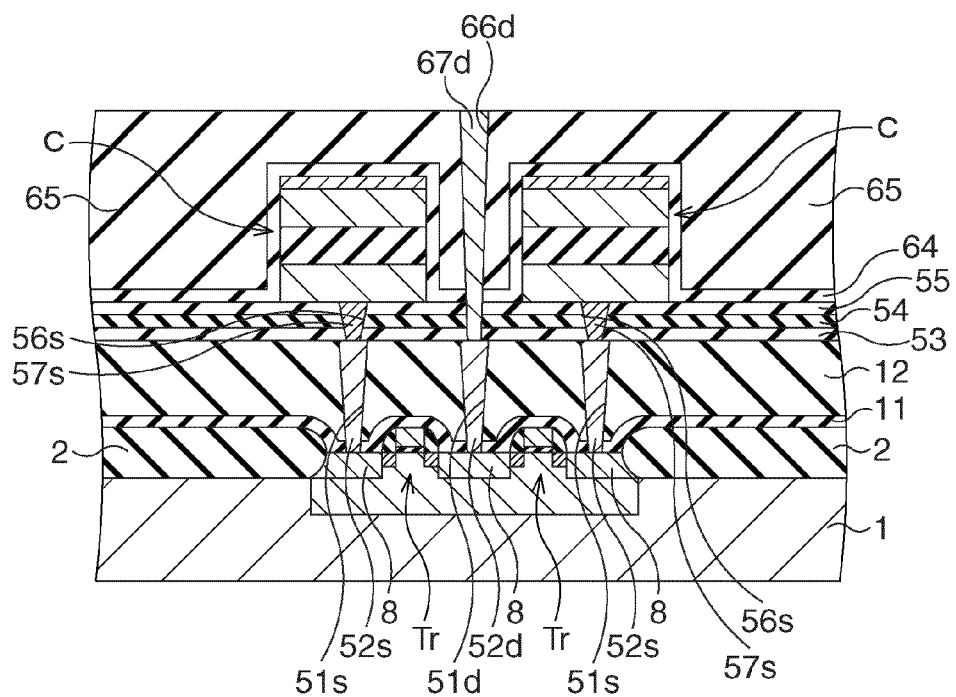

Subsequently, as illustrated in FIG. 5Q, the resist pattern 98 is removed.

Next, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the silicon oxide film 65 is exposed. As a result, as illustrated in FIG. 5Q, a contact plug 67d is formed in the contact hole 66d.

Figure 5R:
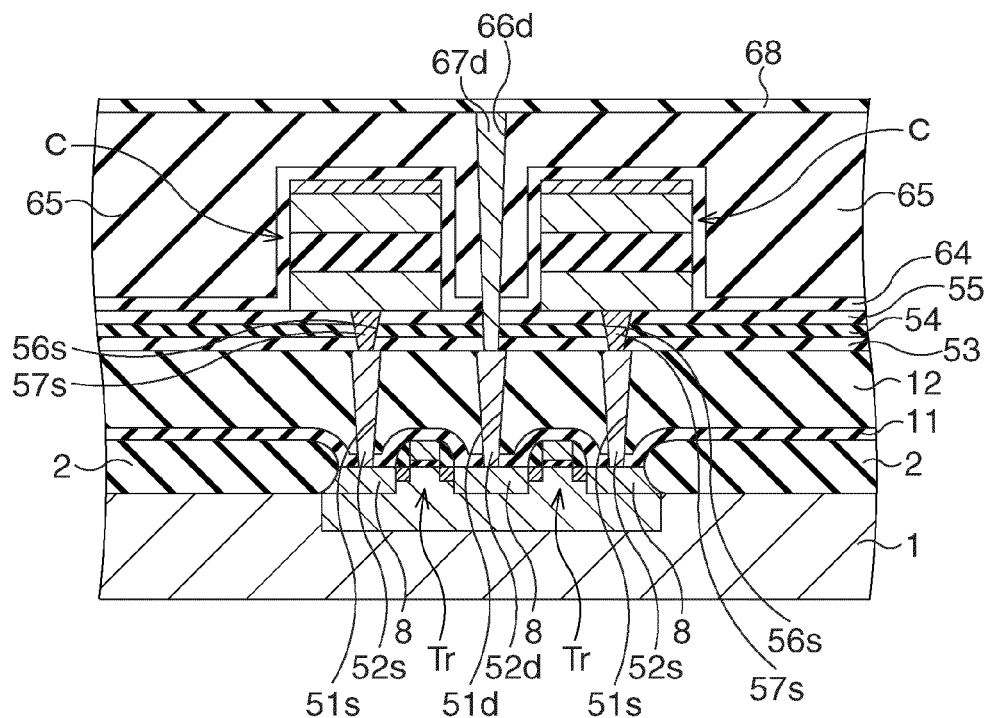

Next, as illustrated in FIG. 5R, a silicon oxynitride film 68 whose thickness is approximately 100 nm is formed on the silicon oxide film 65 by a plasma CVD method or the like.

Figure 5S:
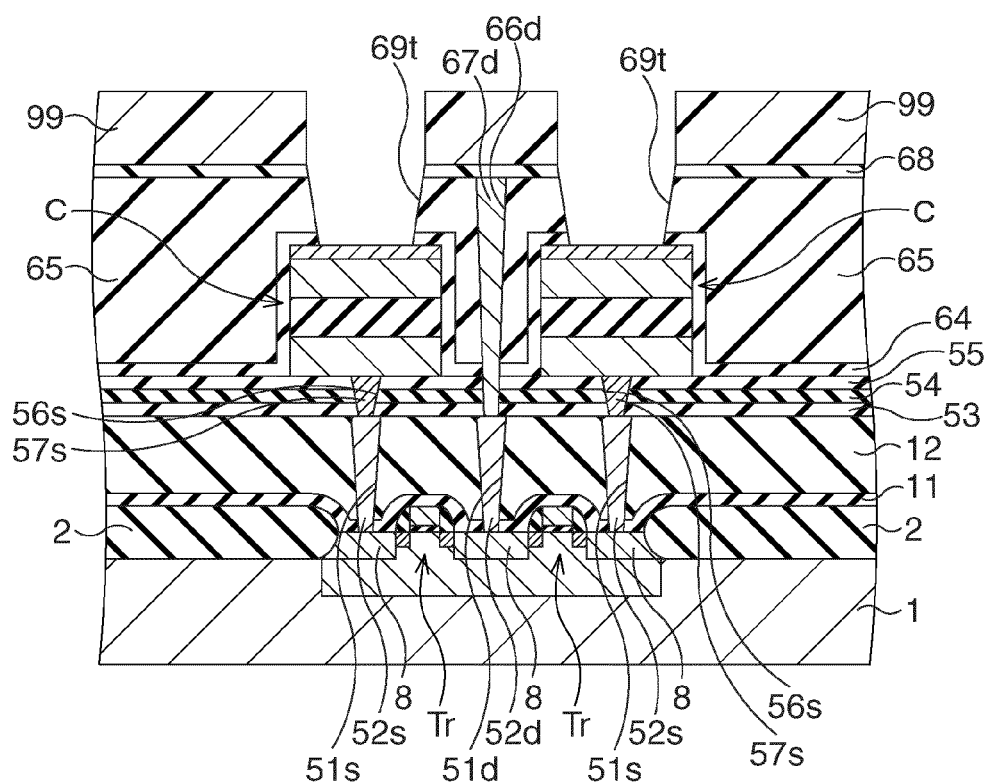

Thereafter, as illustrated in FIG. 5S, a resist pattern 99 having openings at predetermined positions is formed on the entire surface. Then, etching of the silicon oxynitride film 68 and so on is performed by using the resist pattern 99 as a mask thereby forming contact holes 69t reaching the platinum film 61. Note that the diameter of the contact hole 69t is set to be, for example, approximately 1000 nm, which is relatively large. Further, it is preferable that the area at an uppermost portion of the contact hole 69t is equal to or more than 0.9 times as large as the area of the uppermost surface of the top electrode. This is for securing a path for oxygen large in performing recovery annealing. In the present embodiment, the contact holes 69t may correspond to the first opening.

Figure 5T:
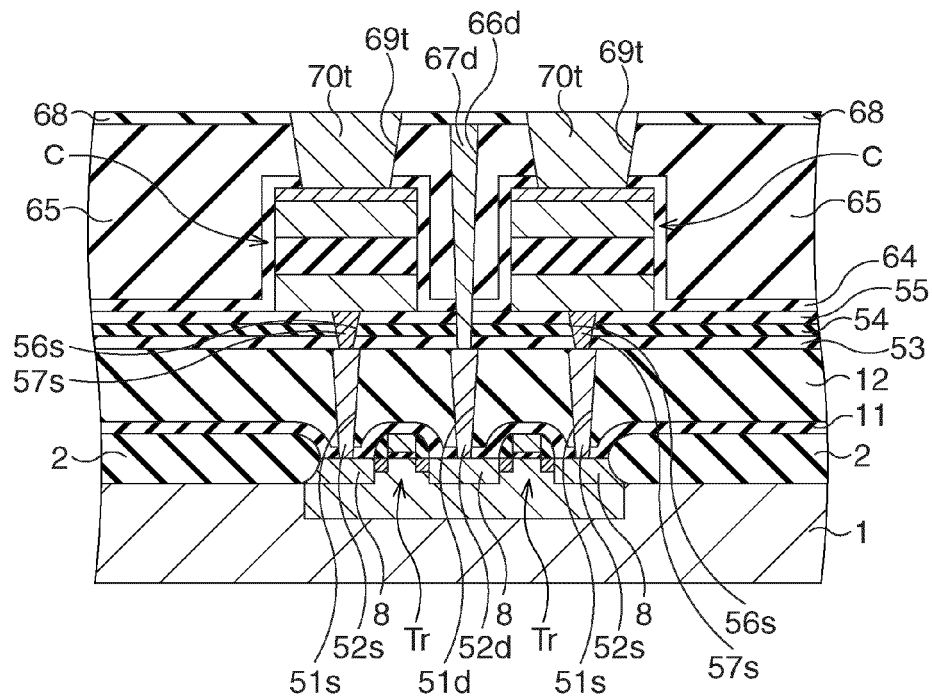

Subsequently, as illustrated in FIG. 5T, the resist pattern 99 is removed, and then recovery annealing is performed. This recovery annealing may be set such that, for example, a vertical furnace is used, the temperature of the semiconductor substrate 1 is 500° C., the treatment time is for 60 minutes, and the supply amount of oxygen gas is 20 liters per minute. Next, a barrier metal film (not-illustrated) whose thickness is approximately 70 nm is formed on the entire surface by, for example, a PVD method, and a tungsten film (not-illustrated) whose thickness is approximately 800 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the silicon oxynitride film 68 is exposed. As a result, contact plugs 70t are formed in the contact holes 69t. In the present embodiment, the conductive plug includes the contact plugs 70t.

Figure 5U:
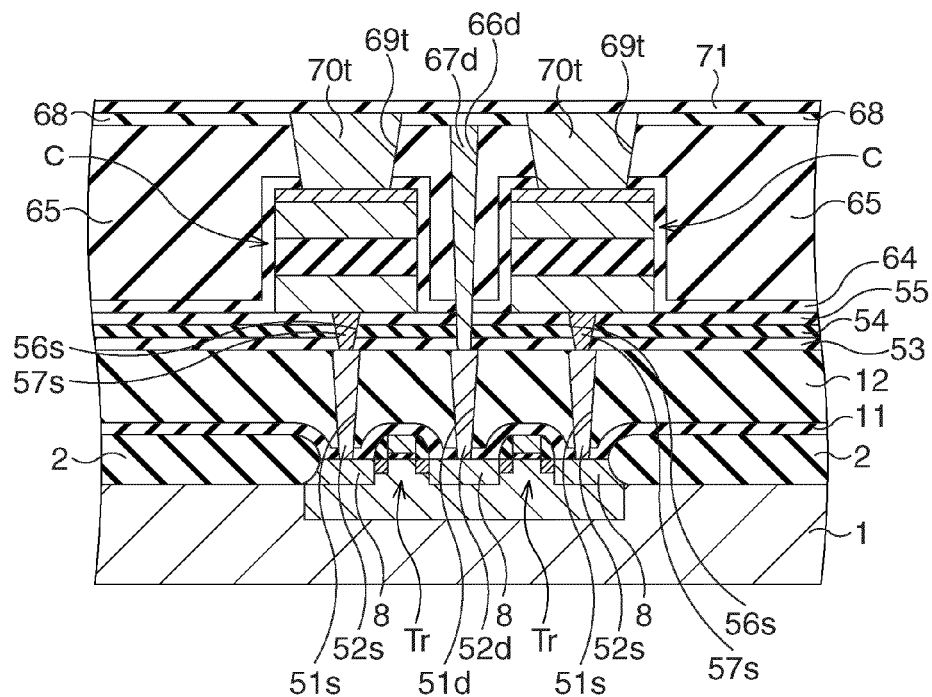

Next, as illustrated in FIG. 5U, an NSG film 71 whose thickness is approximately 100 nm is formed on the entire surface by a plasma CVD method using TEOS or the like. Thereafter, plasma annealing is performed in a nitrogen atmosphere, so that the surface of the NSG film 71 is nitrided. This plasma annealing may be set such that, for example, a CVD device is used, the temperature of the semiconductor substrate 1 is 350° C., the treatment time is for 2 minutes, and $N_2O$ plasma is generated. In the present embodiment, the second insulating film includes the NSG film 71. Further, the NSG film 71 later functions as an etching stopper film to the wirings.

Figure 5V:
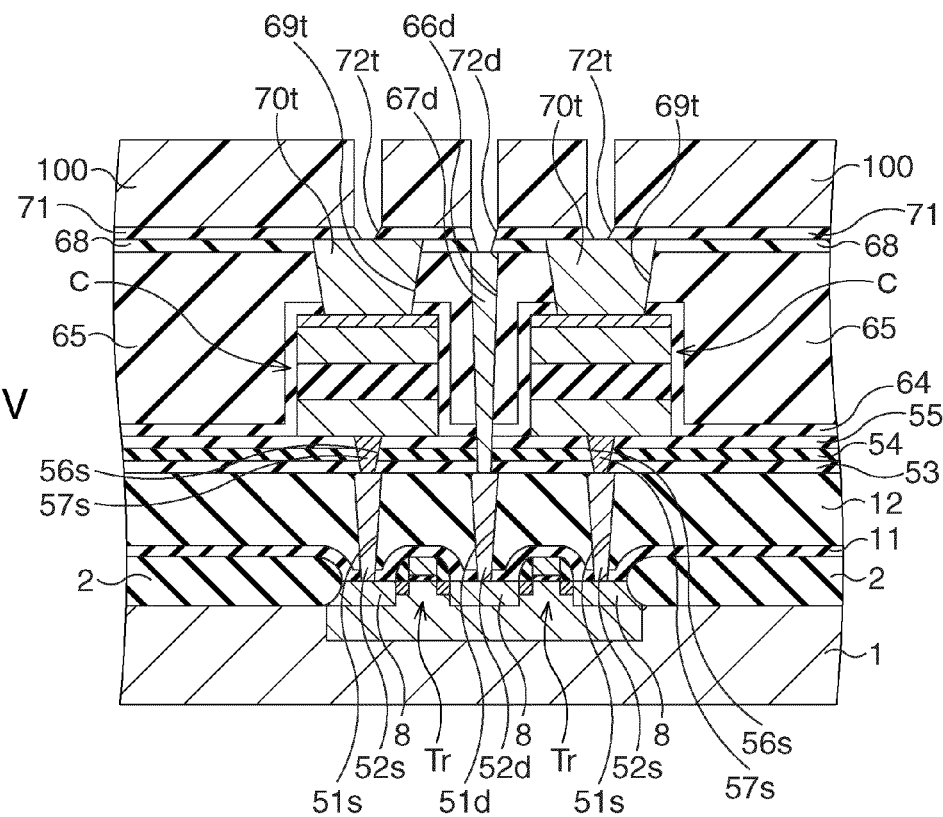

Thereafter, as illustrated in FIG. 5V, a resist pattern 100 having openings at predetermined positions is formed on the entire surface. Then, etching of the NSG film 71 and so on is performed by using the resist pattern 100 as a mask thereby forming contact holes 72t reaching the contact plugs 70t. The diameter of the contact hole 72t is set to be smaller than that of the contact hole 69t. In this embodiment, the contact holes 72t may correspond to the second opening.

Figure 5W:
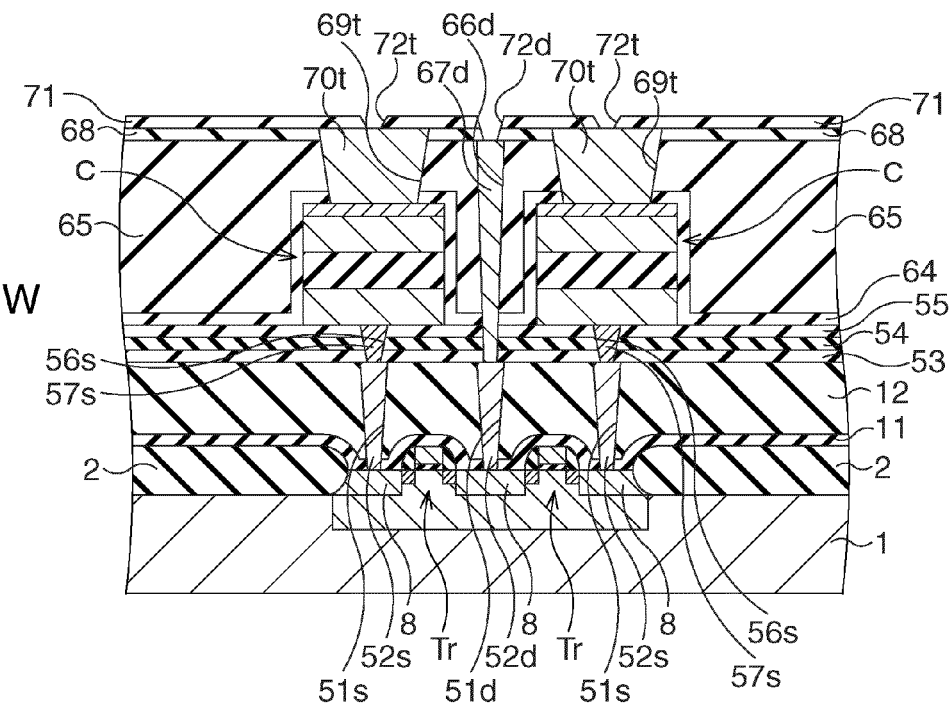
Figure 5X:
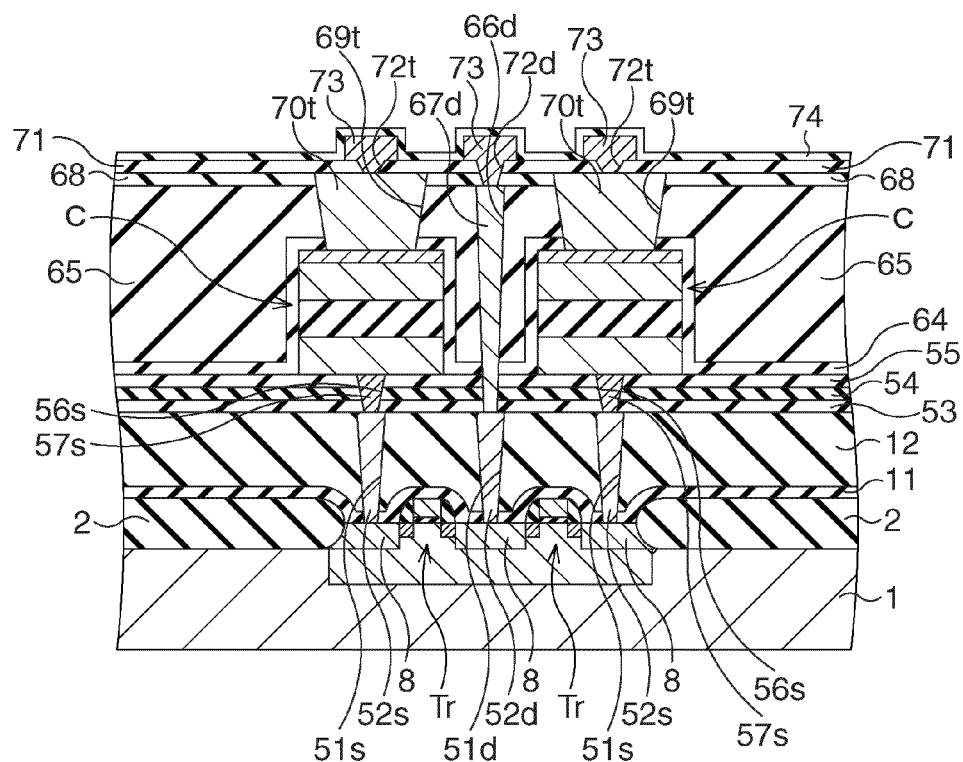

Subsequently, as illustrated in FIG. 5W, the resist pattern 100 is removed.

Next, as illustrated in FIG. 5X, wirings 73 in contact with the contact plugs 70t and 67d are formed. Note that in forming the wirings 73, first, a titanium nitride film whose thickness is approximately 150 nm, an AlCu alloy film whose thickness is approximately 550 nm, a titanium film whose thickness is approximately 5 nm, and a titanium nitride film whose thickness is approximately 150 nm are sequentially formed by a PVD method or the like. Next, patterning of these films is performed.

After the wirings 73 are formed, a heat treatment in which a vertical furnace is used, the temperature of the semiconductor substrate 1 is 350° C., the treatment time is for 30 minutes, and the supply amount of nitrogen gas is 20 liters per minute is performed. Next, an aluminum oxide film 74 whose thickness is approximately 20 nm is formed on the entire surface by a PVD method or the like.

Thereafter, upper layer wirings and so on are formed. Note that although illustration in FIG. 5A to FIG. 5X is omitted, similarly to the first embodiment, forming the transistor, the wirings, and so on is performed not only in the ferroelectric memory cell portion, but also in the logic circuit portion, the peripheral circuit portion, and the pad portion.

In the third embodiment, the contact holes 69t are set to be large therefore enabling a large amount of oxygen to be supplied to the PZT film 59 in performing recovery annealing. Further, the wirings 73 are in contact with the contact plugs 70t via the contact holes 72t, whose area at the uppermost portion is smaller than that of the contact holes 69t. Therefore, problems such as a short circuit due to positional displacement of the wirings 73 and damages of the contact plugs 70t are not easily caused. Consequently, similarly to the first embodiment, it becomes possible to perform sufficient recovery annealing without causing new problems, and improve various kinds of characteristics.

-Fourth Embodiment-

Figure 6A:
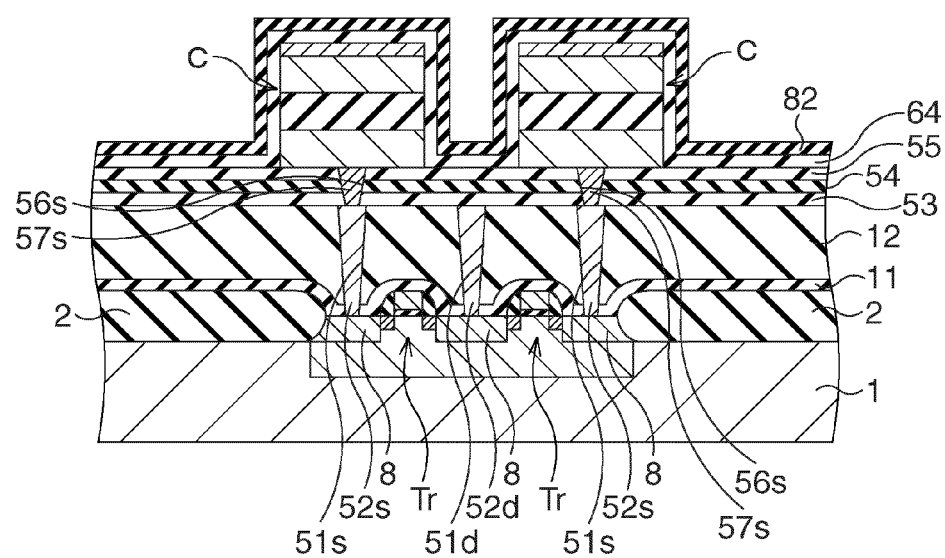
FIG. 6A and FIG. 6B are cross-sectional views showing a manufacturing method of a ferroelectric memory according to a fourth embodiment of the present invention in order of steps.
Figure 6B:
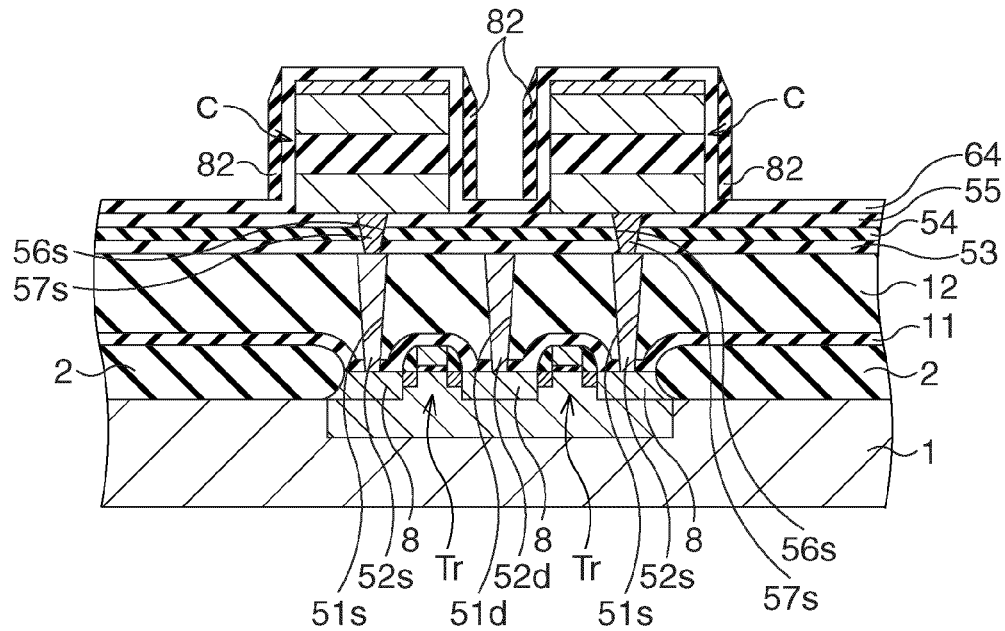

Next, a fourth embodiment of the present invention will be explained. FIG. 6A and FIG. 6B are cross-sectional views showing a manufacturing method of a ferroelectric memory according to the fourth embodiment of the present invention in order of steps.

In the fourth embodiment, first, similarly to the third embodiment, as illustrated in FIG. 6A, the processes to the formation of the aluminum oxide film 64 are performed. Next, an aluminum oxide film 82 whose thickness is approximately 50 nm is formed on the aluminum oxide film 64 by an ALD method or the like.

Next, etching back of the aluminum oxide film 82 is performed, and thereby, as illustrated in FIG. 6B, some parts of the aluminum oxide film 82 are left on lateral sides of the ferroelectric capacitors C as a sidewall insulating film.

Thereafter, similarly to the third embodiment, the processes from the formation of the silicon oxide film 65 are performed.

In this fourth embodiment, the aluminum oxide film 82 is formed on the lateral sides of the ferroelectric capacitors C as the sidewall insulating film, and thereby, it becomes possible to further suppress deterioration of the ferroelectric capacitor C due to hydrogen penetration.

Note that in place of the aluminum oxide film 82, a film containing nitrogen such as a silicon oxynitride film may be formed by a plasma CVD method or the like. Further, a metal oxide film such as a titanium oxide film, a zirconium oxide film, a magnesium oxide film, or a magnesium titanium oxide film may be formed.

Further, in the third and fourth embodiments, as described in the second embodiment, the wirings 73 may be formed after contact plugs (the second conductive plug) are formed in the contact holes 72s and 72t.

Figure 7:
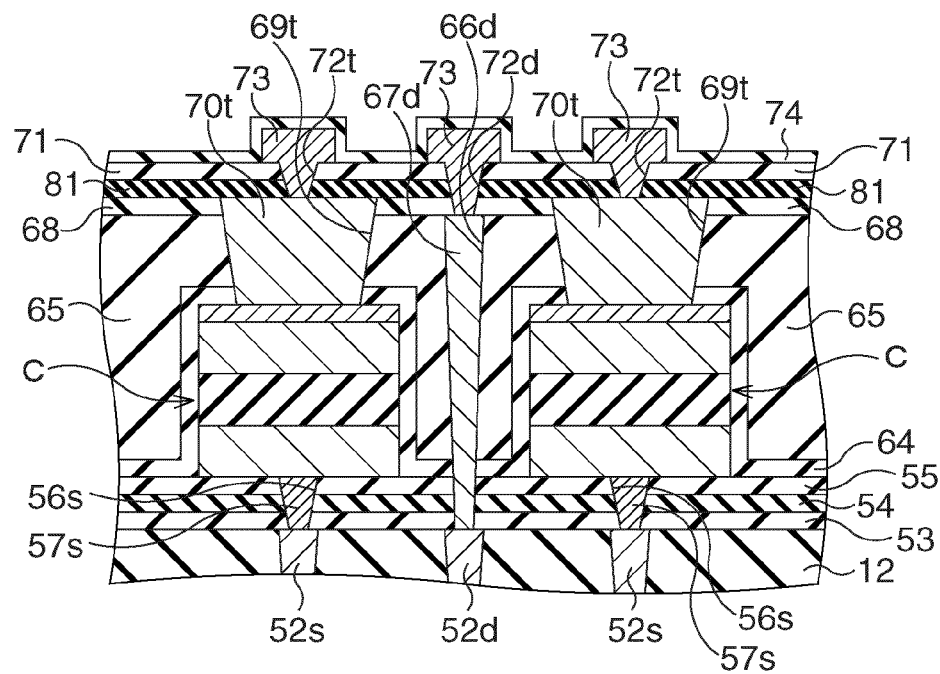
FIG. 7 is a cross-sectional view showing a modification example in the third embodiment.
Figure 8A:
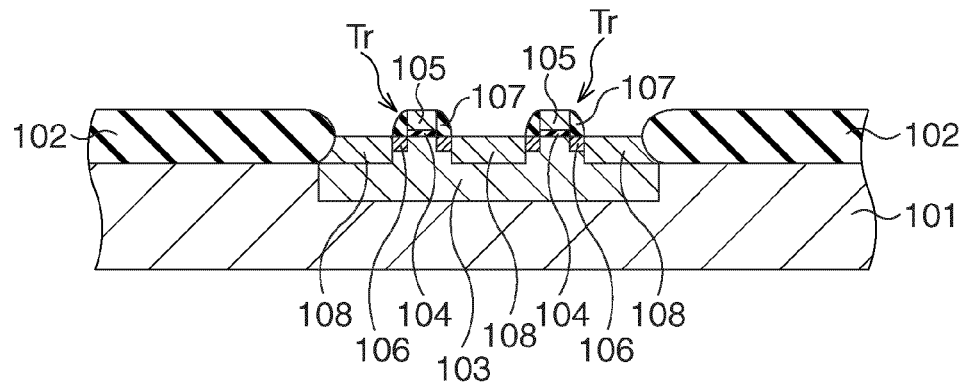
FIG. 8A to FIG. 8L are cross-sectional views showing a conventional manufacturing method of a planar-type ferroelectric memory in order of steps.
Figure 8B:
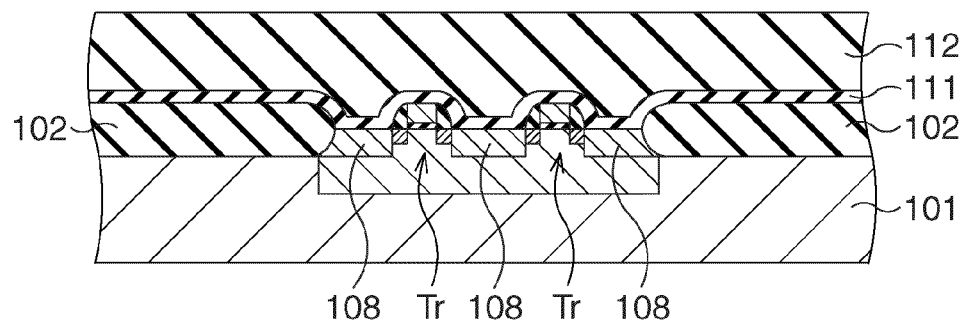
Figure 8C:
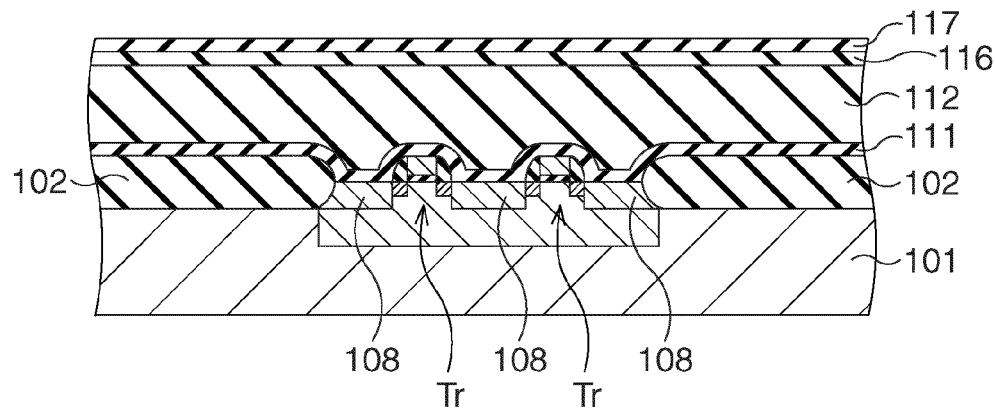
Figure 8D:
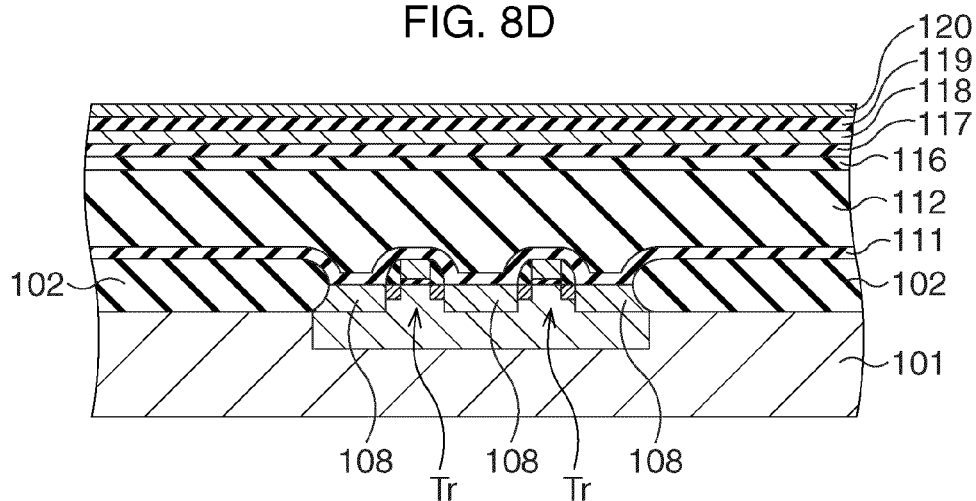
Figure 8E:
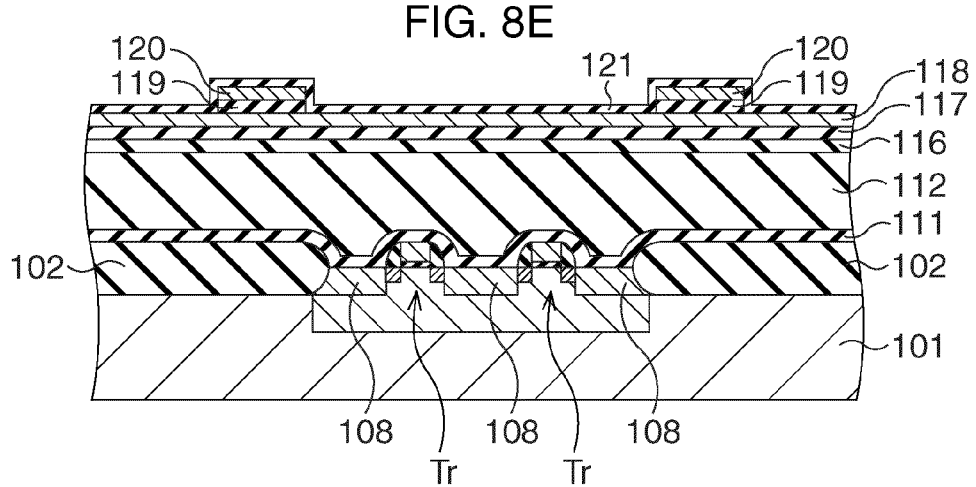
Figure 8F:
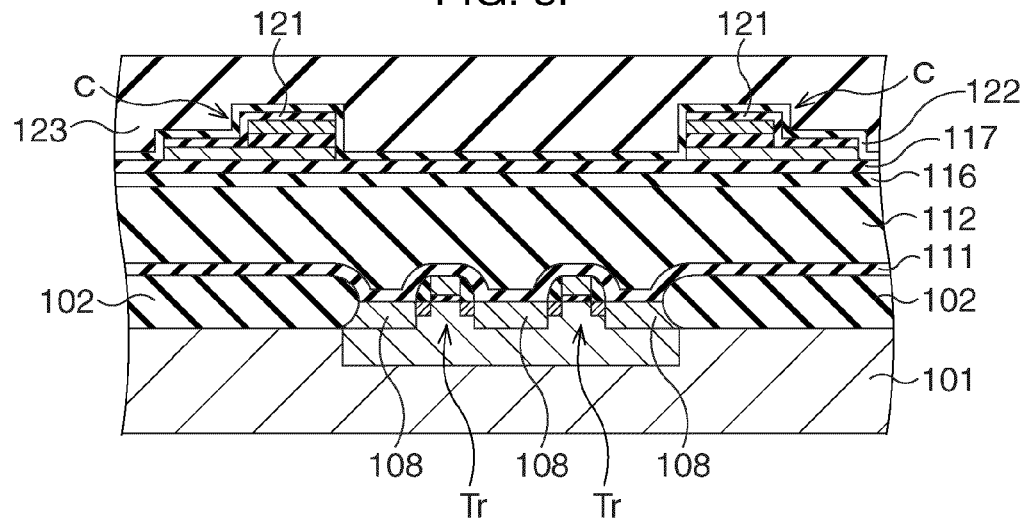
Figure 8G:
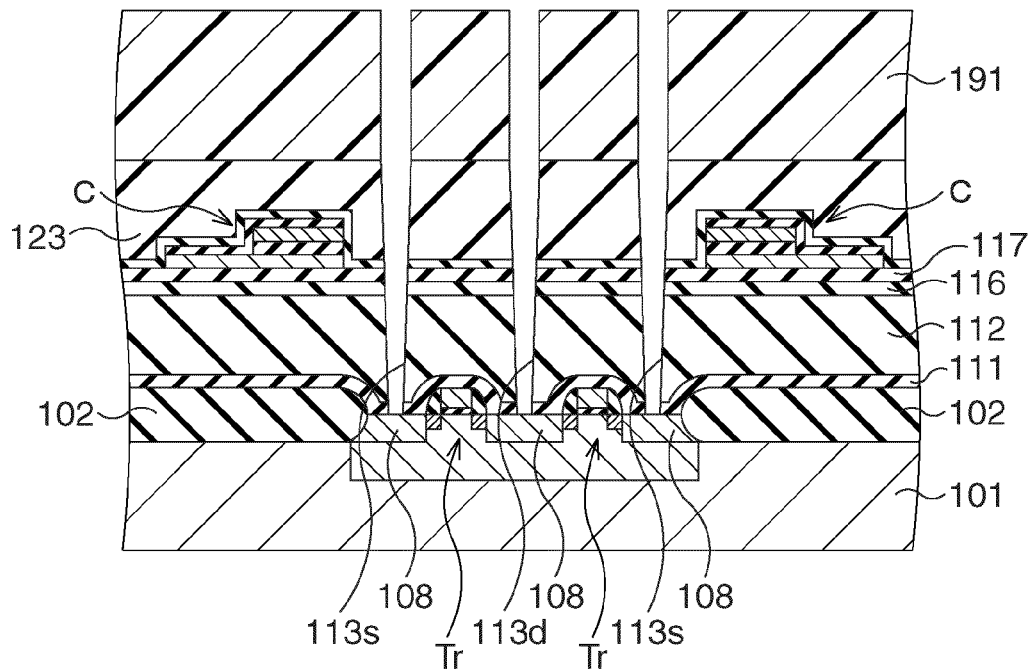
Figure 8H:
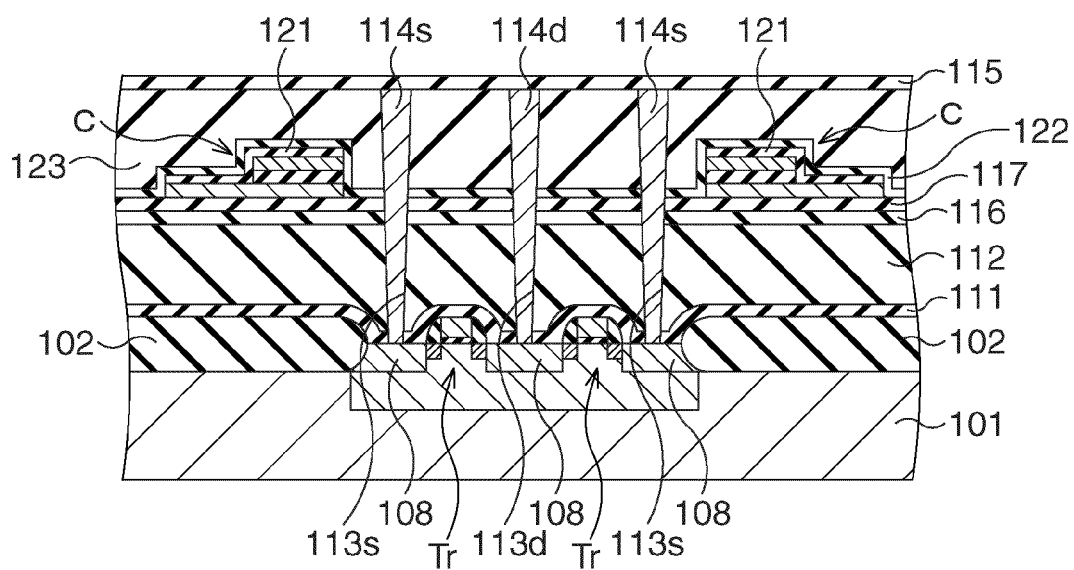
Figure 8I:
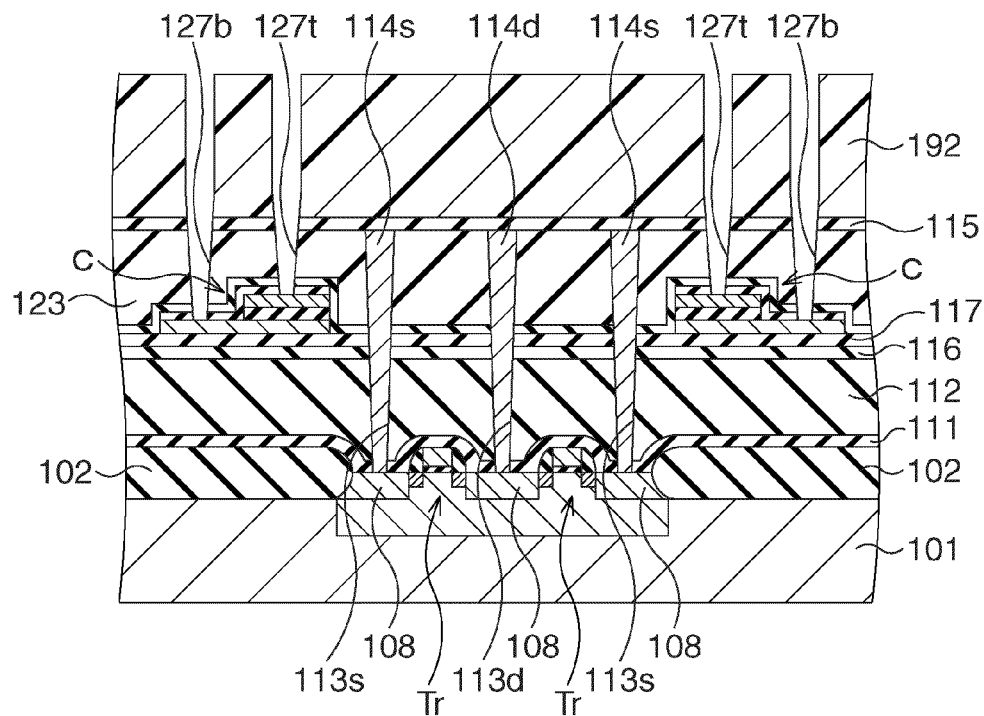
Figure 8J:
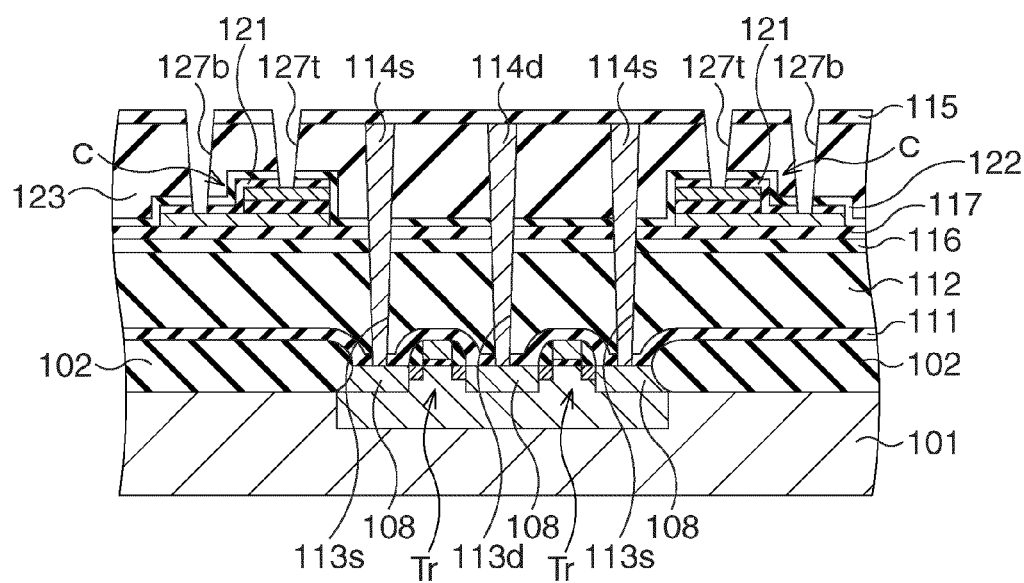
Figure 8K:
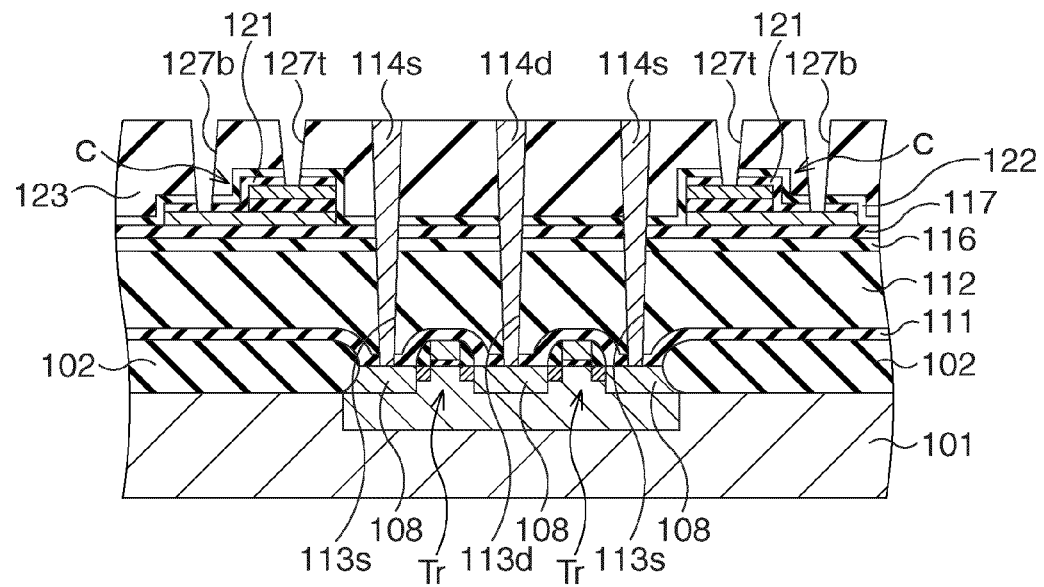
Figure 8L:
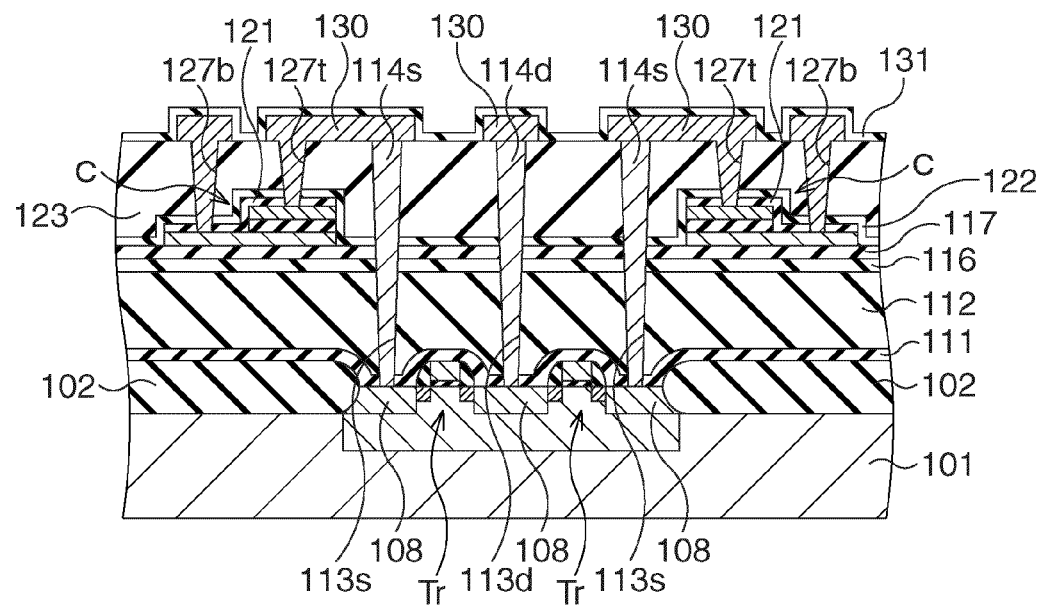
Figure 9A:
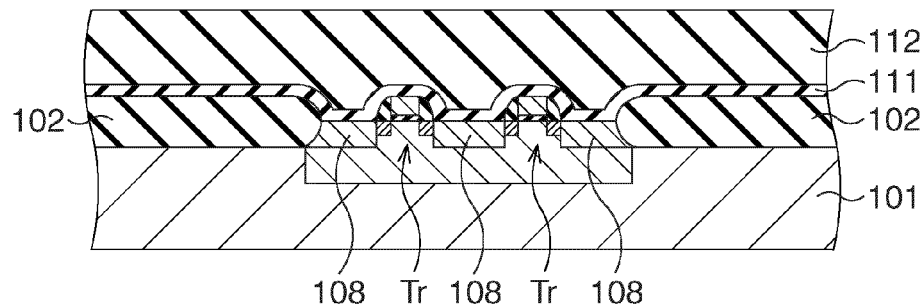
FIG. 9A to FIG. 9V are cross-sectional views showing a conventional manufacturing method of a stack-type ferroelectric memory in order of steps.
Figure 9B:
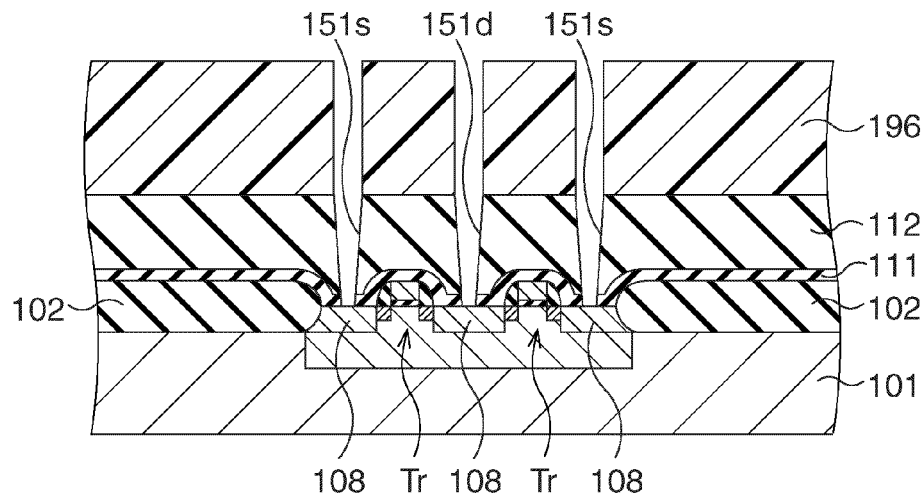
Figure 9C:
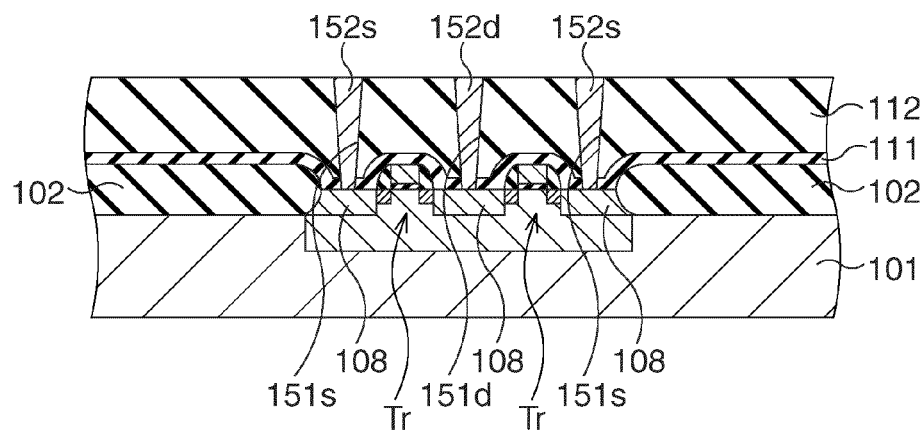
Figure 9D:
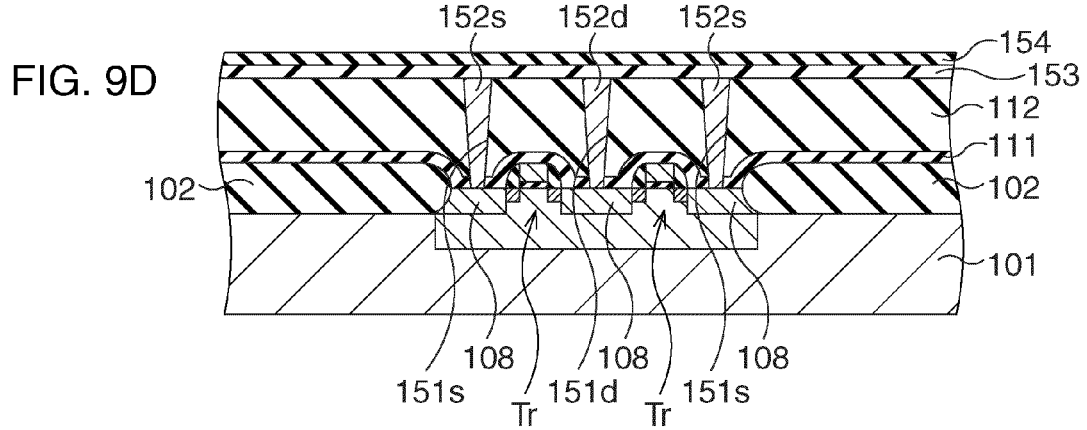
Figure 9E:
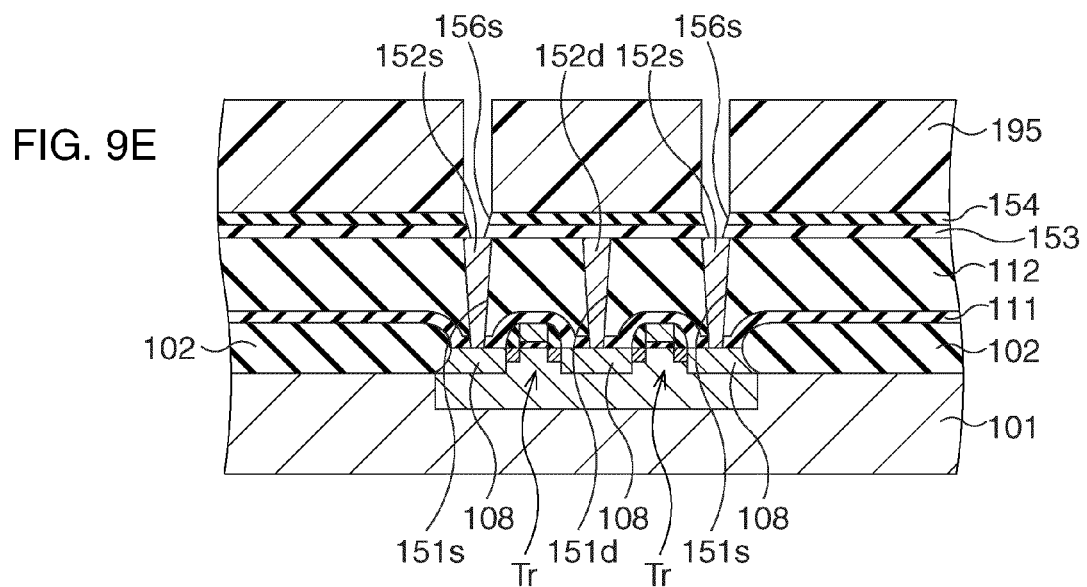
Figure 9F:
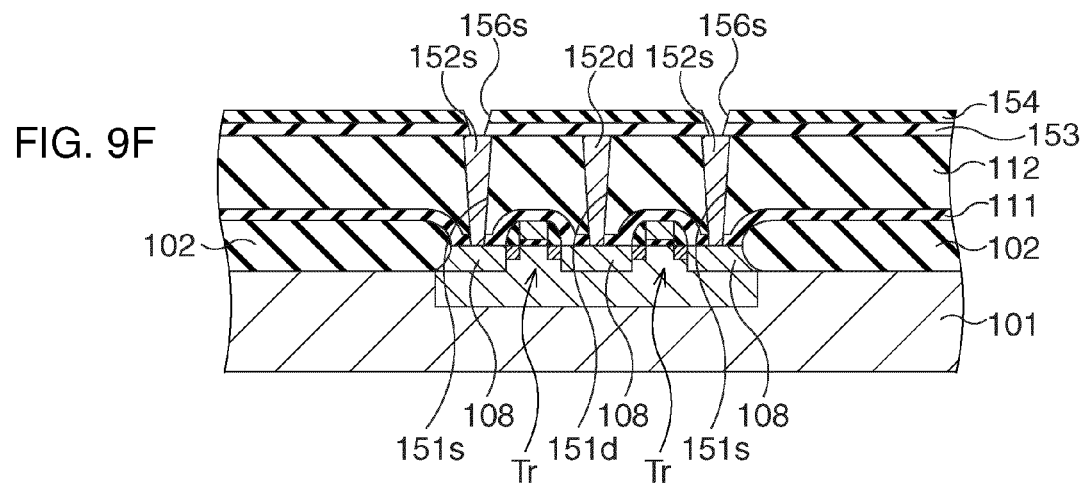
Figure 9G:
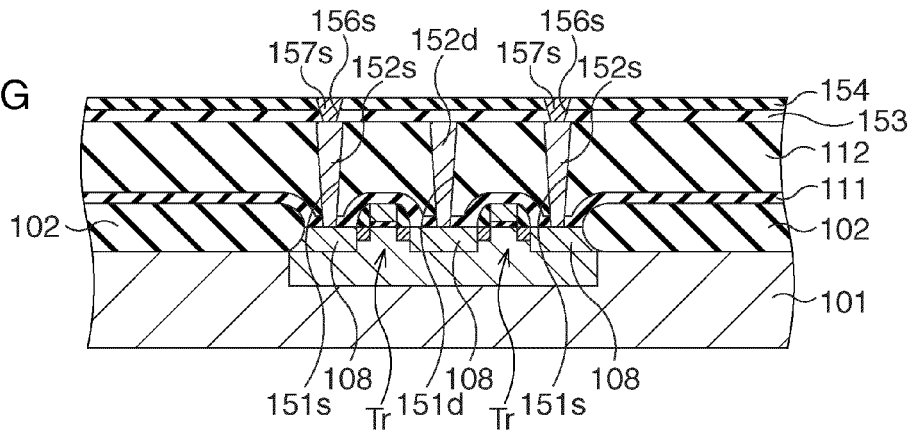
Figure 9H:
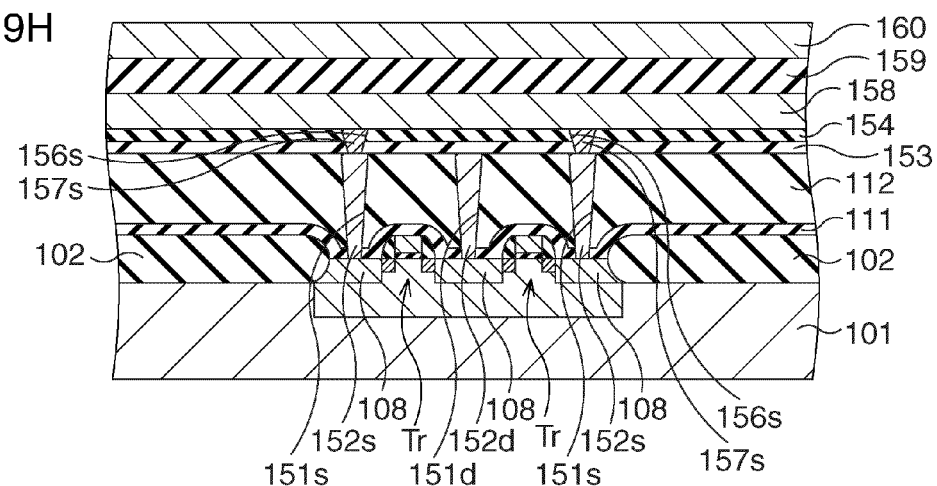
Figure 9I:
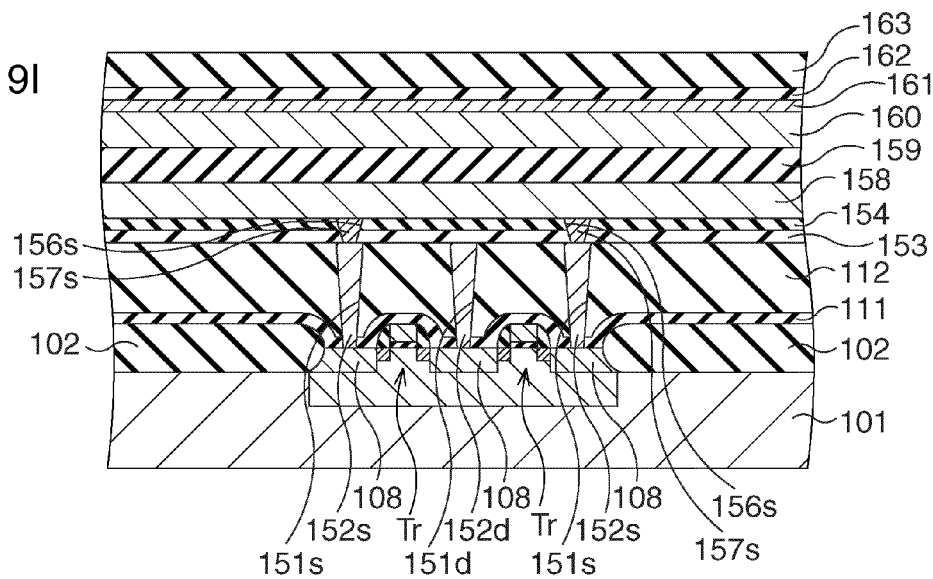
Figure 9J:
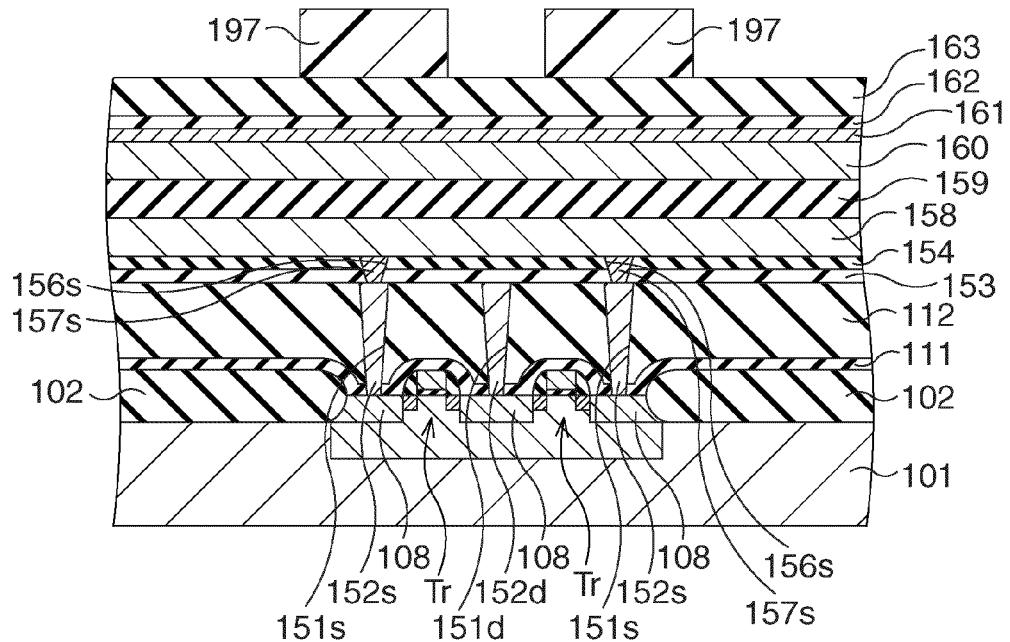
Figure 9K:
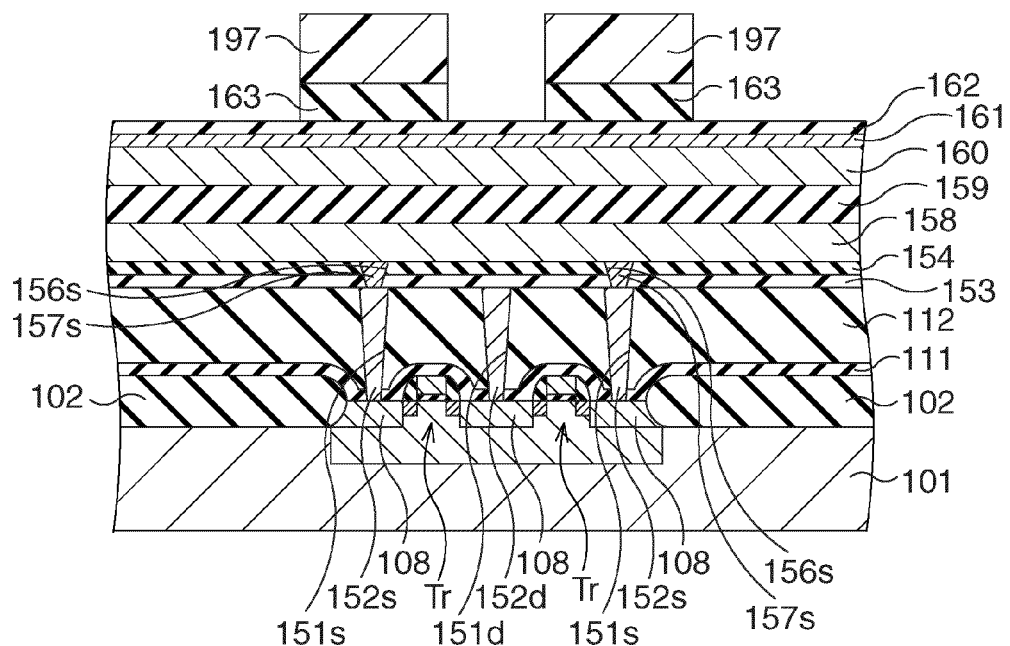
Figure 9L:
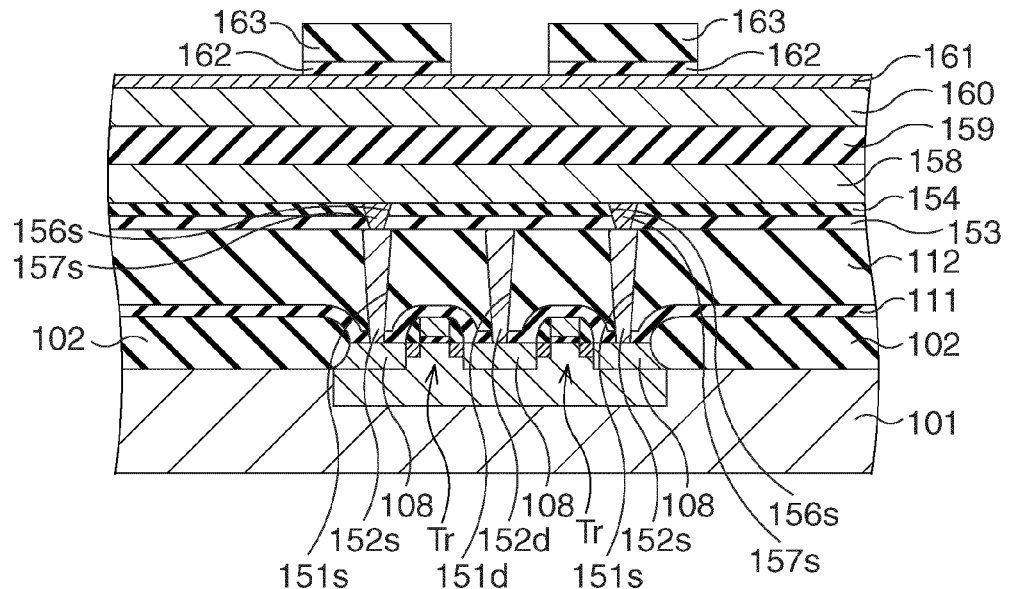
Figure 9M:
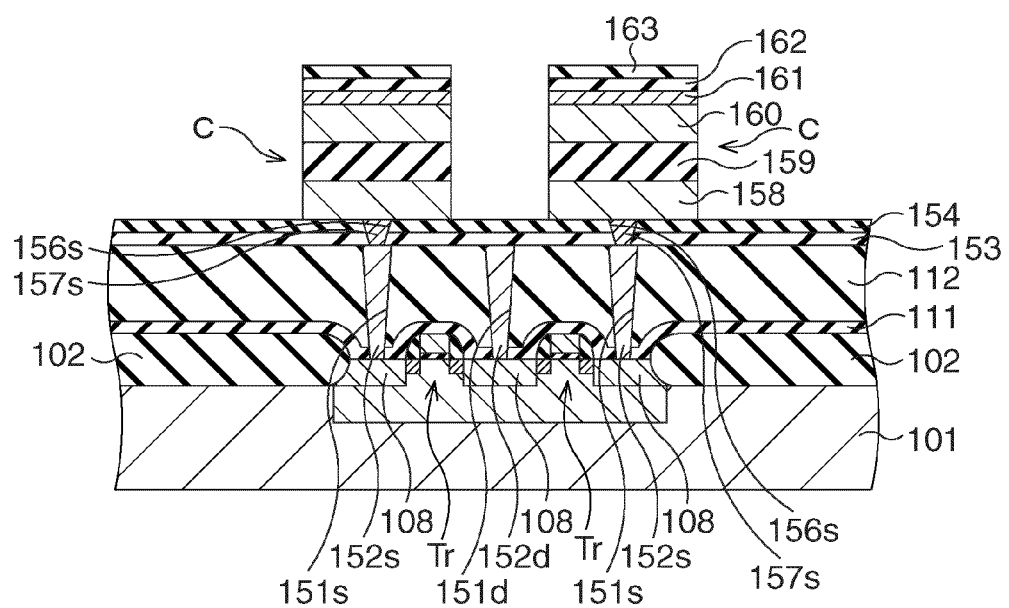
Figure 9N:
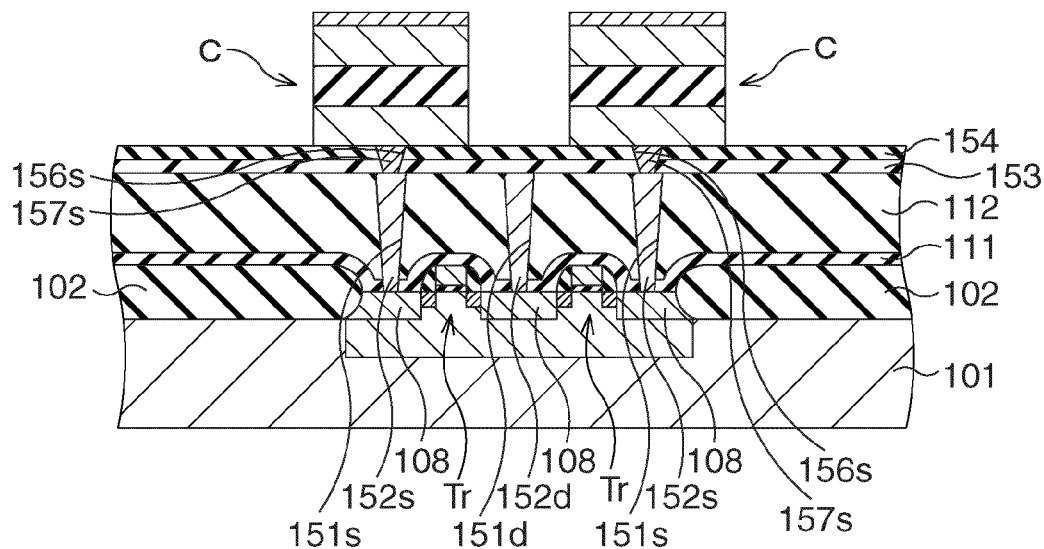
Figure 9O:
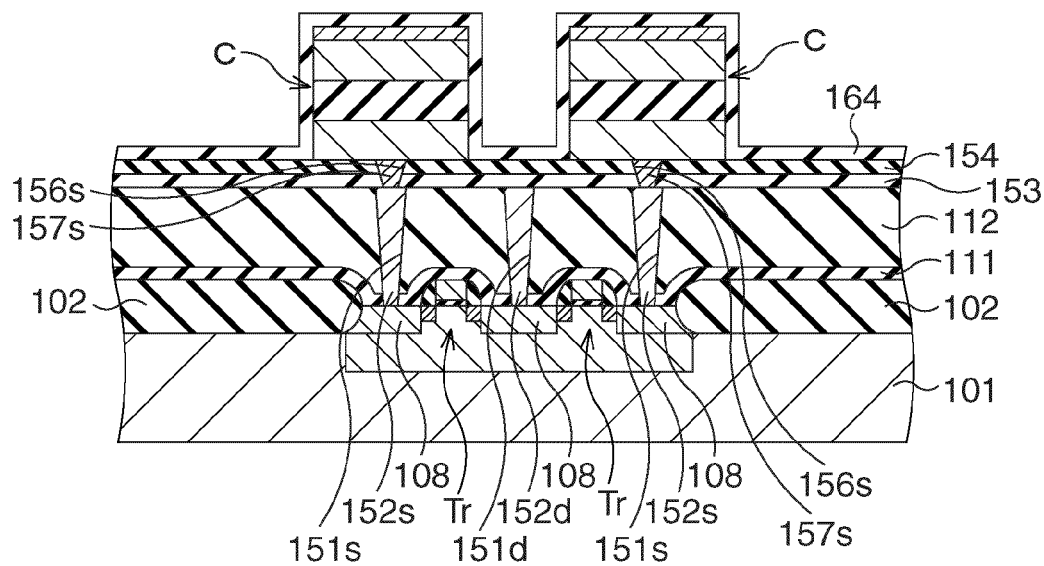
Figure 9P:
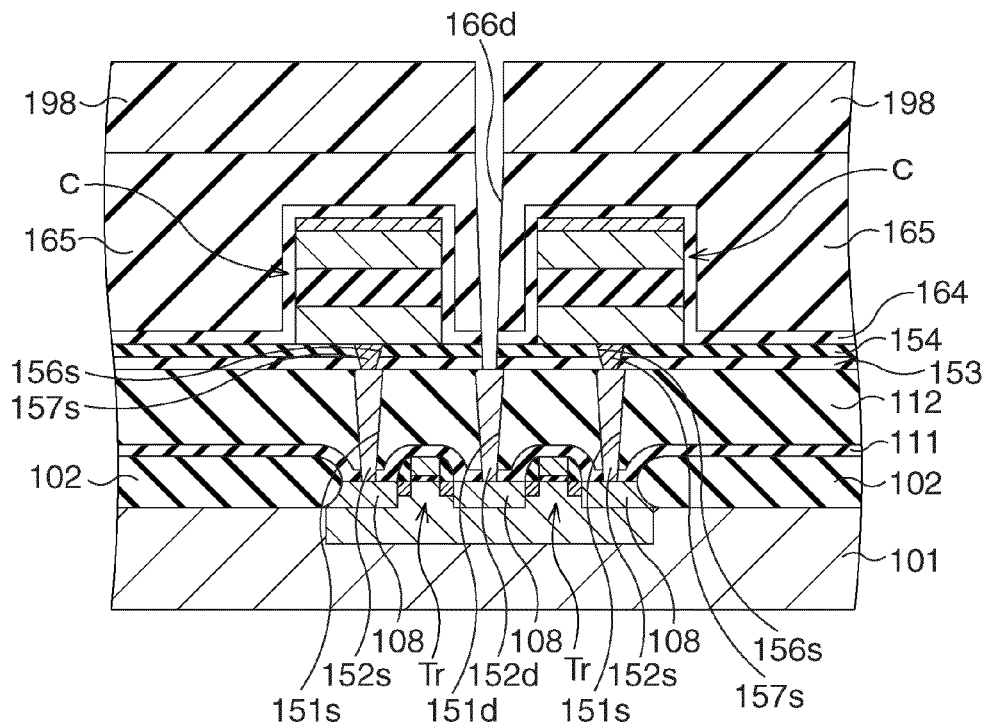
Figure 9Q:
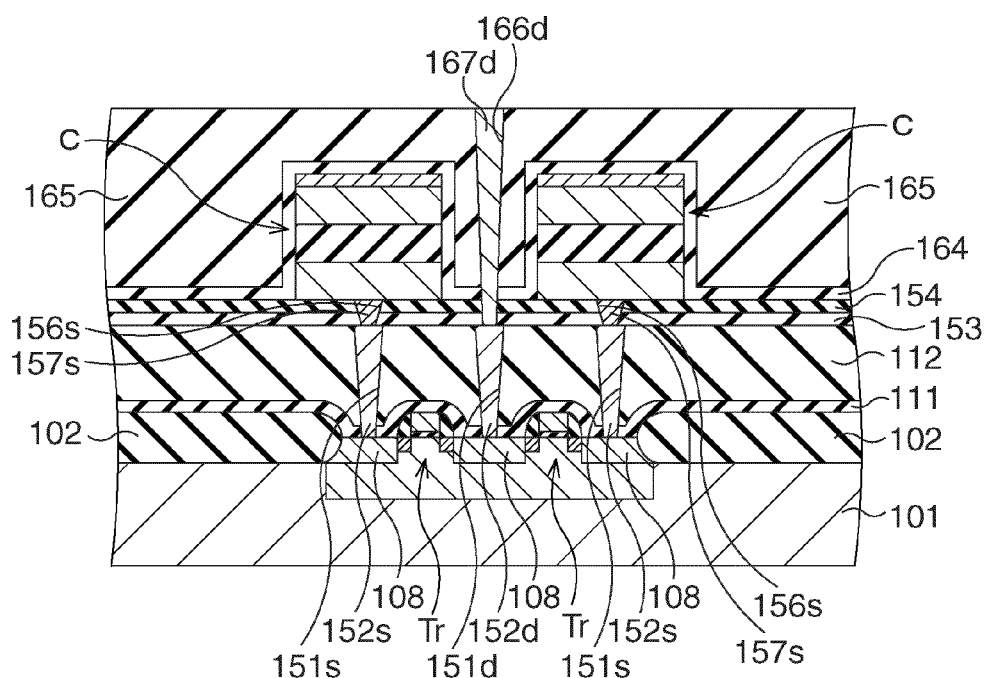
Figure 9R:
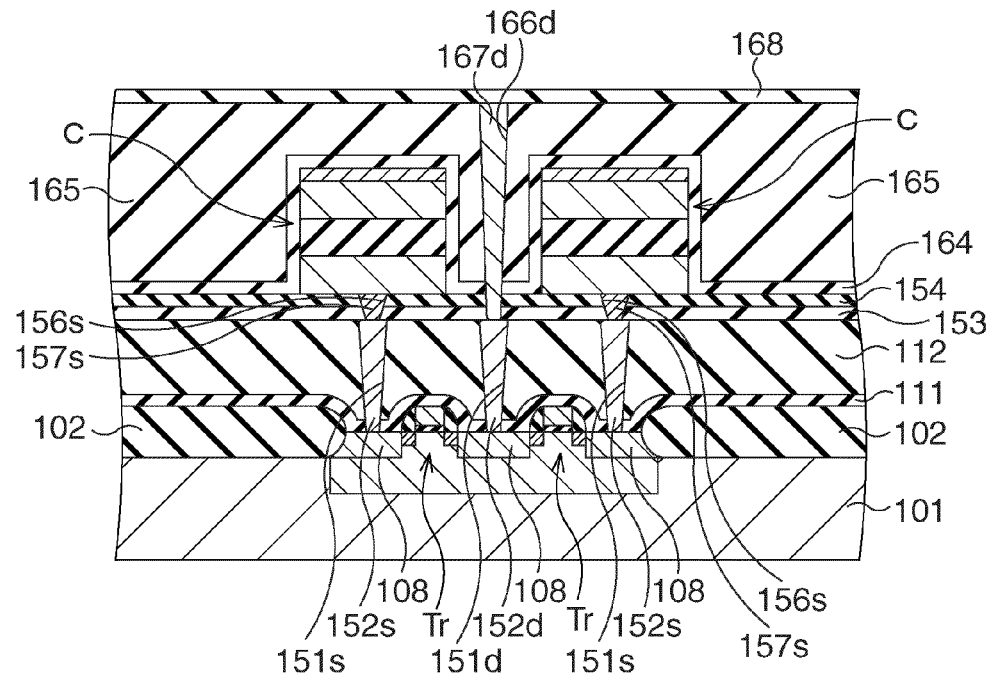
Figure 9S:
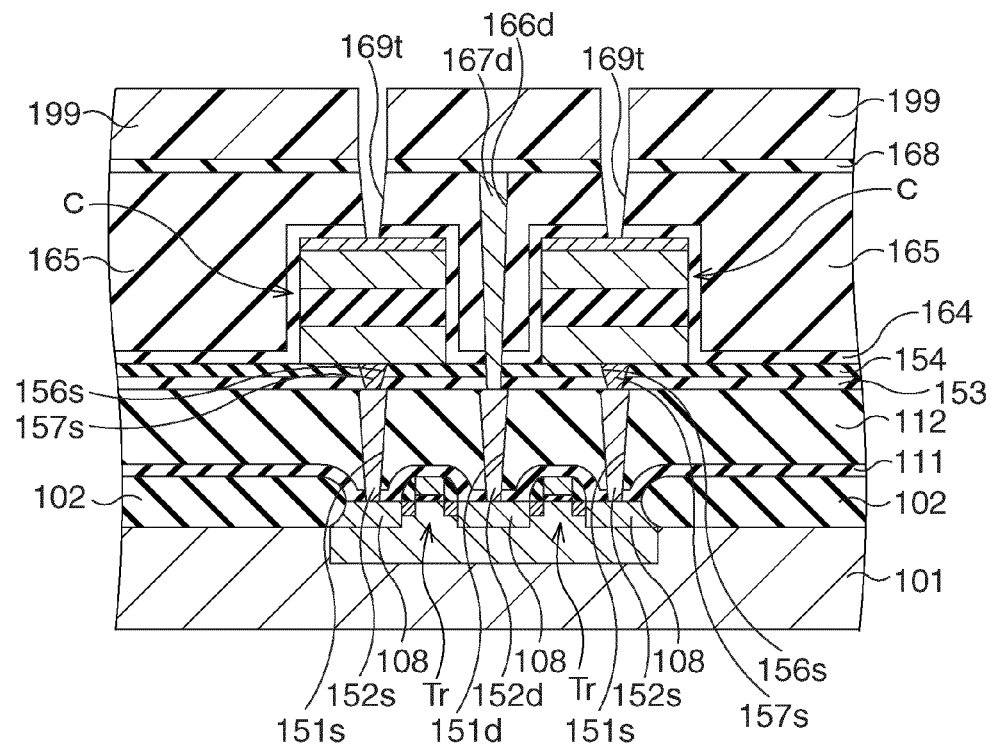
Figure 9T:
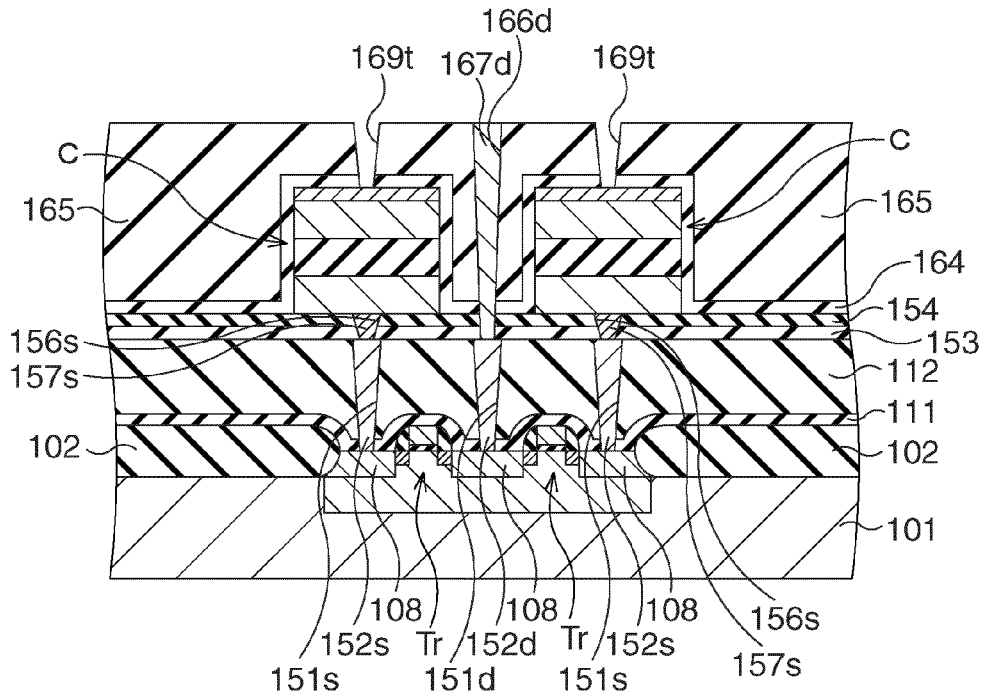
Figure 9U:
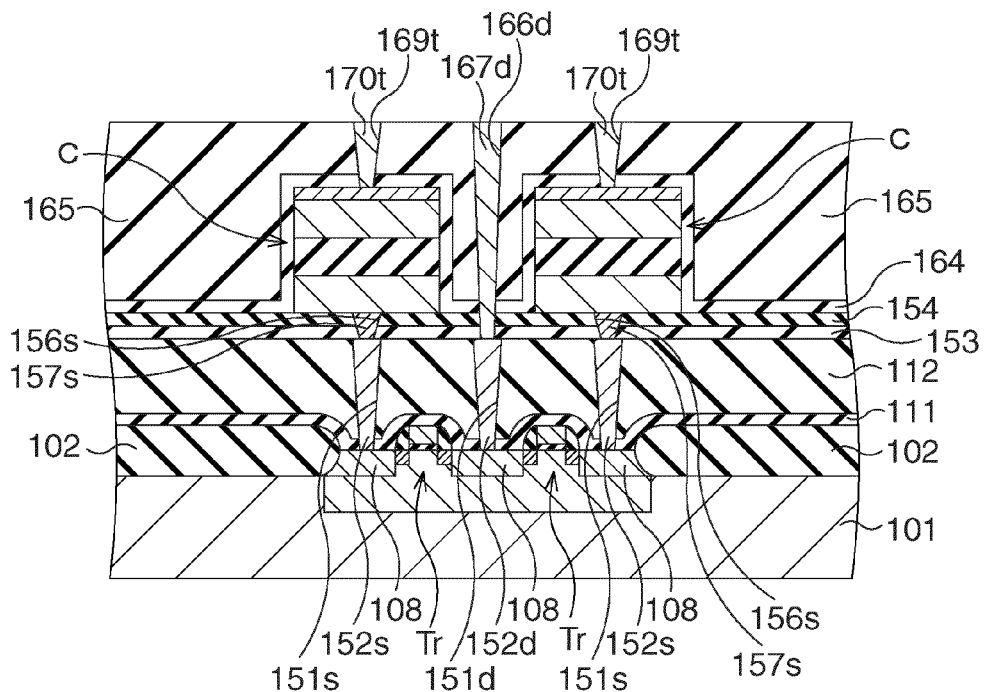
Figure 9V:
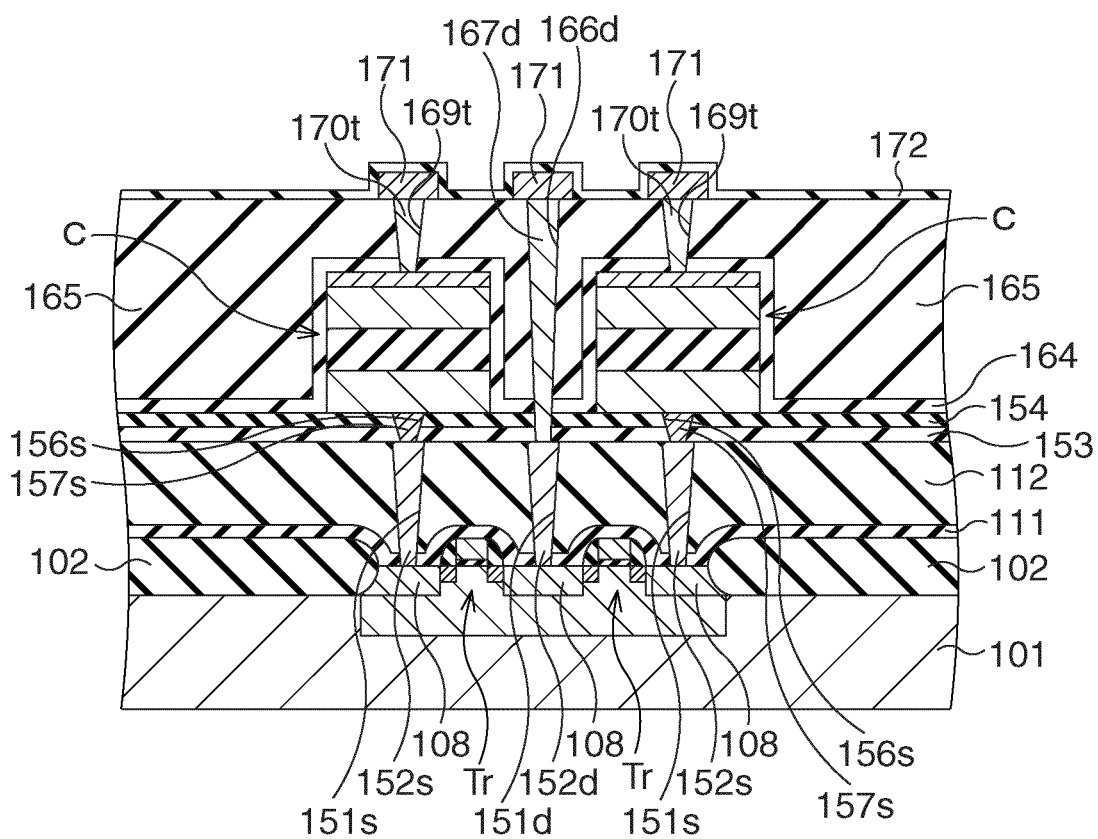
Figure 10:
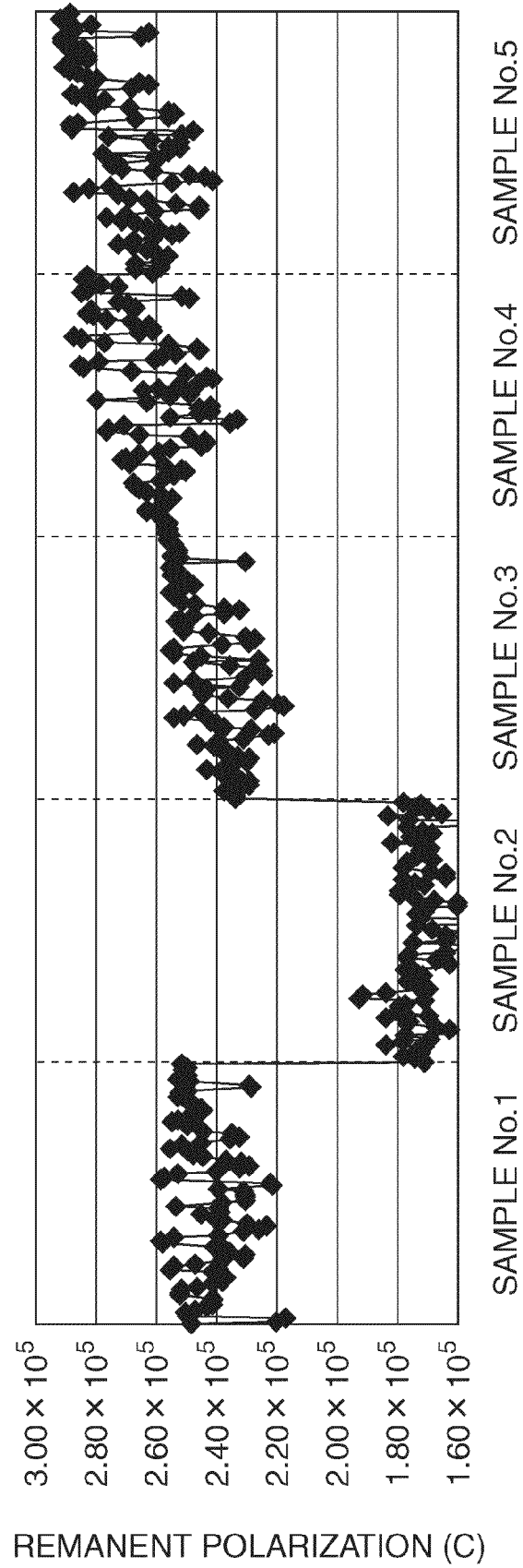

Further, in place of the NSG film 71, another oxide film whose thickness is approximately 20 nm to 100 nm may be formed by a CVD method or the like. Further, a film containing nitrogen such as a silicon oxynitride film or a silicon nitride film whose thickness is 20 nm to 100 nm may be formed by a plasma CVD method or the like as the barrier film preventing moisture from being permeated. Further, a metal oxide film whose thickness is approximately 20 nm to 50 nm may be formed by a PVD method or the like as the barrier film preventing moisture and hydrogen from being permeated. As the metal oxide film, an aluminum oxide film, a titanium oxide film, a zirconium oxide film, a magnesium oxide film, a magnesium titanium oxide film, or the like is applied. Further, as illustrated in FIG. 7, the NSG film 71 may be formed after a metal oxide film 81 is formed. Note that if these films are too thick, there is a case that subsequent processes will be difficult to be performed. If these films are too thin, there is a case that they do not sufficiently function as the etching stopper film, or there is a case that the effect of preventing moisture and hydrogen from being permeated becomes insufficient. Further, it is preferable not to form a coating-type film. This is because a lot of water is used in the case of forming the coating-type film.

Note that in the first and second embodiments, the contact plugs 14s and 14d may be divided into two parts with the boundary with, for example, the surface of the NSG film 12. Further, in the third and fourth embodiments, the contact plugs 52d and 67d may be formed as a single contact plug.

Here, an experiment that the present inventor conducted will be explained. In this experiment, five samples (sample No. 1 to sample No. 5) were made. The sample No. 1 was a ferroelectric memory manufactured by a conventional method illustrated in FIG. 8A to FIG. 8L. The sample No. 2 was a ferroelectric memory manufactured with the size of the contact hole 127t being made to be smaller by 50% with respect to the sample No. 1. The sample No. 3 was a ferroelectric memory manufactured with the time for the recovery annealing performed after the contact holes 127t were formed being made to be longer by 10% with respect to the sample No. 1. The samples No. 4 and No. 5 were ferroelectric memories manufactured by the method according to the first embodiment illustrated in FIG. 1A to FIG. 10. Note that in the sample No. 1, the average diameter of the contact hole 127t was set to be 600 nm, and in the samples No. 4 and No. 5, the average diameter of the contact hole 27t was set to be 800 nm.

Figure 10:
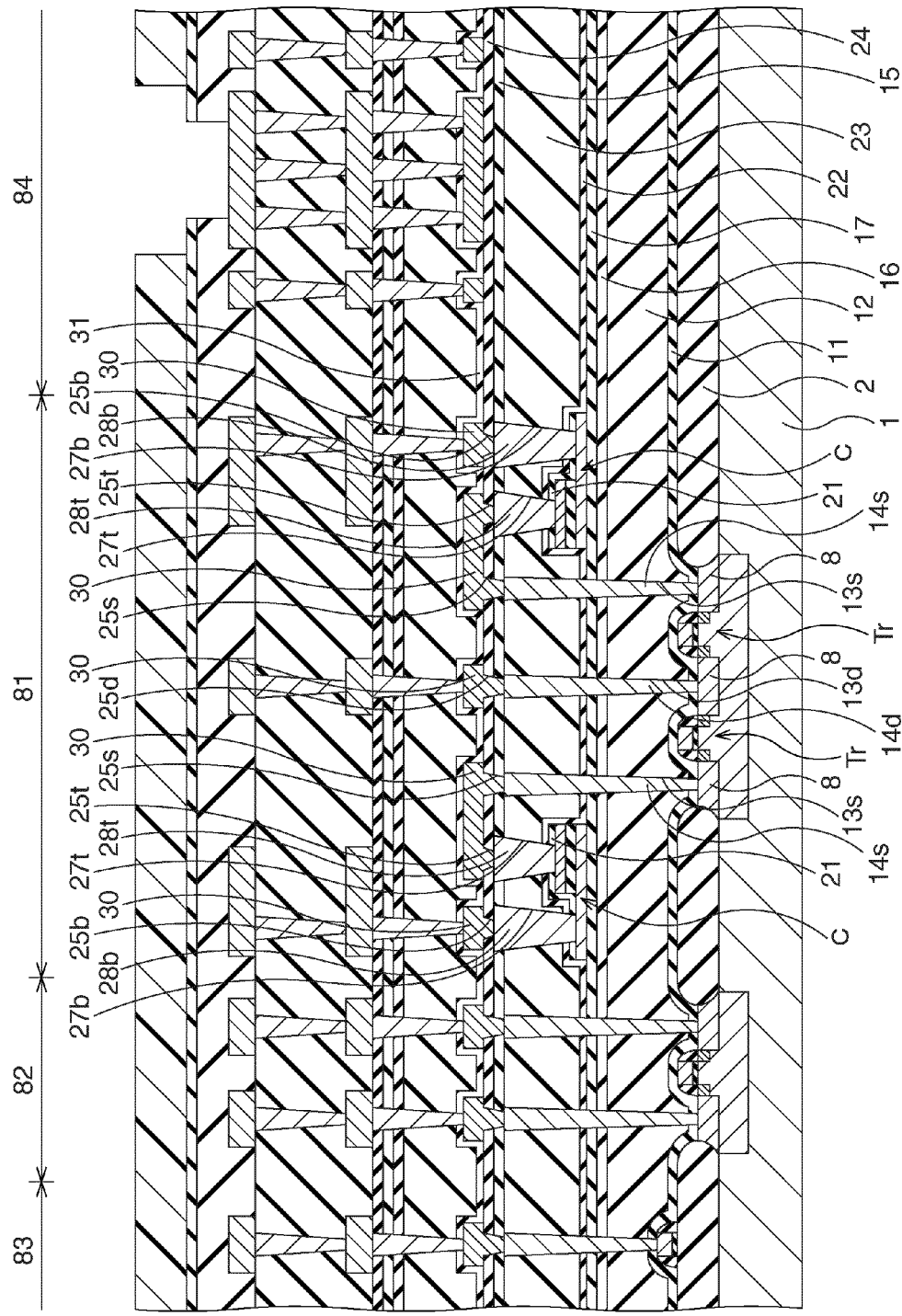
FIG. 10 is a graph showing a remanent polarization.
Figure 11:
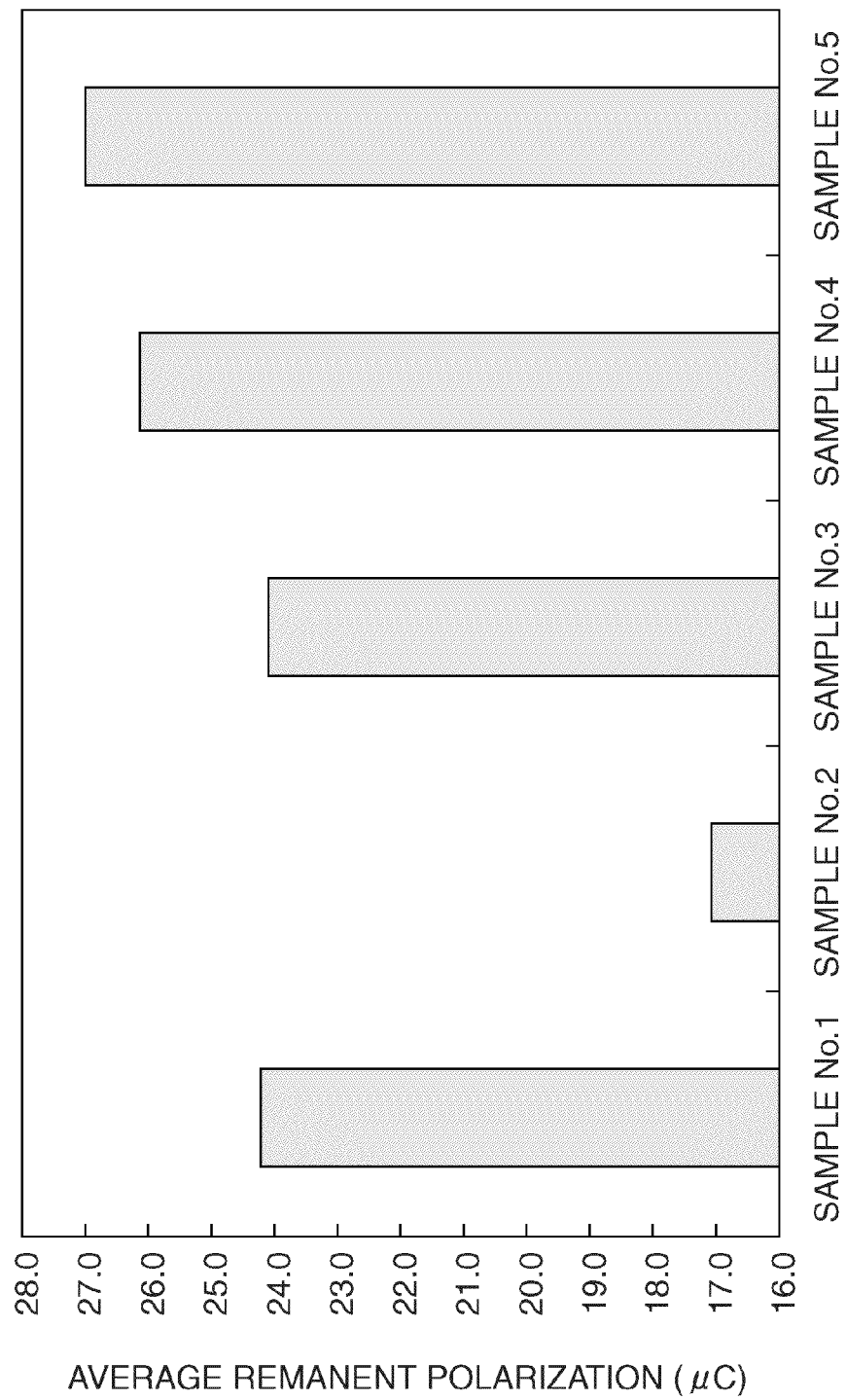
FIG. 11 is a graph showing an average remanent polarization.
Figure 12:
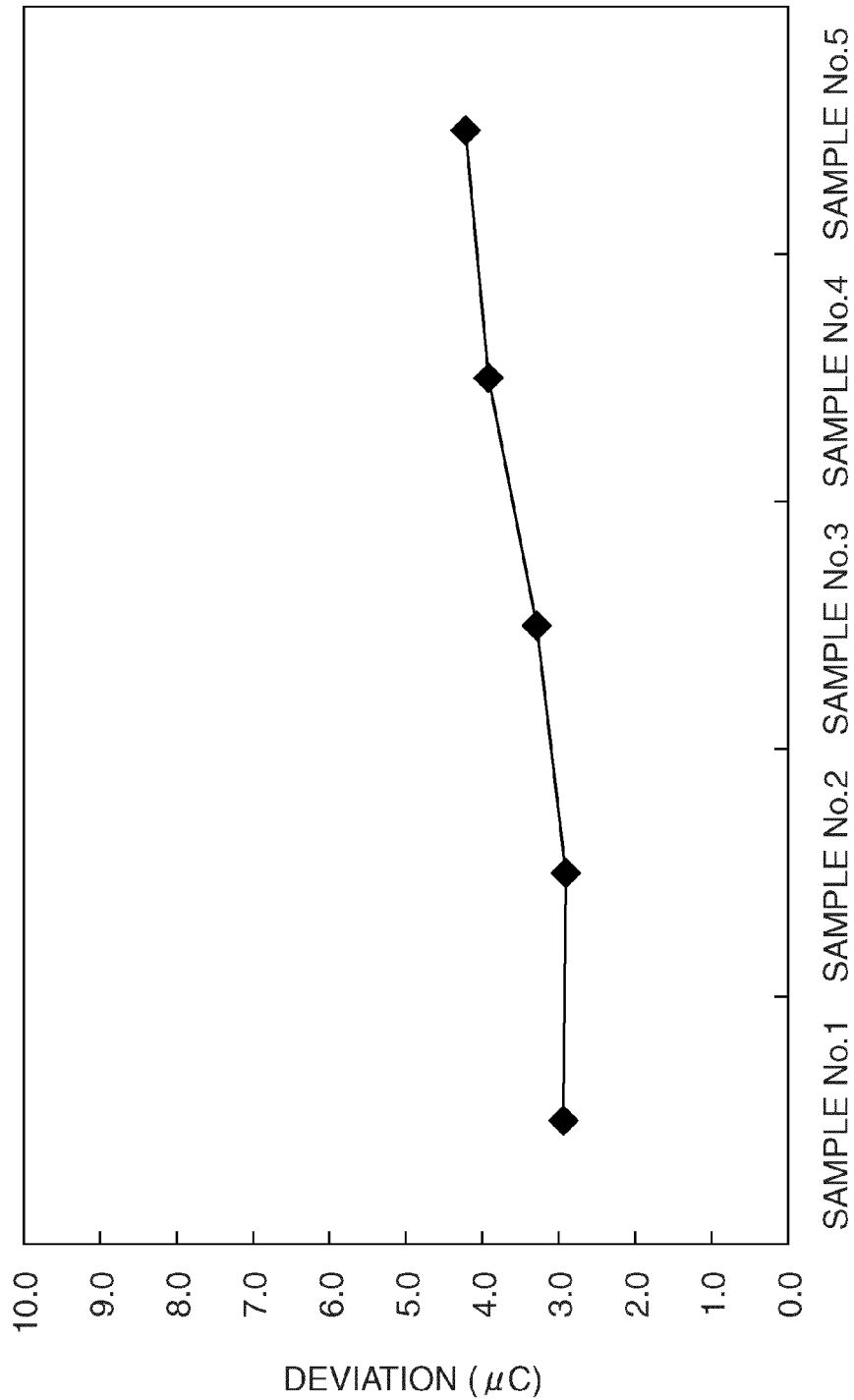
FIG. 12 is a graph showing deviation of a remanent polarization (3σ)
Figure 13:
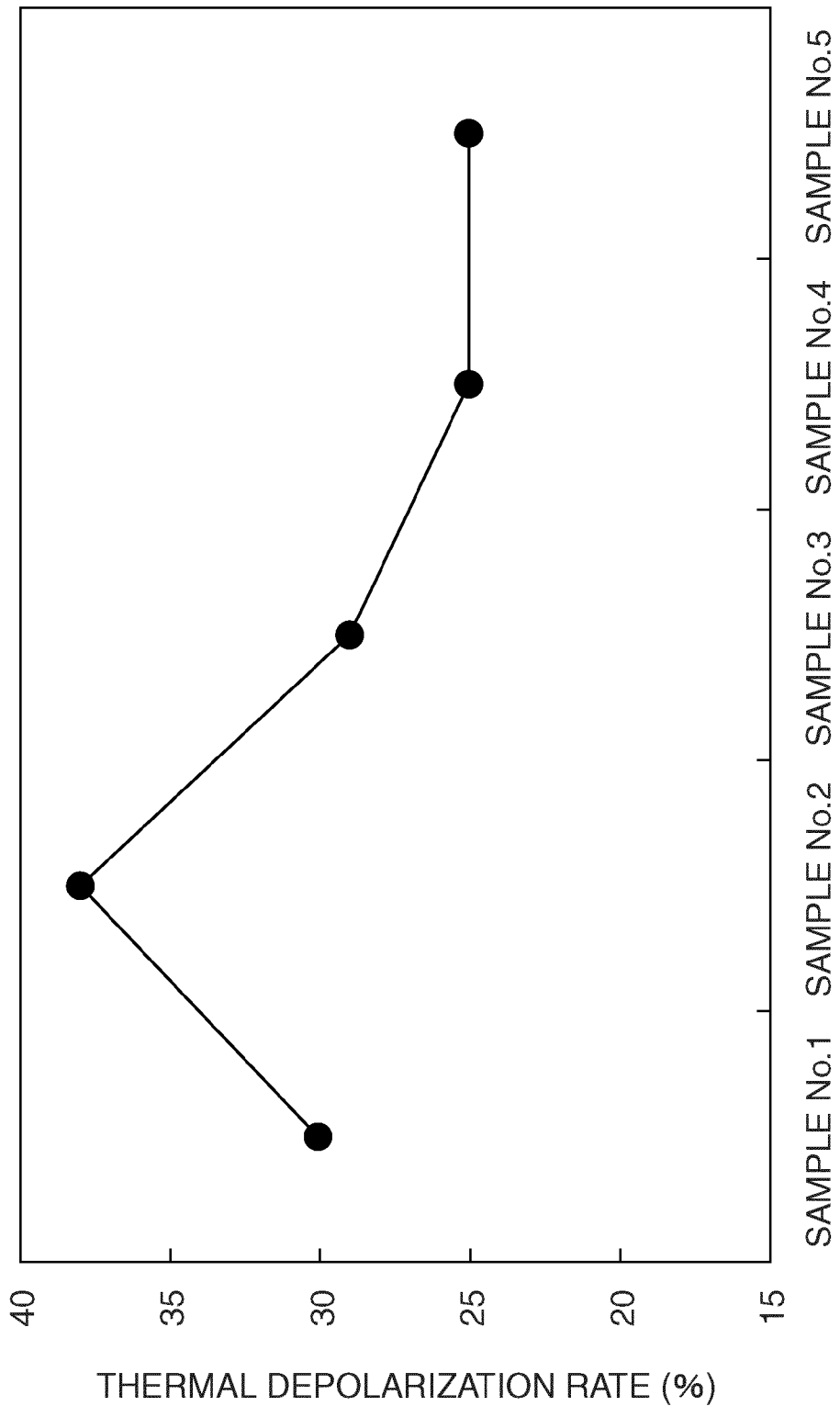
FIG. 13 is a graph showing a thermal depolarization rate of a remanent polarization.

Then, as for these samples, a remanent polarization (Qsw) was measured, and a thermal depolarization rate thereof was also obtained. Note that the measurement of the remanent polarization was performed at 90 points on a single wafer. Further, as the thermal depolarization rate, the ratio (%) of the difference between the amount of remanent polarization at 24° C. and the amount of remanent polarization at 90° C. based on the amount of remanent polarization at 24° C. was obtained. That is, as the thermal depolarization rate, [((Qsw at 24° C.)−(Qsw at 90° C.))/(Qsw at 24° C.)×100] was obtained. FIG. 10 is a graph showing a remanent polarization, FIG. 11 is a graph showing an average remanent polarization, and FIG. 12 is a graph showing deviation of a remanent polarization (3σ). Further, FIG. 13 is a graph showing a thermal depolarization rate of a remanent polarization.

As illustrated in FIG. 10 to FIG. 12, in the samples No. 4 and No. 5, the remanent polarization higher than those of the samples No. 1 to No. 3 could be obtained. This means that, according to the first embodiment, the remanent polarization can be increased more than that of the ferroelectric memory manufactured by the conventional method. Further, in the sample No. 2, the remanent polarization was lower than that of the sample No. 1. Further, in the sample No. 3, although the time for the recovery annealing was longer, the remanent polarization was approximately the same as that of the sample No. 1.

A thermal depolarization rate indicates the ratio that the remanent polarization varies as the temperature rises, and it can be said that, as this value is smaller, data can be retained in a stable manner without being affected by a rise in temperature. That is, as the thermal depolarization rate is lower, data retention performance (a retention characteristic) is higher, resulting that a high yield and long term reliability can be obtained. Then, as a result of this experiment, as illustrated in FIG. 13, in the samples No. 4 and No. 5, the thermal depolarization rates lower than those of the samples No. 1 to No. 3 could be obtained. This means that, according to the first embodiment, the data retention performance can be improved further than that of the ferroelectric memory manufactured by the conventional method.

Industrial Applicability

According to the present invention, in performing recovery annealing, a large amount of oxygen can be supplied to a ferroelectric capacitor via a first opening. Further, a second opening smaller than the first opening is intervened between a first conductive plug formed in the first opening and a wiring, and therefore, a positional displacement margin of the wiring need not be narrowed.

What is claimed is:

1. A manufacturing method of a semiconductor device comprising:
    forming a ferroelectric capacitor above a semiconductor substrate;
    forming a first insulating film covering the ferroelectric capacitor;
    forming a contact plug in the first insulating film;
    forming a second insulating film on the contact plug and the first insulating film;
    forming a first opening reaching an electrode of the ferroelectric capacitor in the first insulating film and the second insulating film;
    performing recovery annealing of the ferroelectric capacitor after forming the first opening;
    forming a conductive plug in the first opening after performing the recovery annealing;
    forming a third insulating film covering the second insulating film and the conductive plug;
    forming a second opening smaller than the first opening in the third insulating film, the second opening reaching the conductive plug; and
    forming a wiring connected to the conductive plug electrically via the second opening on the third insulating film.

2. The manufacturing method of a semiconductor device according to claim 1, wherein the first opening reaches at least a top electrode of the ferroelectric capacitor.

3. The manufacturing method of a semiconductor device according to claim 2, wherein an area at an uppermost portion of the first opening is equal to or more than 0.9 times as large as an area of an uppermost surface of the top electrode.

4. The manufacturing method of a semiconductor device according to claim 1, wherein the wiring contacts with the conductive plug.

5. The manufacturing method of a semiconductor device according to claim 1, further comprising,
    between forming the second opening and forming the wiring, forming a second conductive plug in the second opening.

6. The manufacturing method of a semiconductor device according to claim 1, wherein the ferroelectric capacitor has a planar-type structure.

7. The manufacturing method of a semiconductor device according to claim 1, wherein the ferroelectric capacitor has a stack-type structure.

8. The manufacturing method of a semiconductor device according to claim 7, further comprising,
    between forming the ferroelectric capacitor and forming the first insulating film, forming a sidewall insulating film on a lateral side of the ferroelectric capacitor.

9. The manufacturing method of a semiconductor device according to claim 1, wherein forming the wiring comprises:
    forming a material for the wiring over the third insulating film; and
    patterning the material using the third insulating film as an etching stopper film.

10. The manufacturing method of a semiconductor device according to claim 9, wherein the etching stopper film is an oxide film formed by a CVD method.

11. The manufacturing method of a semiconductor device according to claim 9, wherein a thickness of the etching stopper film is set to be 20 nm to 100 nm.

12. The manufacturing method of a semiconductor device according to claim 1, wherein the third insulating film is a barrier film preventing moisture from being permeated.

13. The manufacturing method of a semiconductor device according to claim 12, wherein the barrier film is a film containing nitrogen formed by a plasma CVD method.

14. The manufacturing method of a semiconductor device according to claim 12, wherein a thickness of the barrier film is set to be 20 nm to 100 nm.

15. The manufacturing method of a semiconductor device according to claim 1, wherein the third insulating film is a barrier film preventing moisture and hydrogen from being permeated.

16. The manufacturing method of a semiconductor device according to claim 15, wherein the barrier film is a metal oxide film.

17. The manufacturing method of a semiconductor device according to claim 15, wherein a thickness of the barrier film is set to be 20 nm to 50 nm.

18. The manufacturing method of a semiconductor device according to claim 1, wherein,
    forming the third insulating film comprises:
        forming a barrier film preventing moisture and hydrogen from being permeated; and
        forming a silicon oxide film over the barrier film, and
    forming the wiring comprises:
        forming a material for the wiring over the silicon oxide film; and
        patterning the material using the silicon oxide film as an etching stopper film.

19. The manufacturing method of a semiconductor device according to claim 18, wherein
    the barrier film is a metal oxide film, and
    the silicon oxide film is formed by a CVD method.

20. The manufacturing method of a semiconductor device according to claim 1, further comprising:
    forming a gate electrode on the semiconductor substrate;
    forming an impurity diffusion layer in the semiconductor substrate; and
    forming a forth insulating film on the gate electrode and the impurity diffusion layer before forming the ferroelectric capacitor, wherein
    the contact plug is formed in the first insulating film and forth insulating film, and
    the contact plug is connected to the impurity diffusion layer.

* * * * *